(12) United States Patent
Handte et al.

(10) Patent No.: US 10,855,398 B2
(45) Date of Patent: Dec. 1, 2020

(54) CODING AND MODULATION APPARATUS USING NON-UNIFORM CONSTELLATION

(71) Applicant: Sony Corporation, Tokyo (JP)

(72) Inventors: Thomas Handte, Stuttgart (DE); Daniel Schneider, Stuttgart (DE); Nabil Sven Loghin, Stuttgart (DE); Ben Eitel, Stuttgart (DE)

(73) Assignee: SONY CORPORATION, Tokyo (JP)

(*) Notice: Subject to any disclaimer, the term of this patent is extended or adjusted under 35 U.S.C. 154(b) by 380 days.

(21) Appl. No.: 15/741,424

(22) PCT Filed: Jul. 7, 2016

(86) PCT No.: PCT/EP2016/066190
§ 371 (c)(1),
(2) Date: Jan. 2, 2018

(87) PCT Pub. No.: WO2017/005874
PCT Pub. Date: Jan. 12, 2017

(65) Prior Publication Data
US 2020/0228234 A1 Jul. 16, 2020

(30) Foreign Application Priority Data
Jul. 9, 2015 (EP) ..................................... 15176027

(51) Int. Cl.
*H04L 1/00* (2006.01)
*H04L 27/34* (2006.01)
(Continued)

(52) U.S. Cl.
CPC ....... *H04L 1/0045* (2013.01); *H03M 13/1105* (2013.01); *H03M 13/255* (2013.01);
(Continued)

(58) Field of Classification Search
CPC . H04L 1/0045; H04L 1/0061; H04L 27/2614; H04L 27/3416; H03M 13/1105; H03M 13/255
See application file for complete search history.

(56) References Cited

U.S. PATENT DOCUMENTS 9,276,687 B1 3/2016 Jeong et al.
2011/0150147 A1* 6/2011 Yang ....................... H04L 27/34
375/341

(Continued)

FOREIGN PATENT DOCUMENTS

WO 2015/001121 A1 1/2015
WO 2015/076629 A1 5/2015

OTHER PUBLICATIONS

Perisoara, L.A., et al., "Performances of FEC coded MIMO OFDM systems", 2008 4th European Conference on Circuits and Systems for Communications, IEEE, Conference Location: Bucharest, Romani, Date of Conference: Jul. 10-11, 2008, pp. 295-300. (Year: 2008).*

(Continued)

*Primary Examiner* — Kyle Vallecillo
(74) *Attorney, Agent, or Firm* — Xsensus LLP

(57) ABSTRACT

A coding and modulation apparatus and method are presented, particularly for use in a system according to IEEE 802.11. The apparatus comprises an encoder configured to encode input data into cell words according to a low density parity check code, LDPC, and a modulator configured to modulate said cell words into constellation values of a non-uniform constellation and to assign bit combinations to constellation values of the used non-uniform constellation, wherein said modulator is configured to use, based on the total number N of constellation points of the constellation and the code rate R, a particular non-uniform constellation, which has been optimized using the peak-to-average power ratio (PAPR).

18 Claims, 6 Drawing Sheets

(51) Int. Cl.
*H04L 27/26* (2006.01)
*H03M 13/25* (2006.01)
*H03M 13/11* (2006.01)

(52) U.S. Cl.
CPC ........ *H04L 1/0061* (2013.01); *H04L 27/2614* (2013.01); *H04L 27/3416* (2013.01)

(56) References Cited

U.S. PATENT DOCUMENTS

2016/0119176 A1 4/2016 Jeong et al.
2016/0149682 A1* 5/2016 Shin .................. H04L 12/18
 375/260
2016/0156498 A1 6/2016 Loghin et al.

OTHER PUBLICATIONS

Eitan, et al., "PHY Rate for NG60", Qualcomm, IEEE 802.11-14/1378r3, Nov. 2, 2014, Total 16 pages.
Eitan, et al., "SC 64QAM for NG60", Qualcomm, IEEE 802.11-15/0094r0, Jan. 12, 2015, Total 16 pages.
Sun, et al., "NG 60 Use Cases" Huawei, IEEE 802.11-15/0328r4, Mar. 2015, Total 24 pages.
Eitan, et al., "SC 64APSK for 802.11ay", Qualcomm, IEEE 802.11-15/0339r0, Mar. 8, 2015, Total 12 pages.
Schneider, et al. "Non-Uniform Constellations for 64-QAM", Sony Deutschland GmbH, IEEE 802.11-15/0601r0, XP068094467, May 11, 2015, Total 17 pages.
IEEE Standards Association, "IEEE Standard for Information technology—Telecommunications and information exchange between systems Local and metropolitan area networks—Specific requirements", Part 11: Wireless LAN Medium Access Control (MAC) and Physical Layer (PHY) Specifications; Amendment 3: Enhancements for Very High Throughput in the 60 GHz Band, IEEE Std. 802.11ad™-2012, Dec. 28, 2012, Total 628pages.
International Search Report and Written Opinion dated Nov. 29, 2016 in PCT/EP2016/066190 filed Jul. 7, 2016.

* cited by examiner

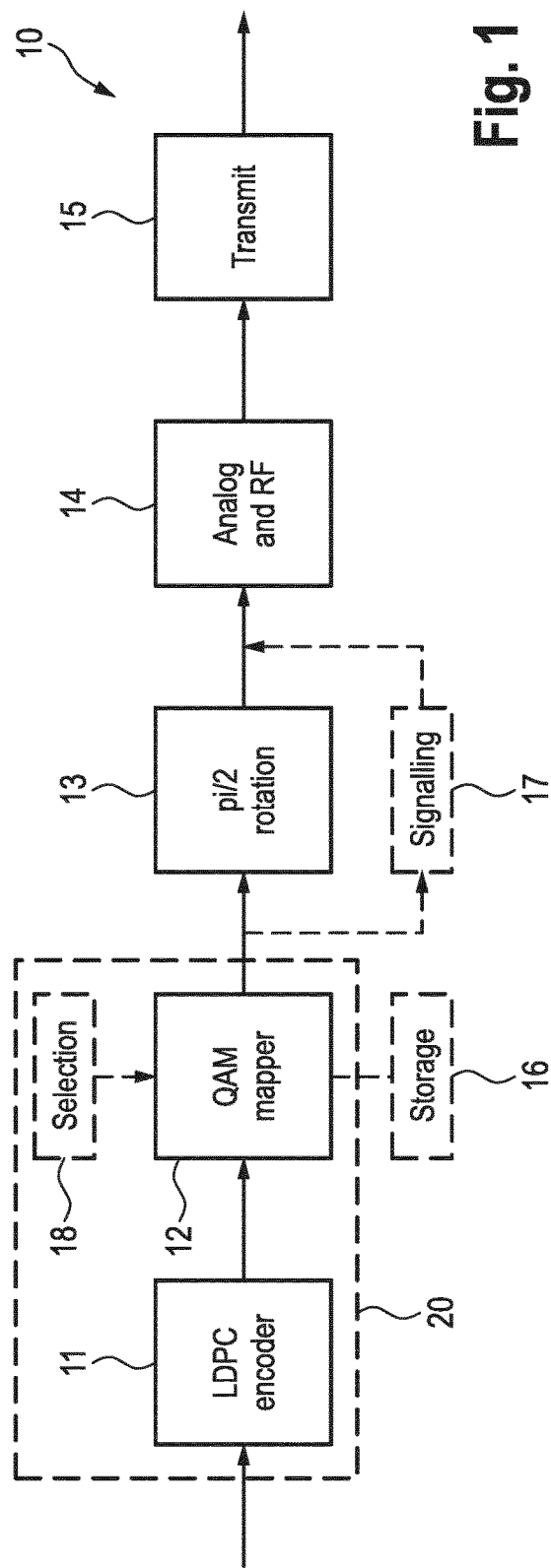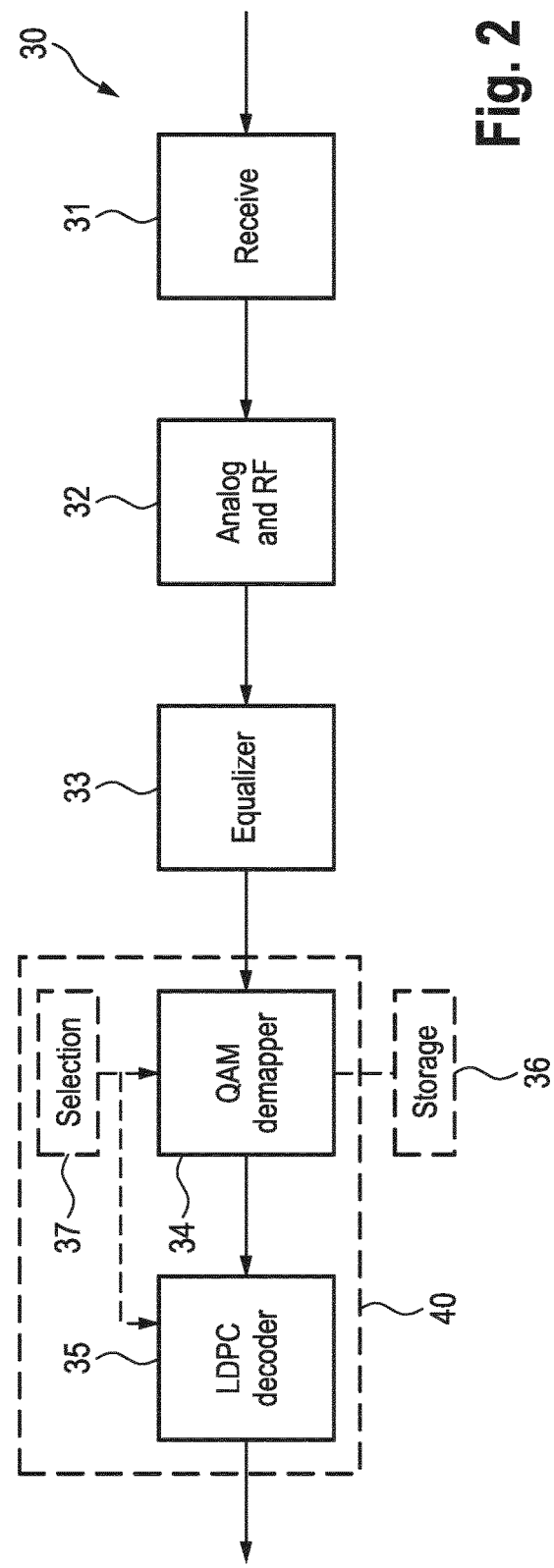

CODING AND MODULATION APPARATUS USING NON-UNIFORM CONSTELLATION

CROSS REFERENCE TO RELATED APPLICATIONS

The present application claims priority to European Application 15176027.9 filed on 9 Jul. 2015, the contents of which being incorporated herein by reference in its entirety.

BACKGROUND

Field of the Disclosure

The present disclosure relates to a coding and modulation apparatus and method as well as a demodulation and decoding apparatus and method. Further, the present disclosure relates to a transmission apparatus and method as well as a receiving apparatus and method. Still further, the present disclosure relates to a computer program and a non-transitory computer-readable recording medium.

Description of Related Art

Modern communications systems typically employ, among other elements, a coding and modulation apparatus (as part of a transmission apparatus) and a decoding and demodulation apparatus (as part of a receiving apparatus). The coding and modulation apparatus is often part of a so called BICM (Bit Interleaved Coded Modulation) apparatus, which generally comprises (at the transmitter side) a serial concatenation of a FEC (Forward Error Correction) encoder, a bit interleaver, and a modulator, which uses spectral efficient modulation such as BPSK (Binary Phase Shift Keying), QPSK (Quaternary Phase Shift Keying), or QAM (Quadrature Amplitude Modulation).

BICM allows for good performance due to the use of the interleaver and/or the FEC encoder. It has a reasonable decoding complexity as opposed to multilevel coding (MLC) coding schemes and is thus used frequently in communications systems, such as in all DVB systems (e.g. DVB-S2x), powerline communications (e.g., Homeplug AV), DAB, LTE, WiFi (IEEE 802.11), ATSC 3.0, etc. The first generation of 60 GHz WLAN is specified in IEEE 802.11ad. Systems in accordance with IEEE 802.11ad use uniform constellations. Several Modulation and Coding Schemes (MCSs) are defined. Currently, there is a working group which investigates possible technologies for the next generation of the specification which will likely be called 802.11ay.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present disclosure.

SUMMARY

It is an object to provide a coding and modulation apparatus and method providing an increased or even maximized coding and modulation capacity and a reduced bit error rate and reception with a reduced required SNR (signal-to-noise ratio) and, preferably, with reduced PAPR (peak to average power ratio), preferably providing a maximized overall gain, i.e. the sum of shaping gain and peak power gain. It is a further object to provide a demodulation and decoding apparatus and method as well as a corresponding computer program for implementing said methods and a non-transitory computer-readable recording medium for implementing said methods.

According to an aspect there is provided a coding and modulation apparatus comprising
an encoder configured to encode input data into cell words according to a low density parity check code, LDPC, and
a modulator configured to modulate said cell words into constellation values of a non-uniform constellation and to assign bit combinations to constellation values of the used non-uniform constellation,
wherein said modulator is configured to use, based on the total number N of constellation points of the constellation and the code rate, one of the non-uniform constellations as defined in claim 1.

According to a further aspect there is provided a transmission apparatus comprising
a coding and modulation apparatus as claimed in claim 1 configured to encode and modulate input data into constellation values,
a converter configured to convert said constellation values into one or more transmission streams to be transmitted, and
a transmitter configured to transmit said one or more transmission streams.

According to another aspect there is provided a demodulation and decoding apparatus comprising
a demodulator configured to demodulate constellation values of a non-uniform constellation into cell words and to assign bit combinations to constellation values of the used non-uniform constellation, and
a decoder configured to decode cell words into output data according to a low density parity check code, LDPC,
wherein said demodulator is configured to use, based on the total number N of constellation points of the constellation and the code rate, one of the non-uniform constellations as defined in claim 13.

According to a further aspect there is provided a receiving apparatus comprising
a receiver configured to receive one or more transmission streams,
a deconverter configured to deconvert one or more transmission streams into said constellation values, and
a receiver signalling unit configured to transmit receiver signalling information to a transmission apparatus with which said receiving apparatus seeks to communicate, said receiver signalling information including one or more of a) the total number N of constellation points and the code rate R of a constellation to be used, b) an indication of the constellation to be used, c) constellation points of a constellation to be used, d) channel conditions of a communications channel between the receiving apparatus and a transmission apparatus with which said receiving apparatus seeks to communicate and e) PHY impairments at the receiving apparatus.

According to still further aspects corresponding methods, a computer program comprising program means for causing a computer to carry out the steps of the methods disclosed herein, when said computer program is carried out on a computer, as well as a non-transitory computer-readable recording medium that stores therein a computer program product, which, when executed by a processor, causes the methods disclosed herein to be performed are provided.

Preferred embodiments are defined in the dependent claims. It shall be understood that the claimed methods, the claimed computer program and the claimed computer-readable recording medium have similar and/or identical preferred embodiments as the claimed apparatus and as defined in the dependent claims.

One of the aspects of the disclosure is that the constellation points of the used constellations, called non-uniform constellations, are not located on a regular grid with equidistant symbols, but rather on optimized locations, e.g. dependent on the channel conditions between the transmission apparatus and a receiving apparatus with which the transmission apparatus wants to communicate (e.g. in a Wireless LAN network). Further, the used constellation is selected (preferably in advance, but generally on the fly in other embodiments) dependent on the code rate and the desired total number of constellation points of the used constellation. The code rate and total number of constellation points (also referred to as "modulation order") may depend among other parameters on the channel quality, such as signal-to-noise ratio. A method how to find and optimize these non-uniform constellations (in the following called NUCs) will be explained below. Further, for the proposed non-uniform constellations a bit labelling (i.e. an assignment of bit combinations to constellation values of the used non-uniform constellation) is proposed.

Generally, the coding and modulation capacity, such as the BICM capacity in systems using a BICM apparatus, is considered as a target function, and it is desired to find optimum constellation points such that this capacity is maximized and constraints to the PAPR (peak to average power ratio) are simultaneously applied, often subject to a power normalization, i.e., the average power of the constellation points should be normalized to e.g. 1.

The disclosed NUCs may solely be optimized for BICM capacity (shaping gain), whereas the peak power may be left unconstraint. Those NUCs may be mainly suitable for multicarrier (MC) communication schemes, where the peak power of the constellation is independent of the actual output peak power of the modulator. In single carrier (SC) modulation, however, the peak power is an additional design element. Therefore, the present disclosure proposes a NUC design with peak power consideration. The overall SNR gain compared to uniform state-of-the-art constellations comprises two sources, namely shaping gain as well as PAPR gain. In other words, the present disclosure proposes NUCs with peak power constraint. NUCs optimized in this way can, in general, be applied to any modulation scheme (SC or MC) and in any communication standard. Their full potential is particularly achieved in SC.

In the tables presented herein various constellations are provided for different values of N and for different code rates R. It should be noted that the code rate R indicated in the tables are not to be understood such that a particular constellation is only valid for exactly this code rate, but also for slightly different code rates. The code rate as indicated in a modulation and coding scheme (MCS) index might differ from the true code rate of the system, e.g. because of padding and other constraints related to the frame structure.

It should also be noted that one or more of the following "invariant transformations" do not affect the properties of the constellations:
1. rotation of all symbols by an arbitrary angle $\varphi$,
2. inversion of m-th bit $y\_m = b \in \{0,1\}$ to $y\_m = \bar{b}$, where the bar indicates inversion,
3. interchanging of bit positions $y\_k1$ and $y\_k2$,
4. reflection on $Re\{xl\}$- and/or $Im\{xl\}$-axis,
5. predistortion,
6. mirroring on any line in the complex plane.

Thus, the modulator may also use a non-uniform constellation obtained from a constellation from anyone of groups A, B or C through rotation by an angle around the origin, an inversion of bit labels for all constellation points, an interchanging of bit positions for all constellation points and/or a reflection on the real part and/or imaginary part axis. For instance, if one constellation point has bit labels 0010 for 16-QAM, all first bit labels can be inverted such that this point becomes 1010. Further, constellation obtained through any other trivial manipulation, such as rounding of the constellation points' positions shall generally be covered by the claims. Through one or more of these operations an equivalent mapping to the mapping of the constellations defined in the above mentioned groups is achieved.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 1 shows a schematic diagram of an embodiment of a transmission apparatus according to the present disclosure, FIG. 2 shows a schematic diagram of an embodiment of a receiving apparatus according to the present disclosure.

DESCRIPTION OF THE EMBODIMENTS

Figure 3:
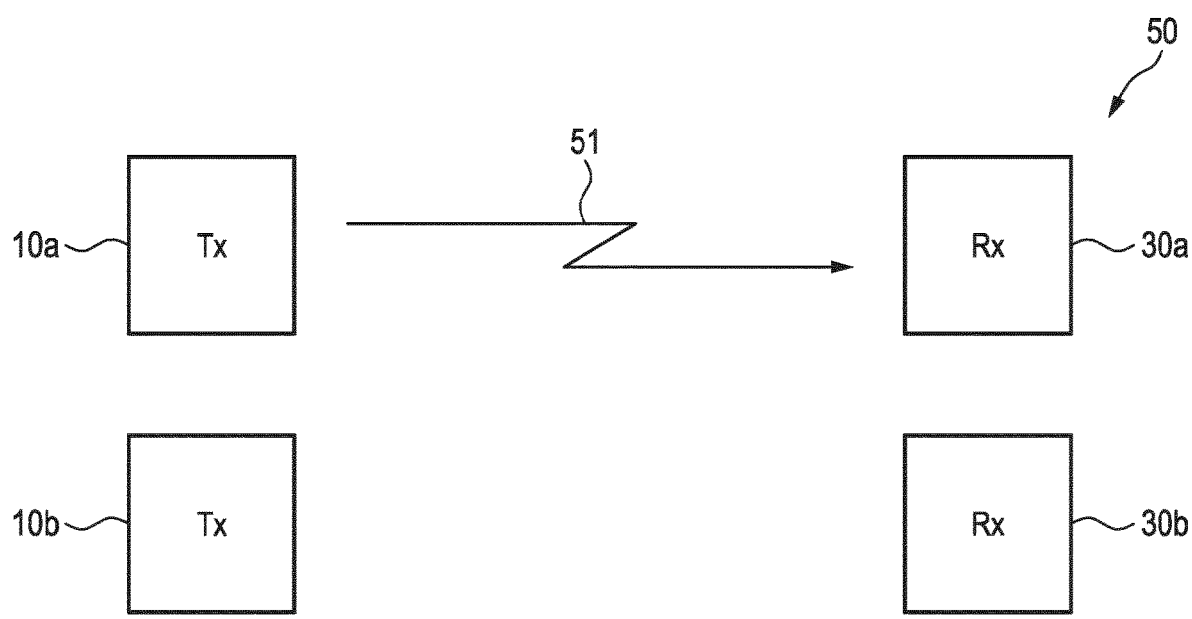
FIG. 3 shows a schematic diagram of an embodiment of a communications system according to the present disclosure.

Recently, single carrier (SC) modulation becomes again attractive for communication schemes and is considered in standards like DTMB and WLAN 802.11ad. The reason behind comprises the advance in research of efficient SC equalizer designs and a higher power efficiency for power amplifiers which increases battery lifetime of portable devices. The power efficiency is related to the peak-to-average power ratio (PAPR), which is rather large for multicarrier (MC) communication schemes and difficult to influence. In contrast, the PAPR in SC modulation is given by the peak power of the transmitted constellation itself, i.e. the signal point with maximum magnitude bounds the PAPR.

The power amplifier of a transmitter is required to have a linear input/output characteristic. However, at a certain input power, the output power of an amplifier saturates. Therefore, communications systems consider a power backoff which is the ratio between saturation power of the amplifier $P_{sat}$ and average power of the transmit signal $P_{avg}$. It is defined as $$P_B = 10\log_{10}\left(\frac{P_{sat}}{P_{avg}}\right)$$

in logarithmic scale (dB). The higher the PAPR of a modulation scheme is, the greater $P_B$ must be for operating the power amplifier in its linear region. The bit error probability of a communication scheme depends among other factors on $P_{avg}$. Thus, for an amplifier with a given $P_{sat}$, a large $P_B$ causes $P_{avg}$ to be low and the bit error probability to be high. As this in clearly undesired, a more powerful transmit amplifier with larger $P_{sat}$ is typically selected. However, as the power consumption of an amplifier is directly related to its $P_{sat}$, a more powerful amplifier results in a increased battery drain. Moreover, RF power is a scarce good at very high frequencies such as 60 GHz, because power amplifiers are not as efficient as in lower frequencies. Thus, it is desired to keep $P_B$ low. If $P_{sat}$ is assumed to be fixed, the equation above implies that a lower $P_B$ directly relates to a higher $P_{avg}$ and thus to a SNR gain or to a lower bit error probability, respectively.

In the following, NUCs as well as corresponding architectures of a transmitting apparatus and a receiving apparatus will be explained which are preferably, but not exclusively used in SC communication schemes. In addition to BICM capacity (shaping gain) the peak power is an additional design element, and the overall SNR gain compared to uniform constellations comprises two sources, namely shaping gain as well as PAPR gain.

FIG. 1 shows an embodiment of a transmission apparatus 10 according to the present disclosure including an embodiment of a coding and modulation apparatus 20 according to the present disclosure for use with SC modulation. The transmission apparatus 10 comprises an FEC (forward error correction) encoder 11 for encoding the input data by use of a coding algorithm, e.g. and LDPC (low density parity check) code, and a certain code rate, which is the ratio of number of incoming and outgoing bits. The code rate may depend on an MCS (modulation and coding scheme) index, which is generally predetermined or selected.

The transmission apparatus 10 further comprises a constellation mapper 12 (generally also called modulator), in particular a QAM (quadrature amplitude modulation) mapper, that maps the encoded bits of the input data to complex symbols (also called constellation points) in a constellation, in particular a QAM constellation. The modulation order (i.e. the number N of constellations points of the constellation, which corresponds to the number of bits mapped to a single QAM symbol) may also depend on the MCS index and is variable as well. The constellation diagram depicts all possible signal points within a complex plane.

The transmission apparatus 10 further comprises an optional pi/2 rotation unit 13 that introduces a pi/2 rotation, which improves the RF properties of the transmit signal. The pi/2 rotation has no influence on the BICM performance and is therefore generally not relevant to the NUC performance and optimization.

The transmission apparatus 10 further comprises an RF processing unit 14 for RF processing like frequency up-conversion, power amplifier, transmit filters, digital-to-analog conversion, etc., and a transmit unit 15 for transmitting the finally obtained signals over a channel to a receiving apparatus. In other embodiments of the transmission apparatus 10 additional elements may be provided, such as an input processing unit, or other elements as e.g. conventionally used in a transmission apparatus of a system in accordance with IEEE 802.11ad and 802.11ay.

The FEC encoder 11 and the constellation mapper (modulator) 12 are often summarized as BICM (bit-interleaved coded modulation) apparatus and represent the coding and modulation apparatus 20 according to the present disclosure. The FEC encoder 11 generally encodes input data into cell words, preferably according to an LDPC code (and optionally in accordance with a BCH code in addition). The modulator 12 generally modulates said cell words into constellation values of a non-uniform constellation and assigns bit combinations to constellation values of the used non-uniform constellation. Generally, the output of the FEC encoder 11 is referred to as a codeword (e.g. a couple of hundred bits), which are then divided into "tuples" (of e.g. 4 bits in case of 16-QAM), referred to also as cell words (of the codeword). These tuples (cell words) are then assigned to the constellations points by the modulator 12.

Based on the total number N of constellation points of the constellation (i.e. the modulation order) and the code rate R, one of a selection of non-uniform constellations of different groups is used. Details of those different groups of constellations will be explained in more detail below. The constellations and the constellations values are generally predetermined and e.g. stored in a constellations storage 16 or retrieved from an external source. The total number N and the code rate R, which may optionally be indicated by MCS parameters, may also be stored in the constellations storage 16 or the external source.

FIG. 2 shows an embodiment of a corresponding receiving apparatus 30 according to the present disclosure including an embodiment of a decoding and demodulation apparatus 40 according to the present disclosure. Basically, the same blocks of the transmission apparatus are reversed. After reception by a receiving unit 31, RF processing like frequency down-conversion, receive filtering, analog-to-digital conversion, etc. is performed by an RF unit 32. An equalizer 33 reverses the effect of channel distortions and forwards the equalized QAM symbols to the QAM demapper 34 (also called demodulator) for QAM de-mapping. Finally, decoding, e.g. LDPC decoding, is performed in a FEC decoder 35. In other embodiments of the receiving apparatus 30 additional elements may be provided, such as an output processing unit and/or a deframing unit, or other elements as e.g. conventionally used in a receiving apparatus of a system in accordance with IEEE 802.11ad and 802.11ay.

The QAM demapper 34 (demodulator) and the FEC decoder 35 are often summarized as BICM demodulation apparatus and represent the decoding and demodulation apparatus 40 according to the present disclosure. The demodulator 34 generally demodulates received constellation values of a non-uniform constellation into cell words, whereby bit combinations are assigned to constellation values of the used non-uniform constellation. In an embodiment, based on signalling information included in the received data the receiving apparatus 30 knows which one of a selection of non-uniform constellations of different groups has been used by the transmission apparatus 10 so that the receiving apparatus 30 can use the same non-uniform constellation for demodulation. The FEC decoder 35 generally decodes the cell words into output words. Also in the receiving apparatus 30 the constellations and the constellations values may be stored in a constellations storage 36 or retrieved from an external source.

The demodulation and decoding may consider soft values as opposed to hard decided values (0 and 1). Soft values represent the continuously distributed received values (possibly after A/D conversion including quantization) by more than two states (as in the case of binary (hard) decision). The reason is that for hard decision, the non-uniform constellations are generally not optimal. Nowadays, BICM receivers typically are soft receivers anyway.

FIG. 3 shows an embodiment of a communications system 50 according to the present disclosure comprising one (or more) transmission apparatus 10a, 10b (Tx), which may be a transmission apparatus 10 as shown in FIG. 1, and one or more receiving apparatus 30a, 30b (Rx), which may be a receiving apparatus 30 as shown in FIG. 2. As an example, the transmission apparatus 10a, which may be a WiFi access point or WiFi router, communicates with a receiving apparatus 30a, which may be a user device like a smartphone, laptop or tablet, via a bi-directional communication channel 51, for instance to provide access to the internet to the receiving apparatus 30a. Both the transmission apparatus 10a, 10b and the receiving apparatus 30a, 30b may use the ideas of the present disclosure in said communication session.

Today's systems in accordance with IEEE 802.11ad (WLAN, WiFi) generally use uniform constellations. Several Modulation and Coding Schemes (MCSs) are often defined for use in such systems. According to the present disclosure, non-uniform constellations are proposed, which are optimized with respect to peak power and, optionally, in addition with respect to coding and modulation capacity. One or more of these constellations may be used in systems in accordance with IEEE 802.11, particularly in accordance with versions like IEEE 802.11ad or upcoming versions such as IEEE 802.11ay.

The parameters of the basic MCSs for a transmitting apparatus are given in IEEE 802.11ad. The MCS index as described above defines the QAM modulation order (indicating the value of N) and the used code rate R. The receiver needs to know which MCS index (or, alternatively, modulation order N and code rate R) is used at transmitter side for correct decoding. Hence, in an embodiment the transmission apparatus 10 therefore signals the used MCS index (or, alternatively, which PHY mode, modulation order and code rate R). This signalling may be done at the beginning of each transmitted frame. For instance, this signalling information may be carried at the beginning of the frame in a special signal field. An example of a field which may be used is the HEADER field. For inserting such signalling information a tranmitter signalling unit 17 may be provided in the transmission apparatus 10.

In another embodiment the transmission apparatus 10 may optionally comprise a selection unit 18, shown with dashed lines in FIG. 1, which selects the MCS index (or the respective parameters indicated by the MCS index) depending on the channel conditions to the receiving apparatus 30. For bad channel conditions a small MCS index (i.e. small N and/or small R) is selected (lower throughput but also smaller error probability), for good channel conditions a higher MCS index (i.e. higher N and/or higher R) is selected (higher throughput but also more prone to bit errors).

In other embodiments no such selection unit 18 is provided, but the transmission apparatus 10 uses one of the disclosed non-uniform constellations.

In an embodiment the receiving apparatus 30 may optionally comprise a selection unit 37 as well, shown with dashed lines in FIG. 2, which selects the MCS index (or the respective parameters indicated by the MCS index) depending on the signalling information signalled by the transmission apparatus 10.

The NUC optimization for obtaining NUCs as used according to the present disclosure is as follows: Let $w_i$ be a signal point of a constellation diagram. All $w_i$ of a NUC are within the symbol vector W. The vector W has size N, i.e. there are N signal points in total. Furthermore, the peak power $\hat{P}$ is defined as $$\hat{P} = \max_{\forall w_i}\{|w_i|^2\}$$

and the average power $P = 1/N \sum_{i=0}^{N-1} |w_i|^2$ is set to unity (without loss of generality), i.e. P=1. The function cap(W, γ) computes the BICM capacity of a symbol vector W which is a function of the actual signal-to-noise ratio (SNR) γ.

First, the BICM capacity is maximized with a given constraint on the peak power $\hat{P}$. Thus, the resulting capacity is a function of the target peak power $\hat{P}_t$ and γ:

$$C_{opt}(\hat{P}_t, \gamma) = \max_W \{cap(W, \gamma)\}$$

with the constraints $\hat{P} = \hat{P}_t$ and P=1.

In principle, $C_{opt}(\hat{P}_t, \gamma)$ can be determined for every desired $\hat{P}_t$. One possibility is to select $\hat{P}_t$ such that the overall gain for SC modulation is maximized. The overall gain of peak power limited NUCs compared to uniform constellations (UCs) comprises two sources, namely SNR gain due to shaping gain and SNR gain due to peak power gain. In particular, the SNR gain due to shaping gain can be deduced from the difference between BICM capacity of the NUC and UC, i.e. $\Delta C = C_{opt}(\hat{P}_t, \gamma) - cap(W_{UC}, \gamma)$ with $W_{UC}$ being the signal point vector of the UC. The SNR gain in turn is determined by the function g(ΔC, γ). It returns the SNR gain in dB and is given by $$g(\Delta C, \gamma) = 10 \cdot \log_{10}\left[2^{\log_2(10^{\gamma/10}+1)+\Delta C} - 1\right] - \gamma$$

wherein γ is in dB.

The SNR gain due to peak power gain is determined by the difference between the peak power in dB of the UC and the NUC, i.e. $\hat{P}_{UC} - \hat{P}_t$. The reason behind this equation is that the power backoff $P_B$ of the NUC can be selected by $\hat{P}_{UC} - \hat{P}_t$ lower than for the UC. For a given amplifier, this results in an average power increase by $\hat{P}_{UC} - \hat{P}_t$ and consequently in a SNR gain of the same amount.

Thus, the overall gain G is $$G(\hat{P}_t, \gamma) = \hat{P}_{UC} - \hat{P}_t + g(\Delta C, \gamma)$$

which is maximized to get a peak power optimized NUC with maximum SNR gain for SC operation:

$$W(\gamma) = \underset{\hat{P}_t}{\operatorname{argmax}}\{G(\hat{P}_t, \gamma)\}$$

Obviously, the optimized NUC depends on the operating SNR γ which is determined by the properties of the FEC, e.g. that SNR value, where a certain bit/symbol/frame error rate is achieved.

As an implementation example, peak power optimized NUCs are disclosed for 802.11ay (next generation 60 GHz WLAN). Those NUCs are adapted to the particular LDPC code and code rates of WLAN. The target SNR γ is determined at a target FER of $10^{-2}$ for a UC with same number of constellation points N. Table 1 gives an overview of the considered modulation and coding schemes (MCS) and the corresponding number for N, R and γ. The column "opt. overall gain" gives the maximum overall gain $G_{opt}(\gamma)$ which can be achieved by the proposed NUCs. It is defined by $$G_{opt}(\gamma) = \max_{\hat{P}_t}\{G(\hat{P}_t, \gamma)\}$$

The proposed NUCs achieve the target FER of $10^{-2}$ at a SNR value of $\gamma - G_{opt}(\gamma)$.

TABLE 1

| MCS | N | Code rate R | γ [dB] | opt. overall gain $G_{opt}(\gamma)$[dB] |
|---|---|---|---|---|
| A | 16 | ½ | 8.2 | 1.45 |
| B | 16 | ⅝ | 10.1 | 1.33 |
| C | 16 | ¾ | 11.8 | 1.37 |
| D | 32 | ½ | 11.0 | 1.11 |
| E | 32 | ⅝ | 13.0 | 0.84 |
| F | 32 | ¾ | 14.8 | 0.72 |
| G | 32 | 13/16 | 16.0 | 0.69 |
| H | 64 | ½ | 12.9 | 1.83 |
| I | 64 | ⅝ | 15.0 | 1.62 |
| J | 64 | ¾ | 17.2 | 1.61 |
| K | 64 | 13/16 | 18.5 | 1.63 |

The corresponding signal constellations and bit labelling for every MCS given in Table 1 are given in the following. According to the present disclosure the modulator 12 is configured to use, based on the total number N of constellation points of the constellation and the code rate R, a predetermined non-uniform constellation and bit labeling, wherein the constellation points are defined by a constellation position vector $w_0 \ldots w_{N-1}$.

Figure 4:
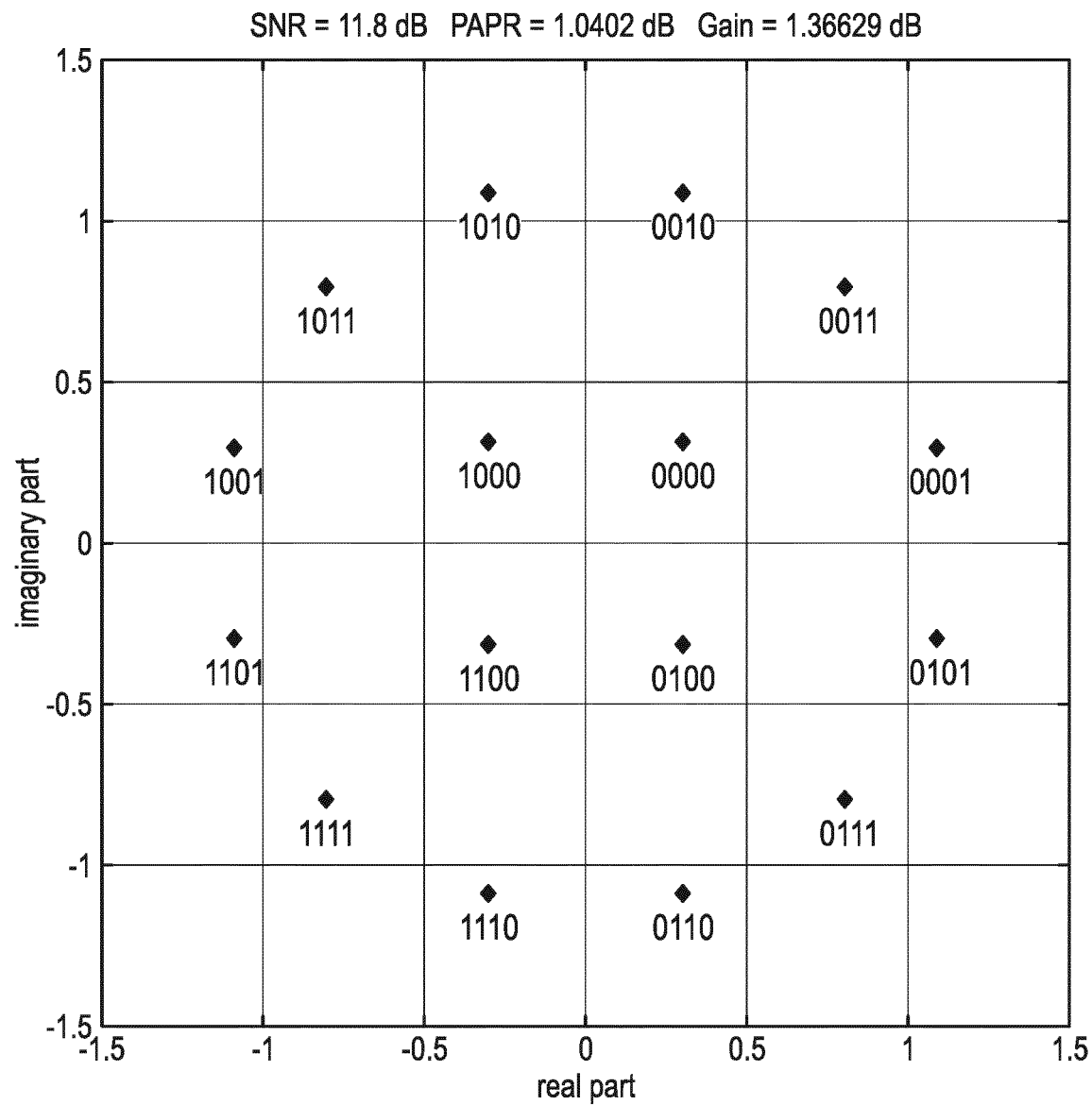
FIG. 4 shows a diagram of an exemplary two-dimensional non-uniform constellations according to the present disclosure for M=16.

If N=16 (MCS=A ... C) a non-uniform constellation and exemplary bit labeling is used from a group A1, wherein the constellation position vectors of the different constellations of the group A1 are defined as follows (an exemplary diagram showing the corresponding constellation for MCS=C is depicted in FIG. 4):

| w | bit label | MCS = A (or B or C) | MCS = B (or A or C) | MCS = C (or A or B) |
|---|---|---|---|---|
| w0 | 0000 | 0.9236 + 0.3833i | 0.2885 + 0.2883i | 0.2989 + 0.3143i |
| w1 | 0001 | 0.9236 + 0.3833i | 1.085 + 0.3172i | 1.0877 + 0.2957i |
| w2 | 0010 | 0.3833 + 0.9236i | 0.3168 + 1.0851i | 0.2979 + 1.0872i |
| w3 | 0011 | 0.3833 + 0.9236i | 0.7973 + 0.8014i | 0.8007 + 0.7934i |
| w4 | 0100 | 0.9236 − 0.3833i | 0.2885 − 0.2883i | 0.2989 − 0.3143i |
| w5 | 0101 | 0.9236 − 0.3833i | 1.085 − 0.3172i | 1.0877 − 0.2957i |
| w6 | 0110 | 0.3833 − 0.9236i | 0.3168 − 1.0851i | 0.2979 − 1.0872i |
| w7 | 0111 | 0.3833 − 0.9236i | 0.7973 − 0.8014i | 0.8007 − 0.7934i |
| w8 | 1000 | −0.9236 + 0.3833i | −0.2885 + 0.2883i | −0.2989 + 0.3143i |
| w9 | 1001 | −0.9236 + 0.3833i | −1.085 + 0.3172i | −1.0877 + 0.2957i |
| w10 | 1010 | −0.3833 + 0.9236i | −0.3168 + 1.0851i | −0.2979 + 1.0872i |
| w11 | 1011 | −0.3833 + 0.9236i | −0.7973 + 0.8014i | −0.8007 + 0.7934i |
| w12 | 1100 | −0.9236 − 0.3833i | −0.2885 − 0.2883i | −0.2989 − 0.3143i |
| w13 | 1101 | −0.9236 − 0.3833i | −1.085 − 0.3172i | −1.0877 − 0.2957i |
| w14 | 1110 | −0.3833 − 0.9236i | −0.3168 − 1.0851i | −0.2979 − 1.0872i |
| w15 | 1111 | −0.3833 − 0.9236i | −0.7973 − 0.8014i | −0.8007 − 0.7934i |

Figure 5:
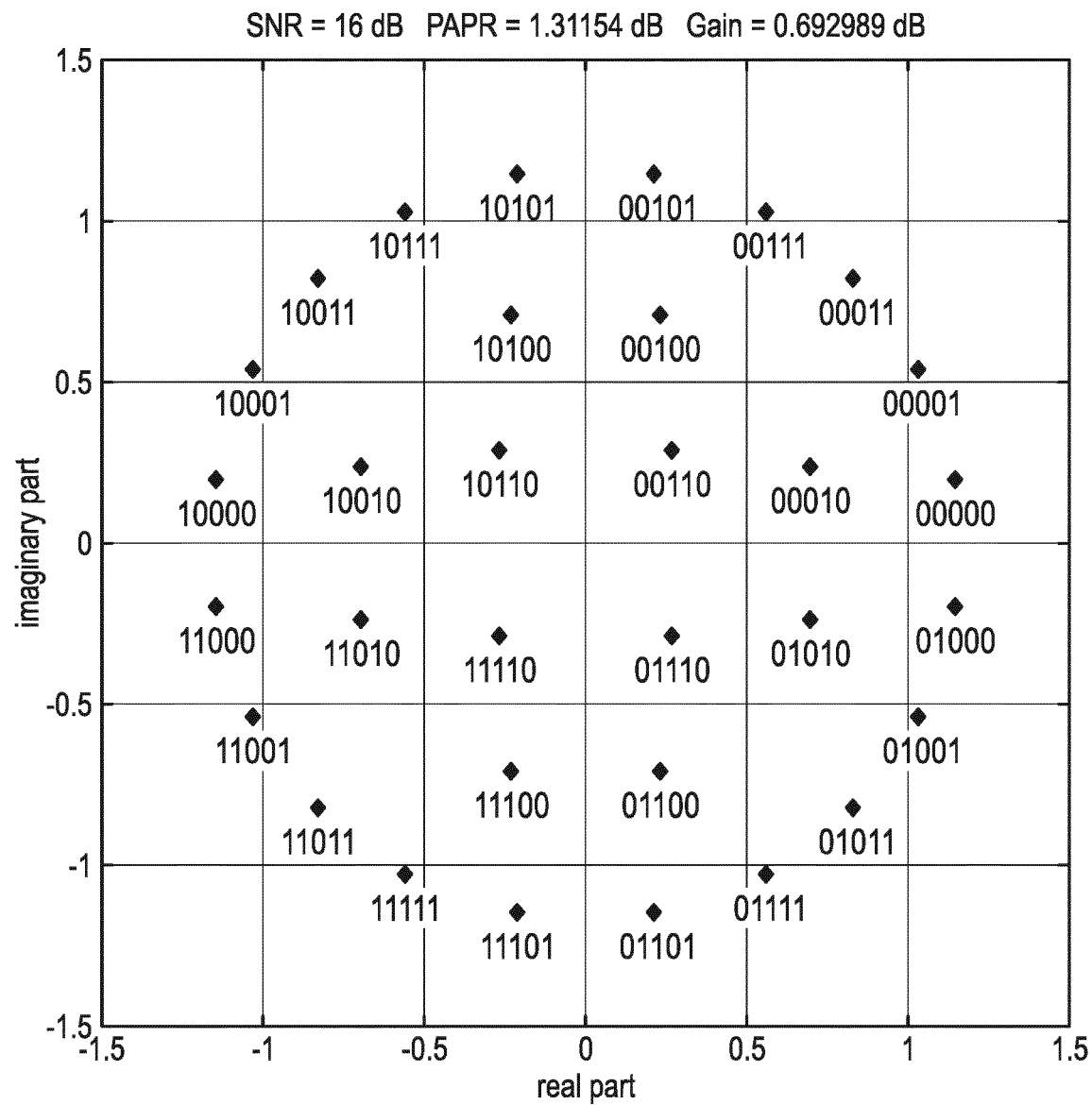
FIG. 5 shows a diagram of an exemplary two-dimensional non-uniform constellations according to the present disclosure for M=32.

If N=32 (MCS=D ... G) a non-uniform constellation and bit labeling is used from a group B1, wherein the constellation position vectors of the different constellations of the group B1 are defined as follows (an exemplary diagram showing the corresponding constellation for MCS=G is depicted in FIG. 5):

| w | bit label | MCS = D (or E or F or G) | MCS = E (or D or F or G) | MCS = F (or D or E or G) | MCS = G (or D or E or F) |
|---|---|---|---|---|---|
| w0 | 00000 | 1.0304 + 0.444i | 1.0971 + 0.18i | 1.1563 + 0.2084i | 1.146 + 0.1942i |
| w1 | 00001 | 1.1103 + 0.1616i | 0.4907 + 0.2208i | 0.6667 + 0.2352i | 1.0305 + 0.5389i |
| w2 | 00010 | 0.8946 + 0.6772i | 1.02 + 0.4423i | 1.039 + 0.5484i | 0.6951 + 0.233i |
| w3 | 00011 | 0.4346 + 0.2063i | 0.8817 + 0.6772i | 0.8367 + 0.8248i | 0.8267 + 0.8177i |
| w4 | 00100 | 0.4202 + 1.0404i | 0.18 + 1.0971i | 0.2126 + 0.6666i | 0.2293 + 0.7058i |
| w5 | 00101 | 0.1661 + 1.1091i | 0.2211 + 0.4958i | 0.2344 + 0.2319i | 0.2086 + 1.144i |
| w6 | 00110 | 0.6736 + 0.8966i | 0.4431 + 1.0196i | 0.1868 + 1.16i | 0.2677 + 0.2828i |
| w7 | 00111 | 0.1981 + 0.4223i | 0.6778 + 0.8812i | 0.5438 + 1.0415i | 0.5548 + 1.0221i |
| w8 | 01000 | 1.0304 − 0.444i | 1.0971 − 0.18i | 1.1563 − 0.2084i | 1.146 − 0.1942i |
| w9 | 01001 | 1.1103 − 0.1616i | 0.4907 − 0.2208i | 0.6667 − 0.2352i | 1.0305 − 0.5389i |
| w10 | 01010 | 0.8946 − 0.6772i | 1.02 − 0.4423i | 1.039 − 0.5484i | 0.6951 − 0.233i |
| w11 | 01011 | 0.4346 − 0.2063i | 0.8817 − 0.6772i | 0.8367 − 0.8248i | 0.8267 − 0.8177i |
| w12 | 01100 | 0.4202 − 1.0404i | 0.18 − 1.0971i | 0.2126 − 0.6666i | 0.2293 − 0.7058i |
| w13 | 01101 | 0.1661 − 1.1091i | 0.2211 − 0.4958i | 0.2344 − 0.2319i | 0.2086 − 1.144i |
| w14 | 01110 | 0.6736 − 0.8966i | 0.4431 − 1.0196i | 0.1868 − 1.16i | 0.2677 − 0.2828i |
| w15 | 01111 | 0.1981 − 0.4223i | 0.6778 − 0.8812i | 0.5438 − 1.0415i | 0.5548 − 1.0221i |
| w16 | 10000 | −1.0304 + 0.444i | −1.0971 + 0.18i | −1.1563 + 0.2084i | −1.146 + 0.1942i |
| w17 | 10001 | −1.1103 + 0.1616i | −0.4907 + 0.2208i | −0.6667 + 0.2352i | −1.0305 + 0.5389i |
| w18 | 10010 | −0.8946 + 0.6772i | −1.02 + 0.4423i | −1.039 + 0.5484i | −0.6951 + 0.233i |
| w19 | 10011 | −0.4346 + 0.2063i | −0.8817 + 0.6772i | −0.8367 + 0.8248i | −0.8267 + 0.8177i |
| w20 | 10100 | −0.4202 + 1.0404i | −0.18 + 1.0971i | −0.2126 + 0.6666i | −0.2293 + 0.7058i |
| w21 | 10101 | −0.1661 + 1.1091i | −0.2211 + 0.4958i | −0.2344 + 0.2319i | −0.2086 + 1.144i |
| w22 | 10110 | −0.6736 + 0.8966i | −0.4431 + 1.0196i | −0.1868 + 1.16i | −0.2677 + 0.2828i |
| w23 | 10111 | −0.1981 + 0.4223i | −0.6778 + 0.8812i | −0.5438 + 1.0415i | −0.5548 + 1.0221i |
| w24 | 11000 | −1.0304 − 0.444i | −1.0971 − 0.18i | −1.1563 − 0.2084i | −1.146 − 0.1942i |
| w25 | 11001 | −1.1103 − 0.1616i | −0.4907 − 0.2208i | −0.6667 − 0.2352i | −1.0305 − 0.5389i |
| w26 | 11010 | −0.8946 − 0.6772i | −1.02 − 0.4423i | −1.039 − 0.5484i | −0.6951 − 0.233i |
| w27 | 11011 | −0.4346 − 0.2063i | −0.8817 − 0.6772i | −0.8367 − 0.8248i | −0.8267 − 0.8177i |
| w28 | 11100 | −0.4202 − 1.0404i | −0.18 − 1.0971i | −0.2126 − 0.6666i | −0.2293 − 0.7058i |
| w29 | 11101 | −0.1661 − 1.1091i | −0.2211 − 0.4958i | −0.2344 − 0.2319i | −0.2086 − 1.144i |

-continued

| w | bit label | MCS = D (or E or F or G) | MCS = E (or D or F or G) | MCS = F (or D or E or G) | MCS = G (or D or E or F) |
|---|---|---|---|---|---|
| w30 | 11110 | −0.6736 − 0.8966i | −0.4431 − 1.0196i | −0.1868 − 1.16i | −0.2677 − 0.2828i |
| w31 | 11111 | −0.1981 − 0.4223i | −0.6778 − 0.8812i | −0.5438 − 1.0415i | −0.5548 − 1.0221i |

Figure 6:
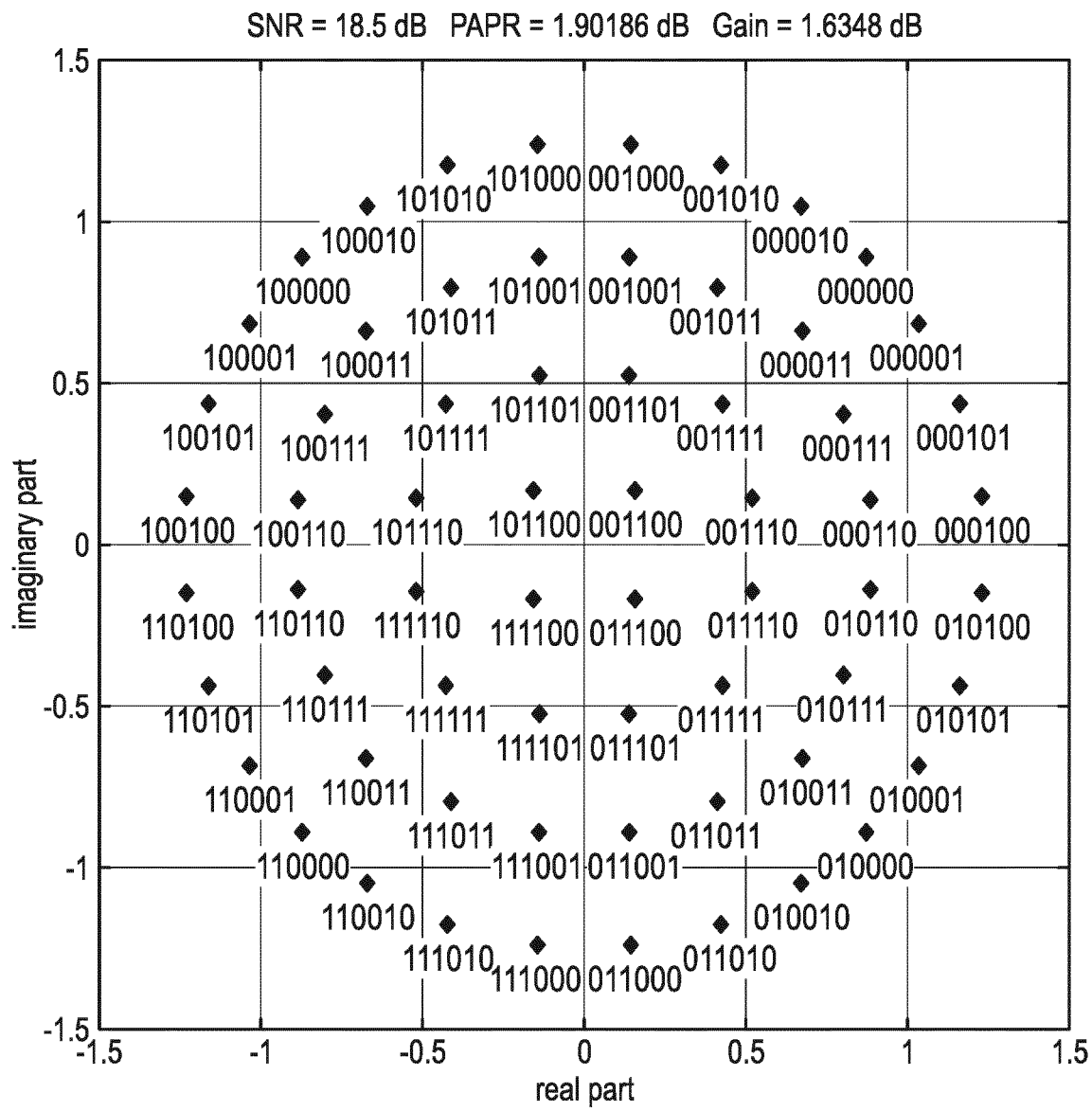
FIG. 6 shows a diagram of an exemplary two-dimensional non-uniform constellations according to the present disclosure for M=64.

If N=64 (MCS=H ... K) a non-uniform constellation and bit labeling is used from a group C1, wherein the constellation position vectors of the different constellations of the group C1 are defined as follows (an exemplary diagram showing the corresponding constellation for MCS=K is depicted in FIG. 6):

| w | bit label | MCS = H (or I or J or K) | MCS = I (or H or J or K) | MCS = J (or H or I or K) | MCS = K (or H or I or J) |
|---|---|---|---|---|---|
| w0 | 000000 | 0.2287 + 0.5143i | 0.1978 + 0.198i | 1.0605 + 0.5953i | 0.873 + 0.8874i |
| w1 | 000001 | 0.2116 + 1.0918i | 0.1916 + 1.1985i | 0.1796 + 0.4943i | 1.0395 + 0.6848i |
| w2 | 000010 | 0.2828 + 0.5535i | 0.4969 + 0.1984i | 0.7562 + 0.4956i | 0.6726 + 1.0474i |
| w3 | 000011 | 0.214 + 1.0888i | 0.4757 + 1.1166i | 0.4954 + 0.5126i | 0.6771 + 0.6619i |
| w4 | 000100 | 0.6913 + 0.8711i | 0.1862 + 0.5083i | 1.1574 + 0.3735i | 1.2358 + 0.1495i |
| w5 | 000101 | 0.461 + 1.012i | 0.171 + 0.8428i | 0.1887 + 0.1816i | 1.1669 + 0.4334i |
| w6 | 000110 | 0.6929 + 0.8697i | 0.479 + 0.5257i | 0.8128 + 0.199i | 0.8923 + 0.1387i |
| w7 | 000111 | 0.4624 + 1.0114i | 0.4272 + 0.8201i | 0.5012 + 0.183i | 0.8067 + 0.404i |
| w8 | 001000 | 0.3191 + 0.2057i | 1.1727 + 0.3125i | 0.9378 + 0.7743i | 0.1465 + 1.2361i |
| w9 | 001001 | 1.0956 + 0.1876i | 1.2022 + 0.1671i | 0.1694 + 0.8236i | 0.1412 + 0.8899i |
| w10 | 001010 | 0.5092 + 0.2494i | 0.7798 + 0.2035i | 0.7911 + 0.9225i | 0.4261 + 1.1695i |
| w11 | 001011 | 1.093 + 0.2006i | 0.6806 + 1.0049i | 0.4477 + 0.779i | 0.413 + 0.7955i |
| w12 | 001100 | 0.8876 + 0.67i | 1.0766 + 0.5604i | 1.2059 + 0.157i | 0.1641 + 0.164i |
| w13 | 001101 | 1.0256 + 0.4299i | 0.9914 + 0.7003i | 0.1661 + 1.2048i | 0.1442 + 0.5197i |
| w14 | 001110 | 0.8899 + 0.6666i | 0.7425 + 0.5068i | 0.6275 + 1.0418i | 0.5218 + 0.1427i |
| w15 | 001111 | 1.0227 + 0.4368i | 0.8329 + 0.8826i | 0.4264 + 1.1388i | 0.4324 + 0.4339i |
| w16 | 010000 | 0.2287 − 0.5143i | 0.1978 − 0.198i | 1.0605 − 0.5953i | 0.873 − 0.8874i |
| w17 | 010001 | 0.2116 − 1.0918i | 0.1916 − 1.1985i | 0.1796 − 0.4943i | 1.0395 − 0.6848i |
| w18 | 010010 | 0.2828 − 0.5535i | 0.4969 − 0.1984i | 0.7562 − 0.4956i | 0.6726 − 1.0474i |
| w19 | 010011 | 0.214 − 1.0888i | 0.4757 − 1.1166i | 0.4954 − 0.5126i | 0.6771 − 0.6619i |
| w20 | 010100 | 0.6913 − 0.8711i | 0.1862 − 0.5083i | 1.1574 − 0.3735i | 1.2358 − 0.1495i |
| w21 | 010101 | 0.461 − 1.012i | 0.171 − 0.8428i | 0.1887 − 0.1816i | 1.1669 − 0.4334i |
| w22 | 010110 | 0.6929 − 0.8697i | 0.479 − 0.5257i | 0.8128 − 0.199i | 0.8923 − 0.1387i |
| w23 | 010111 | 0.4624 − 1.0114i | 0.4272 − 0.8201i | 0.5012 − 0.183i | 0.8067 − 0.404i |
| w24 | 011000 | 0.3191 − 0.2057i | 1.1727 − 0.3125i | 0.9378 − 0.7743i | 0.1465 − 1.2361i |
| w25 | 011001 | 1.0956 − 0.1876i | 1.2022 − 0.1671i | 0.1694 − 0.8236i | 0.1412 − 0.8899i |
| w26 | 011010 | 0.5092 − 0.2494i | 0.7798 − 0.2035i | 0.7911 − 0.9225i | 0.4261 − 1.1695i |
| w27 | 011011 | 1.093 − 0.2006i | 0.6806 − 1.0049i | 0.4477 − 0.779i | 0.413 − 0.7955i |
| w28 | 011100 | 0.8876 − 0.67i | 1.0766 − 0.5604i | 1.2059 − 0.157i | 0.1641 − 0.164i |
| w29 | 011101 | 1.0256 − 0.4299i | 0.9914 − 0.7003i | 0.1661 − 1.2048i | 0.1442 − 0.5197i |
| w30 | 011110 | 0.8899 − 0.6666i | 0.7425 − 0.5068i | 0.6275 − 1.0418i | 0.5218 − 0.1427i |
| w31 | 011111 | 1.0227 − 0.4368i | 0.8329 − 0.8826i | 0.4264 − 1.1388i | 0.4324 − 0.4339i |
| w32 | 100000 | −0.2287 + 0.5143i | −0.1978 + 0.198i | −1.0605 + 0.5953i | −0.873 + 0.8874i |
| w33 | 100001 | −0.2116 + 1.0918i | −0.1916 + 1.1985i | −0.1796 + 0.4943i | −1.0395 + 0.6848i |
| w34 | 100010 | −0.2828 + 0.5535i | −0.4969 + 0.1984i | −0.7562 + 0.4956i | −0.6726 + 1.0474i |
| w35 | 100011 | −0.214 + 1.0888i | −0.4757 + 1.1166i | −0.4954 + 0.5126i | −0.6771 + 0.6619i |
| w36 | 100100 | −0.6913 + 0.8711i | −0.1862 + 0.5083i | −1.1574 + 0.3735i | −1.2358 + 0.1495i |
| w37 | 100101 | −0.461 + 1.012i | −0.171 + 0.8428i | −0.1887 + 0.1816i | −1.1669 + 0.4334i |
| w38 | 100110 | −0.6929 + 0.8697i | −0.479 + 0.5257i | −0.8128 + 0.199i | −0.8923 + 0.1387i |
| w39 | 100111 | −0.4624 + 1.0114i | −0.4272 + 0.8201i | −0.5012 + 0.183i | −0.8067 + 0.404i |
| w40 | 101000 | −0.3191 + 0.2057i | −1.1727 + 0.3125i | −0.9378 + 0.7743i | −0.1465 + 1.2361i |
| w41 | 101001 | −1.0956 + 0.1876i | −1.2022 + 0.1671i | −0.1694 + 0.8236i | −0.1412 + 0.8899i |
| w42 | 101010 | −0.5092 + 0.2494i | −0.7798 + 0.2035i | −0.7911 + 0.9225i | −0.4261 + 1.1695i |
| w43 | 101011 | −1.093 + 0.2006i | −0.6806 + 1.0049i | −0.4477 + 0.779i | −0.413 + 0.7955i |
| w44 | 101100 | −0.8876 + 0.67i | −1.0766 + 0.5604i | −1.2059 + 0.157i | −0.1641 + 0.164i |
| w45 | 101101 | −1.0256 + 0.4299i | −0.9914 + 0.7003i | −0.1661 + 1.2048i | −0.1442 + 0.5197i |
| w46 | 101110 | −0.8899 + 0.6666i | −0.7425 + 0.5068i | −0.6275 + 1.0418i | −0.5218 + 0.1427i |
| w47 | 101111 | −1.0227 + 0.4368i | −0.8329 + 0.8826i | −0.4264 + 1.1388i | −0.4324 + 0.4339i |
| w48 | 110000 | −0.2287 − 0.5143i | −0.1978 − 0.198i | −1.0605 − 0.5953i | −0.873 − 0.8874i |
| w49 | 110001 | −0.2116 − 1.0918i | −0.1916 − 1.1985i | −0.1796 − 0.4943i | −1.0395 − 0.6848i |
| w50 | 110010 | −0.2828 − 0.5535i | −0.4969 − 0.1984i | −0.7562 − 0.4956i | −0.6726 − 1.0474i |
| w51 | 110011 | −0.214 − 1.0888i | −0.4757 − 1.1166i | −0.4954 − 0.5126i | −0.6771 − 0.6619i |
| w52 | 110100 | −0.6913 − 0.8711i | −0.1862 − 0.5083i | −1.1574 − 0.3735i | −1.2358 − 0.1495i |
| w53 | 110101 | −0.461 − 1.012i | −0.171 − 0.8428i | −0.1887 − 0.1816i | −1.1669 − 0.4334i |
| w54 | 110110 | −0.6929 − 0.8697i | −0.479 − 0.5257i | −0.8128 − 0.199i | −0.8923 − 0.1387i |
| w55 | 110111 | −0.4624 − 1.0114i | −0.4272 − 0.8201i | −0.5012 − 0.183i | −0.8067 − 0.404i |
| w56 | 111000 | −0.3191 − 0.2057i | −1.1727 − 0.3125i | −0.9378 − 0.7743i | −0.1465 − 1.2361i |
| w57 | 111001 | −1.0956 − 0.1876i | −1.2022 − 0.1671i | −0.1694 − 0.8236i | −0.1412 − 0.8899i |
| w58 | 111010 | −0.5092 − 0.2494i | −0.7798 − 0.2035i | −0.7911 − 0.9225i | −0.4261 − 1.1695i |
| w59 | 111011 | −1.093 − 0.2006i | −0.6806 − 1.0049i | −0.4477 − 0.779i | −0.413 − 0.7955i |
| w60 | 111100 | −0.8876 − 0.67i | −1.0766 − 0.5604i | −1.2059 − 0.157i | −0.1641 − 0.164i |
| w61 | 111101 | −1.0256 − 0.4299i | −0.9914 − 0.7003i | −0.1661 − 1.2048i | −0.1442 − 0.5197i |

-continued

| w | bit label | MCS = H (or I or J or K) | MCS = I (or H or J or K) | MCS = J (or H or I or K) | MCS = K (or H or I or J) |
|---|---|---|---|---|---|
| w62 | 111110 | −0.8899 − 0.6666i | −0.7425 − 0.5068i | −0.6275 − 1.0418i | −0.5218 − 0.1427i |
| w63 | 111111 | −1.0227 − 0.4368i | −0.8329 − 0.8826i | −0.4264 − 1.1388i | −0.4324 − 0.4339i |

It should be noted that the MCS index in Table 1 is not related to the MCS index in the published 802.11ad amendment. Further, the same NUC may be used for different MCS indices (e.g. the constellation points defined for MCS A may be used for both MCS A and MCS B to reduce the overall number of NUCs), in particular for different code rates.

The selection unit 18 may be configured to select the total number N of constellation points of the constellation and the code rate R based on channel conditions between a transmission apparatus including said coding and modulation apparatus and a receiving apparatus with which said transmission apparatus seeks to communicate. The selection unit 18 may select a constellation with a higher number of N and/or a higher code rate R the better the channel conditions are.

The NUCs are fully described by the complex valued signal point and the corresponding bit label. It should be noted, however, that bit positions may be inverted, i.e. the bits of any bit position of the bit labeling may be flipped, resulting in the same performance. This particularly means that not less than all bit labels of the constellation points may be inverted. Further, a column-wise inversion of bit labels is possbile, so that e.g. the first bit of all constellation points can be inverted. An example for column-wise inversion of the first bit (which affects all bit labels) would be:
w0 00→10
w1 01→11
w2 10→00
w3 11→01

Moreover, the bit labeling is exemplary in the sense that bit positions may be interchanged. An interchange of bit positions may be beneficial for optimizing the NUCs to a particular FEC scheme. Furthermore, an optional predistortion unit may map the amplitude levels of the given NUC signal points to different amplitude levels. This can be beneficial when power amplifiers with non-linear transfer characteristic (beside a maximum output power) are applied.

The signal points are represented with 4 decimal places in the above tables. It should be noted that the given complex values may also be rounded, e.g. to 3 decimal places, or extended, e.g. to 5 decimal places, which shall be understood to be covered by the claims as well. In particular, rounding in binary number may be made, i.e. rounding to integer multiples of $2^{-n}$ value with n being an integer number.

Table 2 summarizes the parameters of alternative NUCs, which have been optimized to have a target PAPR of 2.77 dB for N=64 (referred to by MCS indices H' to K').

TABLE 2

| MCS | N | Code rate R | γ [dB] | overall gain $G(\hat{P}_t, \gamma)[dB]$ |
|---|---|---|---|---|
| H' | 64 | ½ | 12.9 | 1.19 |
| I' | 64 | ⅝ | 15.0 | 1.24 |
| J' | 64 | ¾ | 17.2 | 1.14 |
| K' | 64 | 13/16 | 18.5 | 1.07 |

The corresponding signal constellations and bit labelling for every MCS given in Table 2 are given in the following. A non-uniform constellation and bit labeling is used from a group C2, wherein the constellation position vectors of the different constellations of the group C2 are defined as follows:

| w | bit label | MCS = H' (or I' or J' or K') | MCS = I' (or H' or J' or K') | MCS = J' (or H' or I' or K') | MCS = K' (or H' or I' or J') |
|---|---|---|---|---|---|
| w0 | 000000 | 0.1298 + 0.2084i | 0.3328 + 0.1665i | 0.9596 + 0.4358i | 1.022 + 0.4536i |
| w1 | 000001 | 0.1883 + 1.3627i | 0.5435 + 1.2609i | 0.1328 + 0.5092i | 0.1374 + 0.4738i |
| w2 | 000010 | 0.217 + 0.4464i | 0.1217 + 0.1744i | 0.6561 + 0.4543i | 0.6985 + 0.4499i |
| w3 | 000011 | 0.1269 + 0.764i | 0.1904 + 1.3623i | 0.3855 + 0.4909i | 0.413 + 0.4891i |
| w4 | 000100 | 0.7986 + 1.12i | 0.3528 + 0.4894i | 0.9773 + 0.1483i | 1.0021 + 0.1484i |
| w5 | 000101 | 0.4538 + 1.1748i | 0.4073 + 0.8478i | 0.1256 + 0.1724i | 0.1339 + 0.1575i |
| w6 | 000110 | 0.4822 + 0.6563i | 0.1288 + 0.5124i | 0.6457 + 0.1512i | 0.6852 + 0.1497i |
| w7 | 000111 | 0.3148 + 0.8326i | 0.1465 + 0.8935i | 0.3703 + 0.1633i | 0.4014 + 0.1605i |
| w8 | 001000 | 0.2328 + 0.1185i | 0.5998 + 0.1505i | 1.2035 + 0.6663i | 1.147 + 0.7594i |
| w9 | 001001 | 1.3637 + 0.1808i | 0.8781 + 1.0589i | 0.1492 + 0.8611i | 0.1479 + 0.8049i |
| w10 | 001010 | 0.4762 + 0.2045i | 0.9411 + 0.1492i | 0.7306 + 0.7613i | 0.7571 + 0.7595i |
| w11 | 001011 | 0.827 + 0.1328i | 1.3582 + 0.218i | 0.4377 + 0.8492i | 0.4503 + 0.8438i |
| w12 | 001100 | 1.0652 + 0.8657i | 0.6339 + 0.4545i | 1.3574 + 0.2231i | 1.3596 + 0.2095i |
| w13 | 001101 | 1.262 + 0.5438i | 0.7138 + 0.7632i | 0.1858 + 1.2632i | 0.1659 + 1.1736i |
| w14 | 001110 | 0.6765 + 0.4967i | 0.9294 + 0.4189i | 0.9009 + 1.0396i | 0.841 + 1.0885i |
| w15 | 001111 | 0.8548 + 0.3591i | 1.1995 + 0.6617i | 0.5564 + 1.2461i | 0.5064 + 1.2593i |
| w16 | 010000 | 0.1298 − 0.2084i | 0.3328 − 0.1665i | 0.9596 − 0.4358i | 1.022 − 0.4536i |
| w17 | 010001 | 0.1883 − 1.3627i | 0.5435 − 1.2609i | 0.1328 − 0.5092i | 0.1374 − 0.4738i |
| w18 | 010010 | 0.217 − 0.4464i | 0.1217 − 0.1744i | 0.6561 − 0.4543i | 0.6985 − 0.4499i |
| w19 | 010011 | 0.1269 − 0.764i | 0.1904 − 1.3623i | 0.3855 − 0.4909i | 0.413 − 0.4891i |
| w20 | 010100 | 0.7986 − 1.12i | 0.3528 − 0.4894i | 0.9773 − 0.1483i | 1.0021 − 0.1484i |
| w21 | 010101 | 0.4538 − 1.1748i | 0.4073 − 0.8478i | 0.1256 − 0.1724i | 0.1339 − 0.1575i |
| w22 | 010110 | 0.4822 − 0.6563i | 0.1288 − 0.5124i | 0.6457 − 0.1512i | 0.6852 − 0.1497i |
| w23 | 010111 | 0.3148 − 0.8326i | 0.1465 − 0.8935i | 0.3703 − 0.1633i | 0.4014 − 0.1605i |
| w24 | 011000 | 0.2328 − 0.1185i | 0.5998 − 0.1505i | 1.2035 − 0.6663i | 1.147 − 0.7594i |
| w25 | 011001 | 1.3637 − 0.1808i | 0.8781 − 1.0589i | 0.1492 − 0.8611i | 0.1479 − 0.8049i |
| w26 | 011010 | 0.4762 − 0.2045i | 0.9411 − 0.1492i | 0.7306 − 0.7613i | 0.7571 − 0.7595i |

-continued

| w | bit label | MCS = H' (or I' or J' or K') | MCS = I' (or H' or J' or K') | MCS = J' (or H' or I' or K') | MCS = K' (or H' or I' or J') |
|---|---|---|---|---|---|
| w27 | 011011 | 0.827 − 0.1328i | 1.3582 − 0.218i | 0.4377 − 0.8492i | 0.4503 − 0.8438i |
| w28 | 011100 | 1.0652 − 0.8657i | 0.6339 − 0.4545i | 1.3574 − 0.2231i | 1.3596 − 0.2095i |
| w29 | 011101 | 1.262 − 0.5438i | 0.7138 − 0.7632i | 0.1858 − 1.2632i | 0.1659 − 1.1736i |
| w30 | 011110 | 0.6765 − 0.4967i | 0.9294 − 0.4189i | 0.9009 − 1.0396i | 0.841 − 1.0885i |
| w31 | 011111 | 0.8548 − 0.3591i | 1.1995 − 0.6617i | 0.5564 − 1.2461i | 0.5064 − 1.2593i |
| w32 | 100000 | −0.1298 + 0.2084i | −0.3328 + 0.1665i | −0.9596 + 0.4358i | −1.022 + 0.4536i |
| w33 | 100001 | −0.1883 + 1.3627i | −0.5435 + 1.2609i | −0.1328 + 0.5092i | −0.1374 + 0.4738i |
| w34 | 100010 | −0.217 + 0.4464i | −0.1217 + 0.1744i | −0.6561 + 0.4543i | −0.6985 + 0.4499i |
| w35 | 100011 | −0.1269 + 0.764i | −0.1904 + 1.3623i | −0.3855 + 0.4909i | −0.413 + 0.4891i |
| w36 | 100100 | −0.7986 + 1.12i | −0.3528 + 0.4894i | −0.9773 + 0.1483i | −1.0021 + 0.1484i |
| w37 | 100101 | −0.4538 + 1.1748i | −0.4073 + 0.8478i | −0.1256 + 0.1724i | −0.1339 + 0.1575i |
| w38 | 100110 | −0.4822 + 0.6563i | −0.1288 + 0.5124i | −0.6457 + 0.1512i | −0.6852 + 0.1497i |
| w39 | 100111 | −0.3148 + 0.8326i | −0.1465 + 0.8935i | −0.3703 + 0.1633i | −0.4014 + 0.1605i |
| w40 | 101000 | −0.2328 + 0.1185i | −0.5998 + 0.1505i | −1.2035 + 0.6663i | −1.147 + 0.7594i |
| w41 | 101001 | −1.3637 + 0.1808i | −0.8781 + 1.0589i | −0.1492 + 0.8611i | −0.1479 + 0.8049i |
| w42 | 101010 | −0.4762 + 0.2045i | −0.9411 + 0.1492i | −0.7306 + 0.7613i | −0.7571 + 0.7595i |
| w43 | 101011 | −0.827 + 0.1328i | −1.3582 + 0.218i | −0.4377 + 0.8492i | −0.4503 + 0.8438i |
| w44 | 101100 | −1.0652 + 0.8657i | −0.6339 + 0.4545i | −1.3574 + 0.2231i | −1.3596 + 0.2095i |
| w45 | 101101 | −1.262 + 0.5438i | −0.7138 + 0.7632i | −0.1858 + 1.2632i | −0.1659 + 1.1736i |
| w46 | 101110 | −0.6765 + 0.4967i | −0.9294 + 0.4189i | −0.9009 + 1.0396i | −0.841 + 1.0885i |
| w47 | 101111 | −0.8548 + 0.3591i | −1.1995 + 0.6617i | −0.5564 + 1.2461i | −0.5064 + 1.2593i |
| w48 | 110000 | −0.1298 − 0.2084i | −0.3328 − 0.1665i | −0.9596 − 0.4358i | −1.022 − 0.4536i |
| w49 | 110001 | −0.1883 − 1.3627i | −0.5435 − 1.2609i | −0.1328 − 0.5092i | −0.1374 − 0.4738i |
| w50 | 110010 | −0.217 − 0.4464i | −0.1217 − 0.1744i | −0.6561 − 0.4543i | −0.6985 − 0.4499i |
| w51 | 110011 | −0.1269 − 0.764i | −0.1904 − 1.3623i | −0.3855 − 0.4909i | −0.413 − 0.4891i |
| w52 | 110100 | −0.7986 − 1.12i | −0.3528 − 0.4894i | −0.9773 − 0.1483i | −1.0021 − 0.1484i |
| w53 | 110101 | −0.4538 − 1.1748i | −0.4073 − 0.8478i | −0.1256 − 0.1724i | −0.1339 − 0.1575i |
| w54 | 110110 | −0.4822 − 0.6563i | −0.1288 − 0.5124i | −0.6457 − 0.1512i | −0.6852 − 0.1497i |
| w55 | 110111 | −0.3148 − 0.8326i | −0.1465 − 0.8935i | −0.3703 − 0.1633i | −0.4014 − 0.1605i |
| w56 | 111000 | −0.2328 − 0.1185i | −0.5998 − 0.1505i | −1.2035 − 0.6663i | −1.147 − 0.7594i |
| w57 | 111001 | −1.3637 − 0.1808i | −0.8781 − 1.0589i | −0.1492 − 0.8611i | −0.1479 − 0.8049i |
| w58 | 111010 | −0.4762 − 0.2045i | −0.9411 − 0.1492i | −0.7306 − 0.7613i | −0.7571 − 0.7595i |
| w59 | 111011 | −0.827 − 0.1328i | −1.3582 − 0.218i | −0.4377 − 0.8492i | −0.4503 − 0.8438i |
| w60 | 111100 | −1.0652 − 0.8657i | −0.6339 − 0.4545i | −1.3574 − 0.2231i | −1.3596 − 0.2095i |
| w61 | 111101 | −1.262 − 0.5438i | −0.7138 − 0.7632i | −0.1858 − 1.2632i | −0.1659 − 1.1736i |
| w62 | 111110 | −0.6765 − 0.4967i | −0.9294 − 0.4189i | −0.9009 − 1.0396i | −0.841 − 1.0885i |
| w63 | 111111 | −0.8548 − 0.3591i | −1.1995 − 0.6617i | −0.5564 − 1.2461i | −0.5064 − 1.2593i |

These NUCs have been designed with $\hat{P}_t = 2.77$ dB. Thus, they have not been optimized for optimum $\hat{P}_t$, i.e. maximization of $G(\hat{P}_t, \gamma)$ with respect to $\hat{P}_t$ has not been performed. Therefore, the overall gain $G(\hat{P}_t, \gamma)$ is lower in this case as can be clearly seen when comparing Table 1 and Table 2.

Table 3 summarizes the parameters of alternative NUCs, which have been optimized to have a shaping gain of 0 dB for N=16, 32 or 64 (referred to by MCS indices A" to K").

TABLE 3

| MCS | N | Code rate R | γ [dB] | overall gain $G(\hat{P}_t, \gamma)$ [dB] |
|---|---|---|---|---|
| A" | 16 | ½ | 8.2 | 0.71 |
| B" | 16 | ⅝ | 10.1 | 0.55 |
| C" | 16 | ¾ | 11.8 | 0.35 |
| D" | 32 | ½ | 11.0 | 0.98 |
| E" | 32 | ⅝ | 13.0 | 0.76 |
| F" | 32 | ¾ | 14.8 | 0.60 |
| G" | 32 | 13/16 | 16.0 | 0.52 |
| H" | 64 | ½ | 12.9 | 1.60 |
| I" | 64 | ⅝ | 15.0 | 1.58 |
| J" | 64 | ¾ | 17.2 | 1.46 |
| K" | 64 | 13/16 | 18.5 | 1.55 |

If N=16 (MCS=A" . . . C") a non-uniform constellation and bit labeling is used from a group A3, wherein the constellation position vectors of the different constellations of the group A3 are defined as follows:

| w | bit label | MCS = A" (or B" or C") | MCS = B" (or A" or C") | MCS = C" (or A" or B") |
|---|---|---|---|---|
| w0 | 0000 | 0.8429 + 0.2537i | 0.4349 + 0.1989i | 0.9963 + 0.2925i |
| w1 | 0001 | 0.9864 + 0.7471i | 1.1973 + 0.4119i | 0.9109 + 0.9109i |
| w2 | 0010 | 0.2155 + 0.3413i | 0.2573 + 0.7061i | 0.3034 + 0.3034i |
| w3 | 0011 | 0.3772 + 1.1785i | 0.6759 + 1.0707i | 0.2925 + 0.9963i |
| w4 | 0100 | 0.8429 − 0.2537i | 0.4349 − 0.1989i | 0.9963 − 0.2925i |
| w5 | 0101 | 0.9864 − 0.7471i | 1.1973 − 0.4119i | 0.9109 − 0.9109i |
| w6 | 0110 | 0.2155 − 0.3413i | 0.2573 − 0.7061i | 0.3034 − 0.3034i |
| w7 | 0111 | 0.3772 − 1.1785i | 0.6759 − 1.0707i | 0.2925 − 0.9963i |
| w8 | 1000 | −0.8429 + 0.2537i | −0.4349 + 0.1989i | −0.9963 + 0.2925i |
| w9 | 1001 | −0.9864 + 0.7471i | −1.1973 + 0.4119i | −0.9109 + 0.9109i |
| w10 | 1010 | −0.2155 + 0.3413i | −0.2573 + 0.7061i | −0.3034 + 0.3034i |
| w11 | 1011 | −0.3772 + 1.1785i | −0.6759 + 1.0707i | −0.2925 + 0.9963i |
| w12 | 1100 | −0.8429 − 0.2537i | −0.4349 − 0.1989i | −0.9963 − 0.2925i |
| w13 | 1101 | −0.9864 − 0.7471i | −1.1973 − 0.4119i | −0.9109 − 0.9109i |
| w14 | 1110 | −0.2155 − 0.3413i | −0.2573 − 0.7061i | −0.3034 − 0.3034i |
| w15 | 1111 | −0.3772 − 1.1785i | −0.6759 − 1.0707i | −0.2925 − 0.9963i |

If N=32 (MCS=D" . . . G") a non-uniform constellation and bit labeling is used from a group B3, wherein the constellation position vectors of the different constellations of the group B3 are defined as follows:

| w | bit label | MCS = D" (or E" or F" or G") | MCS = E" (or D" or F" or G") | MCS = F" (or D" or E" or G") | MCS = G" (or D" or E" or F") |
|---|---|---|---|---|---|
| w0 | 00000 | 0.6588 + 0.2335i | 0.6258 + 0.171i | 0.7734 + 0.1898i | 0.2229 + 0.2243i |
| w1 | 00001 | 1.152 + 0.1943i | 1.1753 + 0.2181i | 1.1905 + 0.2491i | 0.7488 + 0.1887i |
| w2 | 00010 | 0.8934 + 0.7527i | 0.2219 + 0.2216i | 0.6881 + 0.5652i | 0.6173 + 1.0647i |
| w3 | 00011 | 1.0419 + 0.5284i | 1.0354 + 0.5975i | 0.9811 + 0.7188i | 1.2067 + 0.242i |
| w4 | 00100 | 0.2537 + 0.3006i | 0.1925 + 1.1798i | 0.2475 + 0.2277i | 0.2183 + 0.7125i |
| w5 | 00101 | 0.1583 + 0.7127i | 0.5389 + 1.067i | 0.2041 + 1.199i | 0.6249 + 0.5473i |
| w6 | 00110 | 0.6045 + 0.9997i | 0.2194 + 0.6207i | 0.2562 + 0.6908i | 0.2129 + 1.2121i |
| w7 | 00111 | 0.25 + 1.1412i | 0.7778 + 0.8523i | 0.6044 + 1.0554i | 1.0247 + 0.6815i |
| w8 | 01000 | 0.6588 − 0.2335i | 0.6258 − 0.171i | 0.7734 − 0.1898i | 0.2229 − 0.2243i |
| w9 | 01001 | 1.152 − 0.1943i | 1.1753 − 0.2181i | 1.1905 − 0.2491i | 0.7488 − 0.1887i |
| w10 | 01010 | 0.8934 − 0.7527i | 0.2219 − 0.2216i | 0.6881 − 0.5652i | 0.6173 − 1.0647i |
| w11 | 01011 | 1.0419 − 0.5284i | 1.0354 − 0.5975i | 0.9811 − 0.7188i | 1.2067 − 0.242i |
| w12 | 01100 | 0.2537 − 0.3006i | 0.1925 − 1.1798i | 0.2475 − 0.2277i | 0.2183 − 0.7125i |
| w13 | 01101 | 0.1583 − 0.7127i | 0.5389 − 1.067i | 0.2041 − 1.199i | 0.6249 − 0.5473i |
| w14 | 01110 | 0.6045 − 0.9997i | 0.2194 − 0.6207i | 0.2562 − 0.6908i | 0.2129 − 1.2121i |
| w15 | 01111 | 0.25 − 1.1412i | 0.7778 − 0.8523i | 0.6044 − 1.0554i | 1.0247 − 0.6815i |
| w16 | 10000 | −0.6588 + 0.2335i | −0.6258 + 0.171i | −0.7734 + 0.1898i | −0.2229 + 0.2243i |
| w17 | 10001 | −1.152 + 0.1943i | −1.1753 + 0.2181i | −1.1905 + 0.2491i | −0.7488 + 0.1887i |
| w18 | 10010 | −0.8934 + 0.7527i | −0.2219 + 0.2216i | −0.6881 + 0.5652i | −0.6173 + 1.0647i |
| w19 | 10011 | −1.0419 + 0.5284i | −1.0354 + 0.5975i | −0.9811 + 0.7188i | −1.2067 + 0.242i |
| w20 | 10100 | −0.2537 + 0.3006i | −0.1925 + 1.1798i | −0.2475 + 0.2277i | −0.2183 + 0.7125i |
| w21 | 10101 | −0.1583 + 0.7127i | −0.5389 + 1.067i | −0.2041 + 1.199i | −0.6249 + 0.5473i |
| w22 | 10110 | −0.6045 + 0.9997i | −0.2194 + 0.6207i | −0.2562 + 0.6908i | −0.2129 + 1.2121i |
| w23 | 10111 | −0.25 + 1.1412i | −0.7778 + 0.8523i | −0.6044 + 1.0554i | −1.0247 + 0.6815i |
| w24 | 11000 | −0.6588 − 0.2335i | −0.6258 − 0.171i | −0.7734 − 0.1898i | −0.2229 − 0.2243i |
| w25 | 11001 | −1.152 − 0.1943i | −1.1753 − 0.2181i | −1.1905 − 0.2491i | −0.7488 − 0.1887i |
| w26 | 11010 | −0.8934 − 0.7527i | −0.2219 − 0.2216i | −0.6881 − 0.5652i | −0.6173 − 1.0647i |
| w27 | 11011 | −1.0419 − 0.5284i | −1.0354 − 0.5975i | −0.9811 − 0.7188i | −1.2067 − 0.242i |
| w28 | 11100 | −0.2537 − 0.3006i | −0.1925 − 1.1798i | −0.2475 − 0.2277i | −0.2183 − 0.7125i |
| w29 | 11101 | −0.1583 − 0.7127i | −0.5389 − 1.067i | −0.2041 − 1.199i | −0.6249 − 0.5473i |
| w30 | 11110 | −0.6045 − 0.9997i | −0.2194 − 0.6207i | −0.2562 − 0.6908i | −0.2129 − 1.2121i |
| w31 | 11111 | −0.25 − 1.1412i | −0.7778 − 0.8523i | −0.6044 − 1.0554i | −1.0247 − 0.6815i |

If N=64 (MCS=H" . . . K") a non-uniform constellation and bit labeling is used from a group C3, wherein the constellation position vectors of the different constellations of the group C3 are defined as follows:

| w | bit label | MCS = H" (or I" or J" or K") | MCS = I" (or H" or J" or K") | MCS = J" (or H" or I" or K") | MCS = K" (or H" or I" or J") |
|---|---|---|---|---|---|
| w0 | 000000 | 1.0569 + 0.7089i | 0.8757 + 0.9247i | 0.937 + 0.8841i | 1.1723 + 0.5141i |
| w1 | 000001 | 1.0841 + 0.6678i | 1.045 + 0.728i | 1.1063 + 0.6601i | 0.1476 + 0.5364i |
| w2 | 000010 | 0.819 + 0.9734i | 0.7024 + 1.0623i | 0.7126 + 1.0729i | 0.7669 + 0.4573i |
| w3 | 000011 | 0.7389 + 0.713i | 0.6854 + 0.6748i | 0.649 + 0.7077i | 0.4449 + 0.4829i |
| w4 | 000100 | 1.2554 + 0.2142i | 1.2615 + 0.1746i | 1.2781 + 0.1604i | 1.004 + 0.174i |
| w5 | 000101 | 1.2348 + 0.3103i | 1.1831 + 0.4706i | 1.0791 + 0.3764i | 0.1371 + 0.1864i |
| w6 | 000110 | 0.7562 + 0.1721i | 0.8301 + 0.1381i | 0.7714 + 0.1301i | 0.7139 + 0.1521i |
| w7 | 000111 | 0.7451 + 0.3181i | 0.7748 + 0.3978i | 0.7335 + 0.4268i | 0.4208 + 0.1616i |
| w8 | 001000 | 0.2187 + 1.2529i | 0.1636 + 1.263i | 0.1553 + 1.2788i | 1.0216 + 0.771i |
| w9 | 001001 | 0.1608 + 0.8472i | 0.1378 + 0.8233i | 0.1327 + 0.8728i | 0.1431 + 0.9083i |
| w10 | 001010 | 0.5502 + 1.1466i | 0.446 + 1.1929i | 0.4463 + 1.2084i | 0.7237 + 0.7521i |
| w11 | 001011 | 0.4217 + 0.7827i | 0.3922 + 0.7613i | 0.3935 + 0.8156i | 0.4251 + 0.8248i |
| w12 | 001100 | 0.1479 + 0.17i | 0.1453 + 0.1451i | 0.1358 + 0.1626i | 1.2711 + 0.1575i |
| w13 | 001101 | 0.1574 + 0.4709i | 0.1295 + 0.4429i | 0.1371 + 0.5004i | 0.162 + 1.2706i |
| w14 | 001110 | 0.3867 + 0.1695i | 0.4504 + 0.1426i | 0.427 + 0.1484i | 0.7403 + 1.045i |
| w15 | 001111 | 0.3923 + 0.4332i | 0.4124 + 0.4207i | 0.406 + 0.4481i | 0.4693 + 1.1917i |
| w16 | 010000 | 1.0569 − 0.7089i | 0.8757 − 0.9247i | 0.937 − 0.8841i | 1.1723 − 0.5141i |
| w17 | 010001 | 1.0841 − 0.6678i | 1.045 − 0.728i | 1.1063 − 0.6601i | 0.1476 − 0.5364i |
| w18 | 010010 | 0.819 − 0.9734i | 0.7024 − 1.0623i | 0.7126 − 1.0729i | 0.7669 − 0.4573i |
| w19 | 010011 | 0.7389 − 0.713i | 0.6854 − 0.6748i | 0.649 − 0.7077i | 0.4449 − 0.4829i |
| w20 | 010100 | 1.2554 − 0.2142i | 1.2615 − 0.1746i | 1.2781 − 0.1604i | 1.004 − 0.174i |
| w21 | 010101 | 1.2348 − 0.3103i | 1.1831 − 0.4706i | 1.0791 − 0.3764i | 0.1371 − 0.1864i |
| w22 | 010110 | 0.7562 − 0.1721i | 0.8301 − 0.1381i | 0.7714 − 0.1301i | 0.7139 − 0.1521i |
| w23 | 010111 | 0.7451 − 0.3181i | 0.7748 − 0.3978i | 0.7335 − 0.4268i | 0.4208 − 0.1616i |
| w24 | 011000 | 0.2187 − 1.2529i | 0.1636 − 1.263i | 0.1553 − 1.2788i | 1.0216 − 0.771i |
| w25 | 011001 | 0.1608 − 0.8472i | 0.1378 − 0.8233i | 0.1327 − 0.8728i | 0.1431 − 0.9083i |
| w26 | 011010 | 0.5502 − 1.1466i | 0.446 − 1.1929i | 0.4463 − 1.2084i | 0.7237 − 0.7521i |
| w27 | 011011 | 0.4217 − 0.7827i | 0.3922 − 0.7613i | 0.3935 − 0.8156i | 0.4251 − 0.8248i |
| w28 | 011100 | 0.1479 − 0.17i | 0.1453 − 0.1451i | 0.1358 − 0.1626i | 1.2711 − 0.1575i |
| w29 | 011101 | 0.1574 − 0.4709i | 0.1295 − 0.4429i | 0.1371 − 0.5004i | 0.162 − 1.2706i |
| w30 | 011110 | 0.3867 − 0.1695i | 0.4504 − 0.1426i | 0.427 − 0.1484i | 0.7403 − 1.045i |
| w31 | 011111 | 0.3923 − 0.4332i | 0.4124 − 0.4207i | 0.406 − 0.4481i | 0.4693 − 1.1917i |
| w32 | 100000 | −1.0569 + 0.7089i | −0.8757 + 0.9247i | −0.937 + 0.8841i | −1.1723 + 0.5141i |
| w33 | 100001 | −1.0841 + 0.6678i | −1.045 + 0.728i | −1.1063 + 0.6601i | −0.1476 + 0.5364i |
| w34 | 100010 | −0.819 + 0.9734i | −0.7024 + 1.0623i | −0.7126 + 1.0729i | −0.7669 + 0.4573i |

-continued

| w | bit label | MCS = H" (or I" or J" or K") | MCS = I" (or H" or J" or K") | MCS = J" (or H" or I" or K") | MCS = K" (or H" or I" or J") |
|---|---|---|---|---|---|
| w35 | 100011 | −0.7389 + 0.713i | −0.6854 + 0.6748i | −0.649 + 0.7077i | −0.4449 + 0.4829i |
| w36 | 100100 | −1.2554 + 0.2142i | −1.2615 + 0.1746i | −1.2781 + 0.1604i | −1.004 + 0.174i |
| w37 | 100101 | −1.2348 + 0.3103i | −1.1831 + 0.4706i | −1.0791 + 0.3764i | −0.1371 + 0.1864i |
| w38 | 100110 | −0.7562 + 0.1721i | −0.8301 + 0.1381i | −0.7714 + 0.1301i | −0.7139 + 0.1521i |
| w39 | 100111 | −0.7451 + 0.3181i | −0.7748 + 0.3978i | −0.7335 + 0.4268i | −0.4208 + 0.1616i |
| w40 | 101000 | −0.2187 + 1.2529i | −0.1636 + 1.263i | −0.1553 + 1.2788i | −1.0216 + 0.771i |
| w41 | 101001 | −0.1608 + 0.8472i | −0.1378 + 0.8233i | −0.1327 + 0.8728i | −0.1431 + 0.9083i |
| w42 | 101010 | −0.5502 + 1.1466i | −0.446 + 1.1929i | −0.4463 + 1.2084i | −0.7237 + 0.7521i |
| w43 | 101011 | −0.4217 + 0.7827i | −0.3922 + 0.7613i | −0.3935 + 0.8156i | −0.4251 + 0.8248i |
| w44 | 101100 | −0.1479 + 0.17i | −0.1453 + 0.1451i | −0.1358 + 0.1626i | −1.2711 + 0.1575i |
| w45 | 101101 | −0.1574 + 0.4709i | −0.1295 + 0.4429i | −0.1371 + 0.5004i | −0.162 + 1.2706i |
| w46 | 101110 | −0.3867 + 0.1695i | −0.4504 + 0.1426i | −0.427 + 0.1484i | −0.7403 + 1.045i |
| w47 | 101111 | −0.3923 + 0.4332i | −0.4124 + 0.4207i | −0.406 + 0.4481i | −0.4693 + 1.1917i |
| w48 | 110000 | −1.0569 − 0.7089i | −0.8757 − 0.9247i | −0.937 − 0.8841i | −1.1723 − 0.5141i |
| w49 | 110001 | −1.0841 − 0.6678i | −1.045 − 0.728i | −1.1063 − 0.6601i | −0.1476 − 0.5364i |
| w50 | 110010 | −0.819 − 0.9734i | −0.7024 − 1.0623i | −0.7126 − 1.0729i | −0.7669 − 0.4573i |
| w51 | 110011 | −0.7389 − 0.713i | −0.6854 − 0.6748i | −0.649 − 0.7077i | −0.4449 − 0.4829i |
| w52 | 110100 | −1.2554 − 0.2142i | −1.2615 − 0.1746i | −1.2781 − 0.1604i | −1.004 − 0.174i |
| w53 | 110101 | −1.2348 − 0.3103i | −1.1831 − 0.4706i | −1.0791 − 0.3764i | −0.1371 − 0.1864i |
| w54 | 110110 | −0.7562 − 0.1721i | −0.8301 − 0.1381i | −0.7714 − 0.1301i | −0.7139 − 0.1521i |
| w55 | 110111 | −0.7451 − 0.3181i | −0.7748 − 0.3978i | −0.7335 − 0.4268i | −0.4208 − 0.1616i |
| w56 | 111000 | −0.2187 − 1.2529i | −0.1636 − 1.263i | −0.1553 − 1.2788i | −1.0216 − 0.771i |
| w57 | 111001 | −0.1608 − 0.8472i | −0.1378 − 0.8233i | −0.1327 − 0.8728i | −0.1431 − 0.9083i |
| w58 | 111010 | −0.5502 − 1.1466i | −0.446 − 1.1929i | −0.4463 − 1.2084i | −0.7237 − 0.7521i |
| w59 | 111011 | −0.4217 − 0.7827i | −0.3922 − 0.7613i | −0.3935 − 0.8156i | −0.4251 − 0.8248i |
| w60 | 111100 | −0.1479 − 0.17i | −0.1453 − 0.1451i | −0.1358 − 0.1626i | −1.2711 − 0.1575i |
| w61 | 111101 | −0.1574 − 0.4709i | −0.1295 − 0.4429i | −0.1371 − 0.5004i | −0.162 − 1.2706i |
| w62 | 111110 | −0.3867 − 0.1695i | −0.4504 − 0.1426i | −0.427 − 0.1484i | −0.7403 − 1.045i |
| w63 | 111111 | −0.3923 − 0.4332i | −0.4124 − 0.4207i | −0.406 − 0.4481i | −0.4693 − 1.1917i |

These NUCs have been designed with $C_{opt}(\hat{P}_t, \gamma)$=cap($W_{UC}$, $\gamma$) with minimal $\hat{P}_t$. The overall gain $G(\hat{P}_t, \gamma)$ is determined by the peak power gain only, i.e. $G(\hat{P}_t, \gamma) = \hat{P}_{UC} - \hat{P}_t$, and is therefore lower as in Table 1.

As shown above, two-dimensional NUCs are proposed including constellation points and bit labelling. The constellation points, i.e., coordinates in the complex plane, use the notation according to which a first column defines the w vector and the second column describes the bit labelling of the constellation points in the following columns (for different MCS indices), wherein i=sqrt(−1) is the imaginary unit.

It shall be noted that the same NUCs may be used for different MCS indices (e.g. the constellation points defined for MCS A might be used for MCS indices A, B and C to reduce the overall number of NUCs), in particular for different code rates R. Hence, it is indicated in the tables for the NUCs for which MCS indices (representing a code rate R and a modulation order N) or for which code rates R the respective constellations points and bit labels are used. If there are two or more MCS indices or code rates R indicated, it may be predetermined for which MCS index/code rate R the constellations points and bit labels shall be used by a particular communication system or by particular devices. Further, it shall be noted that bit positions might be inverted, i.e. the bits of any bit position of the bit labeling might be flipped, resulting in the same performance.

It shall further be noted that groups A1 and A3 of NUC tables for N=16 may be summarized as group A, that groups B1 and B3 of NUC tables for N=32 may be summarized as group B and that groups C1, C2 and C3 of NUC tables for N=64 may be summarized as group C.

Figure 7:
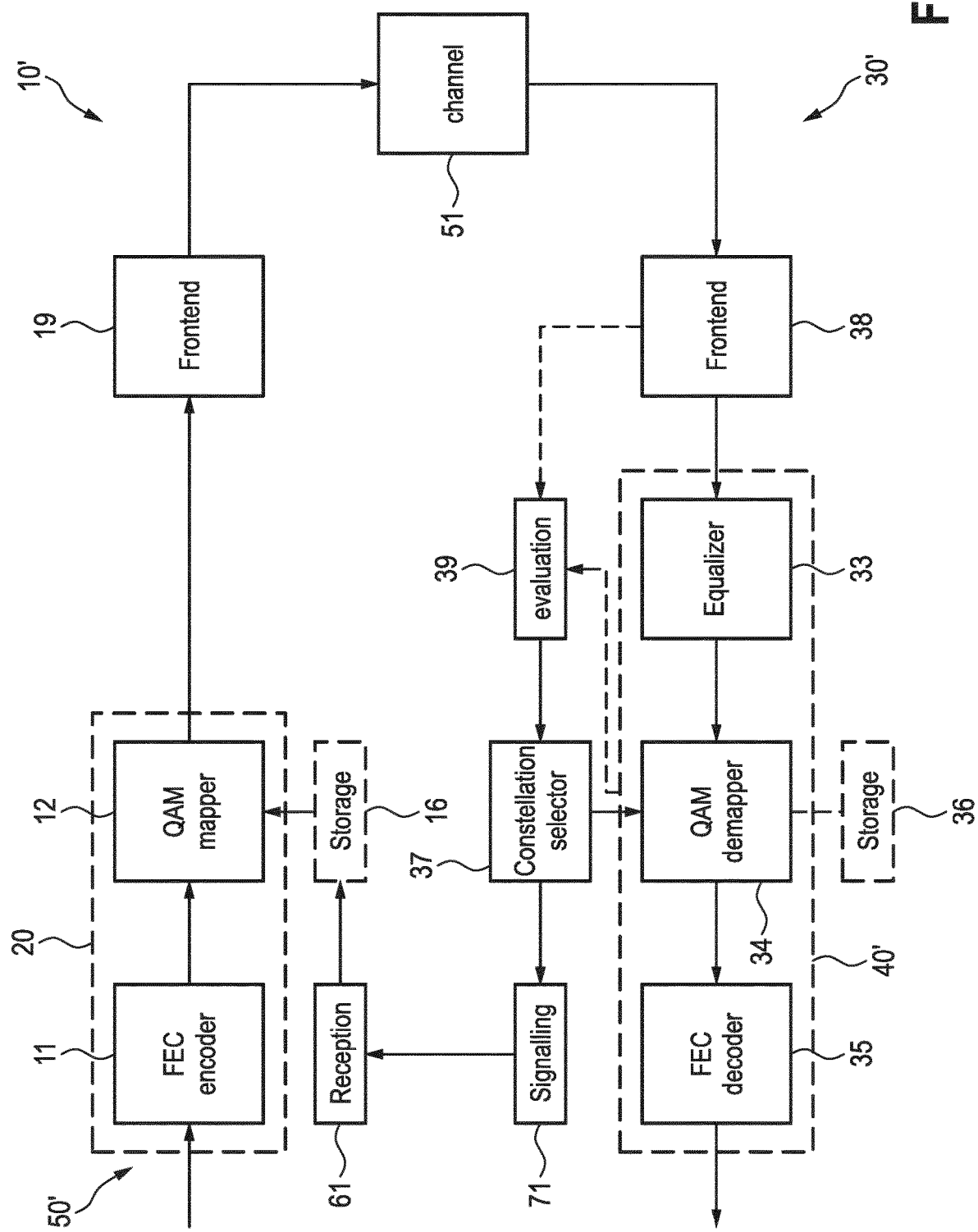
FIG. 7 shows a schematic diagram of another embodiment of a transmission apparatus and a receiving apparatus according to the present disclosure.

The optimization of NUCs taking PAPR into consideration is a new design criterion for obtaining NUCs as disclosed herein. Power amplifier non-linearity is considered as an impairment on the physical layer (PHY impairment). In real system implementations there may be further sources of such PHY impairments. FIG. 7 shows a schematic diagram of another embodiment of a transmission apparatus 10' and a receiving apparatus 30' according to the present disclosure making use of the determination of PHY impairments on the receiver side and forming part of a system 50'.

The transmission apparatus 10' is similar to the transmission apparatus 10 shown in FIG. 1, but the units 13, 14 and 15 are commonly referred to as frontend 19 in FIG. 7. Similarly, in the receiving apparatus 30' the units 31 and 32 are commonly referred to as frontend 38.

The system 50' supports a set of constellation points for one or more different PHY impairments or different levels of PHY impairments. The receiving apparatus 30' comprises an evaluation unit 39 to perform measurements, channel estimation, and/or analysis of the PHY impairments at the receiving apparatus 30'. Based on said evaluation the evaluation unit 39 determines signalling information, which indicates to the transmission apparatus 10' which constellation set should be used. For instance, the evaluation unit 39 estimates the PHY impairments and selects the constellation set which gives the best performance in terms of bit error rate (BER).

In one embodiment the subset (meaning a particular vector which defines the constellation out of a set of different constellation vectors, e.g. the constellation for MCS A in table 1) is denoted by the set of constellation vectors $W_i$ (where i is the subset index). Based on the evaluation of the PHY impairments at the receiving apparatus 30', a constellation index i may be selected by a selection unit 37 which is fed back to the transmission apparatus 10' by a receiver signalling unit 71 via some form of signalling. This signalling information may be contained in management messages which are exchanged between the receiving apparatus and the transmission apparatus. The signalling information is received by a reception signalling unit 61 of the transmission apparatus 10' and used to select the indicated constellation from the storage 16 storing the different constellation vectors. These vectors are also in the receiving apparatus 30'. Hence, based on the selected index, the QAM mapper 12 and the QAM demapper 34 are fed with the constellation vector W corresponding to the index i. Alternatively, the constellation vector W can even be transmitted directly from the receiving apparatus 30' to the transmission apparatus 10'. Basically, this signalling information can be considered as a generalization of the MCS index (where the code rate of the FEC defines the constellation vector).

In another embodiment the receiving apparatus 30' may define a constellation W which minimizes BER for the actual PHY impairment. W may then be transferred to the transmission apparatus 10' which uses this constellation for data transmission to this particular receiving apparatus 30'. In this case transmission apparatus 10' and receiving apparatus 30' require no predefined constellation set.

Generally, in an embodiment disclosed transmission apparatus comprises a coding and modulation apparatus (20 in FIGS. 1 and 30) as disclosed herein for encoding and modulating input data into constellation values, a converter (14 in FIG. 1, 19 in FIG. 7) for converting said constellation values into one or more transmission streams to be transmitted, and a transmitter (15 in FIG. 1, 19 in FIG. 7) for transmitting said one or more transmission streams.

Further, a disclosed receiving apparatus generally comprises a receiver (31 in FIG. 2, 38 in FIG. 7) for receiving one or more transmission streams, a deconverter (32 in FIG. 2, 38 in FIG. 7) for deconverting one or more transmission streams into said constellation values, and a receiver signalling unit (71 in FIG. 7) for transmitting receiver signalling information to a transmission apparatus with which said receiving apparatus seeks to communicate. Said receiver signalling information may include one or more of a) the total number N of constellation points and the code rate R of a constellation to be used, b) an indication of the constellation to be used, c) constellation points of a constellation to be used, d) channel conditions of a communications channel between the receiving apparatus and a transmission apparatus with which said receiving apparatus seeks to communicate and e) PHY impairments at the receiving apparatus.

Said receiving apparatus may further comprise a demodulation and decoding apparatus (40 in FIG. 2, 40' in FIG. 7) as disclosed herein for demodulating and decoding said constellation values into output data.

Obviously, numerous modifications and variations of the present disclosure are possible in light of the above teachings. It is therefore to be understood that within the scope of the appended claims, the disclosure may be practiced otherwise than as specifically described herein (e.g., if the NUC position vectors are rounded to a smaller number of digits).

Thus, the foregoing discussion discloses and describes merely exemplary embodiments of the present disclosure. As will be understood by those skilled in the art, the present disclosure may be embodied in other specific forms without departing from the spirit or essential characteristics thereof. Accordingly, the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Further, such a software may also be distributed in other forms, such as via the Internet or other wired or wireless telecommunication systems.

The elements of the disclosed devices, apparatus and systems may be implemented by corresponding hardware and/or software elements, for instance appropriated circuits. A circuit is a structural assemblage of electronic components including conventional circuit elements, integrated circuits including application specific integrated circuits, standard integrated circuits, application specific standard products, and field programmable gate arrays. Further a circuit includes central processing units, graphics processing units, and microprocessors which are programmed or configured according to software code. A circuit does not include pure software, although a circuit includes the above-described hardware executing software.

It follows a list of further embodiments of the disclosed subject matter:

1. A coding and modulation apparatus comprising
    an encoder configured to encode input data into cell words according to a low density parity check code, LDPC, and
    a modulator configured to modulate said cell words into constellation values of a non-uniform constellation and to assign bit combinations to constellation values of the used non-uniform constellation,
    wherein said modulator is configured to use, based on the total number N of constellation points of the constellation and the code rate R,
    i) a non-uniform constellation and bit labeling from a group A if N=16, or
    ii) a non-uniform constellation and bit labeling from a group B if N=32, or
    iii) a non-uniform constellation and bit labeling from a group C if N=64, or
    iv) a non-uniform constellation and bit labeling obtained from a constellation from anyone of groups A, B or C through rotation by an angle around the origin, through inversion of bit labels for all constellation points, through interchanging of bit positions, through mirroring on any line in the complex plane and/or through predistortion for the constellation points,
    wherein the constellation points are defined by a constellation position vector $w_0 \ldots w_{N-1}$, and wherein the constellation position vectors of the different constellations of the groups A, B or C of constellations are defined as follows:
    A) 16-QAM non-uniform constellations of group A1 or A3 as disclosed herein;
    B) 32-QAM non-uniform constellations of group B1, B2 or B3 as disclosed herein;
    C) 64-QAM non-uniform constellations of group C1 or C3 as disclosed herein.
    wherein the bit labeling indicated in groups A, B and C may alternatively be inverted for one or more bit labels.
2. A coding and modulation apparatus as defined in any one of the preceding embodiments,
    further comprising a selection unit configured to select the total number N of constellation points of the constellation and the code rate R based on channel conditions of a communications channel between a transmission apparatus including said coding and modulation apparatus and a receiving apparatus with which said transmission apparatus seeks to communicate.

3. A coding and modulation apparatus as defined in embodiment 2,
wherein said selection unit is configured to select a constellation with a higher number of N and/or a higher code rate the better the channel conditions are.

4. A coding and modulation apparatus as defined in embodiment 2 or 3,
wherein said selection unit is configured to select a constellation based on the desired signal-to-noise ratio.

5. A coding and modulation apparatus as defined in any one of the preceding embodiments,
further comprising a reception unit configured to receive receiver signalling information including one or more of a) the total number N of constellation points and the code rate R of a constellation to be used, b) an indication of the constellation to be used, c) constellation points of a constellation to be used, d) channel conditions of a communications channel between a transmission apparatus including said coding and modulation apparatus and a receiving apparatus with which said transmission apparatus seeks to communicate, and e) PHY impairments at the receiving apparatus.

6. A coding and modulation apparatus as defined in any one of the preceding embodiments,
wherein said coding and modulation apparatus is configured for use in a transmission apparatus according to IEEE 802.11.

7. A coding and modulation method comprising
encoding input data into cell words according to a low density parity check code, LDPC, and
modulating said cell words into constellation values of a non-uniform constellation and to assign bit combinations to constellation values of the used non-uniform constellation,
wherein said modulating is configured to use, based on the total number N of constellation points of the constellation and the code rate R,
i) a non-uniform constellation and bit labeling from a group A if N=16, or
ii) a non-uniform constellation and bit labeling from a group B if N=32, or
iii) a non-uniform constellation and bit labeling from a group C if N=64, or
iv) a non-uniform constellation obtained from a constellation from anyone of groups A, B or C through rotation by an angle around the origin, through inversion of bit labels for all constellation points, through interchanging of bit positions, through mirroring on any line in the complex plane and/or through predistortion for the constellation points,
wherein the constellation points are defined by a constellation position vector $w_0 \ldots w_{N-1}$, and wherein the constellation position vectors of the different constellations of the groups A, B or C of constellations are defined as follows:
A) 16-QAM non-uniform constellations of group A1 or A3 as disclosed herein;
B) 32-QAM non-uniform constellations of group B1, B2 or B3 as disclosed herein;
C) 64-QAM non-uniform constellations of group C1 or C3 as disclosed herein.
wherein the bit labeling indicated in groups A, B and C may alternatively be inverted for one or more bit labels.

8. A transmission apparatus comprising:
a coding and modulation apparatus as defined in any one of the preceding embodiments configured to encode and modulate input data into constellation values,
a converter configured to convert said constellation values into one or more transmission streams to be transmitted, and
a transmitter configured to transmit said one or more transmission streams.

9. A transmission apparatus as defined in embodiment 8,
further comprising a transmitter signalling unit configured to embed transmitter signalling information into the one or more transmission streams, said transmitter signalling information including one or more of a) the total number N of constellation points and the code rate R of a constellation used, b) an indication of the constellation used, and c) constellation points of a constellation used.

10. A transmission apparatus as defined in embodiment 9,
wherein said modulation unit is configured to select using a uniform constellation instead of one of said non-uniform constellations for modulating said cell words into constellation values, and
wherein said transmitter signalling unit is configured to embed transmitter signalling information into the one or more transmission streams, said transmitter signalling information including constellation information indicating if a non-uniform constellation or a uniform constellation has been used for modulation.

11. A transmission apparatus as defined in embodiment 9 or 10,
wherein said transmitter signalling unit is configured to embed said transmitter signalling information at the beginning of frames of a plurality of frames used for transmission of the one or more transmission streams.

12. A transmission method comprising:
a coding and modulation method as defined in embodiment 7 that encodes and modulates input data into constellation values,
converting said constellation values into one or more transmission streams to be transmitted, and
transmitting said one or more transmission streams.

13. A transmission apparatus as defined in of the embodiments 9 to 12,
wherein said transmitter signalling unit is configured to embed said transmitter signalling information at the beginning of each frame of a plurality of frames used for transmission of the one or more transmission streams.

14. A transmission apparatus as defined in one of the embodiments 9 to 13,
wherein said transmitter signalling unit is configured to embed said transmitter signalling information into a Header field.

15. A demodulation and decoding apparatus comprising:
a demodulator configured to demodulate constellation values of a non-uniform constellation into cell words and to assign bit combinations to constellation values of the used non-uniform constellation, and
a decoder configured to decode cell words into output data according to a low density parity check code, LDPC,
wherein said demodulator is configured to use, based on signalling information indicating the total number N of constellation points of the constellation and the code rate R,
i) a non-uniform constellation and bit labeling from a group A if N=16, or
ii) a non-uniform constellation and bit labeling from a group B if N=32, or iii) a non-uniform constellation and bit labeling from a group C if N=64, or
iv) a non-uniform constellation obtained from a constellation from anyone of groups A, B or C through rotation by an angle around the origin, through inversion of bit labels for all constellation points, through interchanging of bit positions, through mirroring on any line in the complex plane and/or through predistortion for the constellation points, wherein the constellation points are defined by a constellation position vector $w_0 \ldots w_{N-1}$, and wherein the constellation position vectors of the different constellations of the groups A, B or C of constellations are defined as follows:

A) 16-QAM non-uniform constellations of group A1 or A3 as disclosed herein;
B) 32-QAM non-uniform constellations of group B1, B2 or B3 as disclosed herein;
C) 64-QAM non-uniform constellations of group C1 or C3 as disclosed herein.

wherein the bit labeling indicated in groups A, B and C may alternatively be inverted for one or more bit labels.

16. A demodulation and decoding method comprising:
demodulating constellation values of a non-uniform constellation into cell words and assigning bit combinations to constellation values of the used non-uniform constellation, and
decoding cell words into output data according to a low density parity check code, LDPC,
wherein said demodulating is configured to use, based on signalling information indicating the total number N of constellation points of the constellation and the code rate R,
i) a non-uniform constellation and bit labeling from a group A if N=16, or
ii) a non-uniform constellation and bit labeling from a group B if N=32, or
iii) a non-uniform constellation and bit labeling from a group C if N=64, or
iv) a non-uniform constellation obtained from a constellation from anyone of groups A, B or C through rotation by an angle around the origin, through inversion of bit labels for all constellation points, through interchanging of bit positions, through mirroring on any line in the complex plane and/or through predistortion for the constellation points, wherein the constellation points are defined by a constellation position vector $w_0 \ldots w_{N-1}$, and wherein the constellation position vectors of the different constellations of the groups A, B or C of constellations are defined as follows:

A) 16-QAM non-uniform constellations of group A1 or A3 as disclosed herein;
B) 32-QAM non-uniform constellations of group B1, B2 or B3 as disclosed herein;
C) 64-QAM non-uniform constellations of group C1 or C3 as disclosed herein.

wherein the bit labeling indicated in groups A, B and C may alternatively be inverted for one or more bit labels.

17. Receiving apparatus comprising:
a receiver configured to receive one or more transmission streams,
a deconverter configured to deconvert one or more transmission streams into said constellation values, and
a receiver signalling unit configured to transmit receiver signalling information to a transmission apparatus with which said receiving apparatus seeks to communicate, said receiver signalling information including one or more of a) the total number N of constellation points and the code rate R of a constellation to be used, b) an indication of the constellation to be used, c) constellation points of a constellation to be used, d) channel conditions of a communications channel between the receiving apparatus and a transmission apparatus with which said receiving apparatus seeks to communicate and e) PHY impairments at the receiving apparatus.

18. Receiving apparatus as defined in embodiment 17,
further comprising an evaluation unit configured to analyse channel conditions of a communications channel between the receiving apparatus and a transmission apparatus with which said receiving apparatus seeks to communicate and/or PHY impairments at the receiving apparatus and to determine said signalling information based on the analysed channel conditions and/or PHY impairments.

19. Receiving apparatus as defined in embodiment 17 or 18,
further comprising a demodulation and decoding apparatus as defined in embodiment 15 configured to demodulate and decode said constellation values into output data.

20. A receiving apparatus as defined in one of embodiments 17 to 19,
wherein said receiver signalling unit is configured to transmit said receiver signalling information by use of management messages.

21. Receiving method comprising:
receiving one or more transmission streams,
deconverting one or more transmission streams into said constellation values, and
transmitting receiver signalling information to a transmission apparatus with which the receiving method seeks to communicate, said receiver signalling information including one or more of a) the total number N of constellation points and the code rate R of a constellation to be used, b) an indication of the constellation to be used, c) constellation points of a constellation to be used, and d) channel conditions of a communications channel between the receiving apparatus and a transmission apparatus with which said receiving method seeks to communicate.

22. A non-transitory computer-readable recording medium that stores therein a computer program product, which, when executed by a processor, causes the method according to embodiment 7 or 16 to be performed.

23. A communications system comprising one or more transmission apparatus as defined in embodiment 1 and one or more receiving apparatus as defined in embodiment 17.

24. A computer program comprising program code means for causing a computer to perform the steps of said method according to embodiment 7 or 16 when said computer program is carried out on a computer.

The invention claimed is:
1. A receiving apparatus comprising:
a receiver configured to receive one or more transmission streams,
a deconverter configured to deconvert the one or more transmission streams into said constellation values, and
a communication interface configured to transmit receiver signalling information to a transmission apparatus with which said receiving apparatus seeks to communicate, said receiver signalling information including one or more of a) a total number N of constellation points and a code rate R of a constellation to be used, b) an indication of the constellation to be used, c) constellation points of a constellation to he used, d) channel conditions of a communications channel between the receiving apparatus and a transmission apparatus with which the receiving apparatus seeks to communicate and e) PHY impairments at the receiving apparatus.

2. The receiving apparatus as claimed in claim 1, further comprising processing circuitry configured to analyze channel conditions of a communications channel between the receiving apparatus and a transmission apparatus with which the receiving apparatus seeks to communicate and/or PHY impairments at the receiving apparatus and to determine said signalling information based on the analyzed channel conditions and/or PHY impairments.

3. A receiving method comprising:
receiving one or more transmission streams,
deconverting the one or more transmission streams into said constellation values, and
transmitting receiver signalling information to a transmission apparatus with which the receiving method seeks to communicate, said receiver signalling information including one or more of a) a total number N of constellation points and the code rate R of a constellation to be used, b) an indication of the constellation to be used, c) constellation points of a constellation to be used, and d) channel conditions of a communications channel between a receiving apparatus and a transmission apparatus with which said receiving method seeks to communicate.

4. A coding and modulation apparatus comprising:
an encoder configured to encode input data into cell words according to a low density parity check code, LDPC, and
a modulator configured to modulate said cell words into constellation values of a non-uniform constellation and to assign bit combinations to constellation values of the used non-uniform constellation,
wherein said modulator is configured to use, based on a total number N of constellation points of a constellation and code rate R,
i) a non-uniform constellation and bit labeling from a group A if N=16, or
ii) a non-uniform constellation and bit labeling from a group B if N=32, or
iii) a non-uniform constellation and bit labeling from a group C if N=64, or
iv) a non-uniform constellation obtained from a constellation from anyone of groups A, B or C through rotation by an angle around an origin, through inversion of bit labels for all constellation points, through interchanging of bit positions, through mirroring on any line in a complex plane and/or through predistortion for the constellation points,
wherein the constellation points are defined by a constellation position vector $w_0 \ldots w_{N-1}$, and wherein the constellation position vectors of the different constellations of the groups A, B or C of constellations are defined as follows:

A) 16-QAM uniform constellations of group A1:

| w | bit label | R = ½ (or ⅝ or ¾) | R = ⅝ (or ½ or ¾) | R = ¾ (or ½ or ⅝) |
| --- | --- | --- | --- | --- |
| w0 | 0000 | 0.9236 + 0.3833i | 0.2885 + 0.2883i | 0.2989 + 0.3143i |
| w1 | 0001 | 0.9236 + 0.3833i | 1.085 + 0.3172i | 1.0877 + 0.2957i |
| w2 | 0010 | 0.3833 + 0.9236i | 0.3168 + 1.0851i | 0.2979 + 1.0872i |
| w3 | 0011 | 0.3833 + 0.9236i | 0.7973 + 0.8014i | 0.8007 + 0.7934i |
| w4 | 0100 | 0.9236 − 0.3833i | 0.2885 − 0.2883i | 0.2989 − 0.3143i |
| w5 | 0101 | 0.9236 − 0.3833i | 1.085 − 0.3172i | 1.0877 − 0.2957i |
| w6 | 0110 | 0.3833 − 0.9236i | 0.3168 − 1.0851i | 0.2979 − 1.0872i |
| w7 | 0111 | 0.3833 − 0.9236i | 0.7973 − 0.8014i | 0.8007 − 0.7934i |
| w8 | 1000 | −0.9236 + 0.3833i | −0.2885 + 0.2883i | −0.2989 + 0.3143i |
| w9 | 1001 | −0.9236 + 0.3833i | −1.085 + 0.3172i | −1.0877 + 0.2957i |
| w10 | 1010 | −0.3833 + 0.9236i | −0.3168 + 1.0851i | −0.2979 + 1.0872i |
| w11 | 1011 | −0.3833 + 0.9236i | −0.7973 + 0.8014i | −0.8007 + 0.7934i |
| w12 | 1100 | −0.9236 − 0.3833i | −0.2885 − 0.2883i | −0.2989 − 0.3143i |
| w13 | 1101 | −0.9236 − 0.3833i | −1.085 − 0.3172i | −1.0877 − 0.2957i |
| w14 | 1110 | −0.3833 − 0.9236i | −0.3168 − 1.0851i | −0.2979 − 1.0872i |
| w15 | 1111 | −0.3833 − 0.9236i | −0.7973 − 0.8014i | −0.8007 − 0.7934i | or group A3:

| w | bit label | R = ½ (or ⅝ or ¾) | R = ⅝ (or ½ or ¾) | R = ¾ (or ½ or ⅝) |
| --- | --- | --- | --- | --- |
| w0 | 0000 | 0.8429 + 0.2537i | 0.4349 + 0.1989i | 0.9963 + 0.2925i |
| w1 | 0001 | 0.9864 + 0.7471i | 1.1973 + 0.4119i | 0.9109 + 0.9109i |
| w2 | 0010 | 0.2155 + 0.3413i | 0.2573 + 0.7061i | 0.3034 + 0.3034i |
| w3 | 0011 | 0.3772 + 1.1785i | 0.6759 + 1.0707i | 0.2925 + 0.9963i |
| w4 | 0100 | 0.8429 − 0.2537i | 0.4349 − 0.1989i | 0.9963 − 0.2925i |
| w5 | 0101 | 0.9864 − 0.7471i | 1.1973 − 0.4119i | 0.9109 − 0.9109i |
| w6 | 0110 | 0.2155 − 0.3413i | 0.2573 − 0.7061i | 0.3034 − 0.3034i |
| w7 | 0111 | 0.3772 − 1.1785i | 0.6759 − 1.0707i | 0.2925 − 0.9963i |
| w8 | 1000 | −0.8429 + 0.2537i | −0.4349 + 0.1989i | −0.9963 + 0.2925i |
| w9 | 1001 | −0.9864 + 0.7471i | −1.1973 + 0.4119i | −0.9109 + 0.9109i |
| w10 | 1010 | −0.2155 + 0.3413i | −0.2573 + 0.7061i | −0.3034 + 0.3034i |
| w11 | 1011 | −0.3772 + 1.1785i | −0.6759 + 1.0707i | −0.2925 + 0.9963i |
| w12 | 1100 | −0.8429 − 0.2537i | −0.4349 − 0.1989i | −0.9963 − 0.2925i |
| w13 | 1101 | −0.9864 − 0.7471i | −1.1973 − 0.4119i | −0.9109 − 0.9109i |
| w14 | 1110 | −0.2155 − 0.3413i | −0.2573 − 0.7061i | −0.3034 − 0.3034i |
| w15 | 1111 | −0.3772 − 1.1785i | −0.6759 − 1.0707i | −0.2925 − 0.9963i |

B) 32-QAM non-uniform constellations of group B1:

| w | bit label | R = ½ (or ⅝ or ¾ or 13/16) | R = ⅝ (or ½ or ¾ or 13/16) | R = ¾ (or ½ or ⅝ or 13/16) | R = 13/16 (or ½ or ⅝ or ¾) |
|---|---|---|---|---|---|
| w0  | 00000 | 1.0304 + 0.444i   | 1.0971 + 0.18i    | 1.1563 + 0.2084i  | 1.146 + 0.1942i   |
| w1  | 00001 | 1.1103 + 0.1616i  | 0.4907 + 0.2208i  | 0.6667 + 0.2352i  | 1.0305 + 0.5389i  |
| w2  | 00010 | 0.8946 + 0.6772i  | 1.02 + 0.4423i    | 1.039 + 0.5484i   | 0.6951 + 0.233i   |
| w3  | 00011 | 0.4346 + 0.2063i  | 0.8817 + 0.6772i  | 0.8367 + 0.8248i  | 0.8267 + 0.8177i  |
| w4  | 00100 | 0.4202 + 1.0404i  | 0.18 + 1.0971i    | 0.2126 + 0.6666i  | 0.2293 + 0.7058i  |
| w5  | 00101 | 0.1661 + 1.1091i  | 0.2211 + 0.4958i  | 0.2344 + 0.2319i  | 0.2086 + 1.144i   |
| w6  | 00110 | 0.6736 + 0.8966i  | 0.4431 + 1.0196i  | 0.1868 + 1.16i    | 0.2677 + 0.2828i  |
| w7  | 00111 | 0.1981 + 0.4223i  | 0.6778 + 0.8812i  | 0.5438 + 1.0415i  | 0.5548 + 1.0221i  |
| w8  | 01000 | 1.0304 − 0.444i   | 1.0971 − 0.18i    | 1.1563 − 0.2084i  | 1.146 − 0.1942i   |
| w9  | 01001 | 1.1103 − 0.1616i  | 0.4907 − 0.2208i  | 0.6667 − 0.2352i  | 1.0305 − 0.5389i  |
| w10 | 01010 | 0.8946 − 0.6772i  | 1.02 − 0.4423i    | 1.039 − 0.5484i   | 0.6951 − 0.233i   |
| w11 | 01011 | 0.4346 − 0.2063i  | 0.8817 − 0.6772i  | 0.8367 − 0.8248i  | 0.8267 − 0.8177i  |
| w12 | 01100 | 0.4202 − 1.0404i  | 0.18 − 1.0971i    | 0.2126 − 0.6666i  | 0.2293 − 0.7058i  |
| w13 | 01101 | 0.1661 − 1.1091i  | 0.2211 − 0.4958i  | 0.2344 − 0.2319i  | 0.2086 − 1.144i   |
| w14 | 01110 | 0.6736 − 0.8966i  | 0.4431 − 1.0196i  | 0.1868 − 1.16i    | 0.2677 − 0.2828i  |
| w15 | 01111 | 0.1981 − 0.4223i  | 0.6778 − 0.8812i  | 0.5438 − 1.0415i  | 0.5548 − 1.0221i  |
| w16 | 10000 | −1.0304 + 0.444i  | −1.0971 + 0.18i   | −1.1563 + 0.2084i | −1.146 + 0.1942i  |
| w17 | 10001 | −1.1103 + 0.1616i | −0.4907 + 0.2208i | −0.6667 + 0.2352i | −1.0305 + 0.5389i |
| w18 | 10010 | −0.8946 + 0.6772i | −1.02 + 0.4423i   | −1.039 + 0.5484i  | −0.6951 + 0.233i  |
| w19 | 10011 | −0.4346 + 0.2063i | −0.8817 + 0.6772i | −0.8367 + 0.8248i | −0.8267 + 0.8177i |
| w20 | 10100 | −0.4202 + 1.0404i | −0.18 + 1.0971i   | −0.2126 + 0.6666i | −0.2293 + 0.7058i |
| w21 | 10101 | −0.1661 + 1.1091i | −0.2211 + 0.4958i | −0.2344 + 0.2319i | −0.2086 + 1.144i  |
| w22 | 10110 | −0.6736 + 0.8966i | −0.4431 + 1.0196i | −0.1868 + 1.16i   | −0.2677 + 0.2828i |
| w23 | 10111 | −0.1981 + 0.4223i | −0.6778 + 0.8812i | −0.5438 + 1.04151 | −0.5548 + 1.0221i |
| w24 | 11000 | −1.0304 − 0.444i  | −1.0971 − 0.18i   | −1.1563 − 0.2084i | −1.146 − 0.1942i  |
| w25 | 11001 | −1.1103 − 0.1616i | −0.4907 − 0.2208i | −0.6667 − 0.2352i | −1.0305 − 0.5389i |
| w26 | 11010 | −0.8946 − 0.6772i | −1.02 − 0.4423i   | −1.039 − 0.5484i  | −0.6951 − 0.233i  |
| w27 | 11011 | −0.4346 − 0.2063i | −0.8817 − 0.6772i | −0.8367 − 0.8248i | −0.8267 − 0.8177i |
| w28 | 11100 | −0.4202 − 1.0404i | −0.18 − 1.0971i   | −0.2126 − 0.6666i | −0.2293 − 0.7058i |
| w29 | 11101 | −0.1661 − 1.1091i | −0.2211 − 0.4958i | −0.2344 − 0.2319i | −0.2086 − 1.144i  |
| w30 | 11110 | −0.6736 − 0.8966i | −0.4431 − 1.0196i | −0.1868 − 1.16i   | −0.2677 − 0.2828i |
| w31 | 11111 | −0.1981 − 0.4223i | −0.6778 − 0.8812i | −0.5438 − 1.0415i | −0.5548 − 1.0221i | or group B3:

| w | bit label | R = ½ (or ⅝ or ¾ or 13/16) | R = ⅝ (or ½ or ¾ or 13/16) | R = ¾ (or ½ or ⅝ or 13/16) | R = 13/16 (or ½ or ⅝ or ¾) |
|---|---|---|---|---|---|
| w0  | 00000 | 0.6588 + 0.2335i  | 0.6258 + 0.171i   | 0.7734 + 0.1898i  | 0.2229 + 0.2243i  |
| w1  | 00001 | 1.152 + 0.1943i   | 1.1753 + 0.2181i  | 1.1905 + 0.2491i  | 0.7488 + 0.1887i  |
| w2  | 00010 | 0.8934 + 0.7527i  | 0.2219 + 0.2216i  | 0.6881 + 0.5652i  | 0.6173 + 1.0647i  |
| w3  | 00011 | 1.0419 + 0.5284i  | 1.0354 + 0.5975i  | 0.9811 + 0.7188i  | 1.2067 + 0.242i   |
| w4  | 00100 | 0.2537 + 0.3006i  | 0.1925 + 1.1798i  | 0.2475 + 0.2277i  | 0.2183 + 0.7125i  |
| w5  | 00101 | 0.1583 + 0.7127i  | 0.5389 + 1.067i   | 0.2041 + 1.199i   | 0.6249 + 0.5473i  |
| w6  | 00110 | 0.6045 + 0.9997i  | 0.2194 + 0.6207i  | 0.2562 + 0.6908i  | 0.2129 + 1.2121i  |
| w7  | 00111 | 0.25 + 1.1412i    | 0.7778 + 0.8523i  | 0.6044 + 1.0554i  | 1.0247 + 0.6815i  |
| w8  | 01000 | 0.6588 − 0.2335i  | 0.6258 − 0.171i   | 0.7734 − 0.1898i  | 0.2229 − 0.2243i  |
| w9  | 01001 | 1.152 − 0.1943i   | 1.1753 − 0.2181i  | 1.1905 − 0.2491i  | 0.7488 − 0.1887i  |
| w10 | 01010 | 0.8934 − 0.7527i  | 0.2219 − 0.2216i  | 0.6881 − 0.5652i  | 0.6173 − 1.0647i  |
| w11 | 01011 | 1.0419 − 0.5284i  | 1.0354 − 0.5975i  | 0.9811 − 0.7188i  | 1.2067 − 0.242i   |
| w12 | 01100 | 0.2537 − 0.3006i  | 0.1925 − 1.1798i  | 0.2475 − 0.2277i  | 0.2183 − 0.7125i  |
| w13 | 01101 | 0.1583 − 0.7127i  | 0.5389 − 1.067i   | 0.2041 − 1.199i   | 0.6249 − 0.5473i  |
| w14 | 01110 | 0.6045 − 0.9997i  | 0.2194 − 0.6207i  | 0.2562 − 0.6908i  | 0.2129 − 1.2121i  |
| w15 | 01111 | 0.25 − 1.1412i    | 0.7778 − 0.8523i  | 0.6044 − 1.0554i  | 1.0247 − 0.6815i  |
| w16 | 10000 | −0.6588 + 0.2335i | −0.6258 + 0.171i  | −0.7734 + 0.1898i | −0.2229 + 0.2243i |
| w17 | 10001 | −1.152 + 0.1943i  | −1.1753 + 0.2181i | −1.1905 + 0.2491i | −0.7488 + 0.1887i |
| w18 | 10010 | −0.8934 + 0.7527i | −0.2219 + 0.2216i | −0.6881 + 0.5652i | −0.6173 + 1.0647i |
| w19 | 10011 | −1.0419 + 0.5284i | −1.0354 + 0.5975i | −0.9811 + 0.7188i | −1.2067 + 0.242i  |
| w20 | 10100 | −0.2537 + 0.3006i | −0.1925 + 1.1798i | −0.2475 + 0.2277i | −0.2183 + 0.7125i |
| w21 | 10101 | −0.1583 + 0.7127i | −0.5389 + 1.067i  | −0.2041 + 1.199i  | −0.6249 + 0.5473i |
| w22 | 10110 | −0.6045 + 0.9997i | −0.2194 + 0.6207i | −0.2562 + 0.6908i | −0.2129 + 1.2121i |
| w23 | 10111 | −0.25 + 1.1412i   | −0.7778 + 0.8523i | −0.6044 + 1.0554i | −1.0247 + 0.6815i |
| w24 | 11000 | −0.6588 − 0.2335i | −0.6258 − 0.171i  | −0.7734 − 0.1898i | −0.2229 − 0.2243i |
| w25 | 11001 | −1.152 − 0.1943i  | −1.1753 − 0.2181i | −1.1905 − 0.2491i | −0.7488 − 0.1887i |
| w26 | 11010 | −0.8934 − 0.7527i | −0.2219 − 0.2216i | −0.6881 − 0.5652i | −0.6173 − 1.0647i |
| w27 | 11011 | −1.0419 − 0.5284i | −1.0354 − 0.5975i | −0.9811 − 0.7188i | −1.2067 − 0.242i  |
| w28 | 11100 | −0.2537 − 0.3006i | −0.1925 − 1.1798i | −0.2475 − 0.2277i | −0.2183 − 0.7125i |
| w29 | 11101 | −0.1583 − 0.7127i | −0.5389 − 1.067i  | −0.2041 − 1.199i  | −0.6249 − 0.5473i |
| w30 | 11110 | −0.6045 − 0.9997i | −0.2194 − 0.6207i | −0.2562 − 0.6908i | −0.2129 − 1.2121i |
| w31 | 11111 | −0.25 − 1.1412i   | −0.7778 − 0.8523i | −0.6044 − 1.0554i | −1.0247 − 0.6815i |

C) 64-QAM non-uniform constellations of group C1:

| w | bit label | R = ½ (or ⅝ or ¾ or 13/16) | R = ⅝ (or ½ or ¾ or 13/16) | R = ¾ (or ½ or ⅝ or 13/16) | R = 13/16 (or ½ or ⅝ or ¾) |
|---|---|---|---|---|---|
| w0 | 000000 | 0.2287 + 0.5143i | 0.1978 + 0.198i | 1.0605 + 0.5953i | 0.873 + 0.8874i |
| w1 | 000001 | 0.2116 + 1.0918i | 0.1916 + 1.1985i | 0.1796 + 0.4943i | 1.0395 + 0.6848i |
| w2 | 000010 | 0.2828 + 0.5535i | 0.4969 + 0.1984i | 0.7562 + 0.4956i | 0.6726 + 1.0474i |
| w3 | 000011 | 0.214 + 1.0888i | 0.4757 + 1.1166i | 0.4954 + 0.5126i | 0.6771 + 0.6619i |
| w4 | 000100 | 0.6913 + 0.8711i | 0.1862 + 0.5083i | 1.1574 + 0.3735i | 1.2358 + 0.1495i |
| w5 | 000101 | 0.461 + 1.012i | 0.171 + 0.8428i | 0.1887 + 0.1816i | 1.1669 + 0.4334i |
| w6 | 000110 | 0.6929 + 0.8697i | 0.479 + 0.5257i | 0.8128 + 0.199i | 0.8923 + 0.1387i |
| w7 | 000111 | 0.4624 + 0.114i | 0.4272 + 0.8201i | 0.5012 + 0.183i | 0.8067 + 0.404i |
| w8 | 001000 | 0.3191 + 0.2057i | 1.1727 + 0.3125i | 0.9378 + 0.7743i | 0.1465 + 1.2361i |
| w9 | 001001 | 1.0956 + 0.1876i | 1.2022 + 0.1671i | 0.1694 + 0.8236i | 0.1412 + 0.8899i |
| w10 | 001010 | 0.5092 + 0.2494i | 0.7798 + 0.2035i | 0.7911 + 0.9225i | 0.4261 + 1.1695i |
| w11 | 001011 | 1.093 + 0.2006i | 0.6806 + 1.0049i | 0.4477 + 0.779i | 0.413 + 0.7955i |
| w12 | 001100 | 0.8876 + 0.67i | 1.0766 + 0.5604i | 1.2059 + 0.157i | 0.1641 + 0.164i |
| w13 | 001101 | 1.0256 + 0.4299i | 0.9914 + 0.7003i | 0.1661 + 1.2048i | 0.1442 + 0.5197i |
| w14 | 001110 | 0.8899 + 0.6666i | 0.7425 + 0.5068i | 0.6275 + 1.0418i | 0.5218 + 0.1427i |
| w15 | 001111 | 1.0227 + 0.4368i | 0.8329 + 0.8826i | 0.4264 + 1.1388i | 0.4324 + 0.4339i |
| w16 | 010000 | 0.2287 − 0.5143i | 0.1978 − 0.198i | 1.0605 − 0.5953i | 0.873 − 0.8874i |
| w17 | 010001 | 0.2116 − 1.0918i | 0.1916 − 1.1985i | 0.1796 − 0.4943i | 1.0395 − 0.6848i |
| w18 | 010010 | 0.2828 − 0.5535i | 0.4969 − 0.1984i | 0.7562 − 0.4956i | 0.6726 − 1.0474i |
| w19 | 010011 | 0.214 − 1.0888i | 0.4757 − 1.1166i | 0.4954 − 0.5126i | 0.6771 − 0.6619i |
| w20 | 010100 | 0.6913 − 0.8711i | 0.1862 − 0.5083i | 1.1574 − 0.3735i | 1.2358 − 0.1495i |
| w21 | 010101 | 0.461 − 1.012i | 0.171 − 0.8428i | 0.1887 − 0.1816i | 1.1669 − 0.4334i |
| w22 | 010110 | 0.6929 − 0.8697i | 0.479 − 0.5257i | 0.8128 − 0.199i | 0.8923 − 0.1387i |
| w23 | 010111 | 0.4624 − 1.0114i | 0.4272 − 0.8201i | 0.5012 − 0.183i | 0.8067 − 0.404i |
| w24 | 011000 | 0.3191 − 0.2057i | 1.1727 − 0.3125i | 0.9378 − 0.7743i | 0.1465 − 1.2361i |
| w25 | 011001 | 1.0956 − 0.1876i | 1.2022 − 0.1671i | 0.1694 − 0.8236i | 0.1412 − 0.8899i |
| w26 | 011010 | 0.5092 − 0.2494i | 0.7798 − 0.2035i | 0.7911 − 0.9225i | 0.4261 − 1.1695i |
| w27 | 011011 | 1.093 − 0.2006i | 0.6806 − 1.0049i | 0.4477 − 0.779i | 0.413 − 0.7955i |
| w28 | 011100 | 0.8876 − 0.67i | 1.0766 − 0.5604i | 1.2059 − 0.157i | 0.1641 − 0.164i |
| w29 | 011101 | 1.0256 − 0.4299i | 0.9914 − 0.7003i | 0.1661 − 1.2048i | 0.1442 − 0.5197i |
| w30 | 011110 | 0.8899 − 0.6666i | 0.7425 − 0.5068i | 0.6275 − 1.0418i | 0.5218 − 0.1427i |
| w31 | 011111 | 1.0227 − 0.4368i | 0.8329 − 0.8826i | 0.4264 − 1.1388i | 0.4324 − 0.4339i |
| w32 | 100000 | −0.2287 + 0.5143i | −0.1978 + 0.198i | −1.0605 + 0.5953i | −0.873 + 0.8874i |
| w33 | 100001 | −0.2116 + 1.0918i | −0.1916 + 1.1985i | −0.1796 + 0.4943i | −1.0395 + 0.6848i |
| w34 | 100010 | −0.2828 + 0.5535i | −0.4969 + 0.1984i | −0.7562 + 0.4956i | −0.6726 + 1.0474i |
| w35 | 100011 | −0.214 + 1.0888i | −0.4757 + 1.1166i | −0.4954 + 0.5126i | −0.6771 + 0.6619i |
| w36 | 100100 | −0.6913 + 0.8711i | −0.1862 + 0.5083i | −1.1574 + 0.3735i | −1.2358 + 0.1495i |
| w37 | 100101 | −0.461 + 1.012i | −0.171 + 0.8428i | −0.1887 + 0.1816i | −1.1669 + 0.4334i |
| w38 | 100110 | −0.6929 + 0.8697i | −0.479 + 0.5257i | −0.8128 + 0.199i | −0.8923 + 0.1387i |
| w39 | 100111 | −0.4624 + 1.0114i | −0.4272 + 0.8201i | −0.5012 + 0.183i | −0.8067 + 0.404i |
| w40 | 101000 | −0.3191 + 0.2057i | −1.1727 + 0.3125i | −0.9378 + 0.7743i | −0.1465 + 1.2361i |
| w41 | 101001 | −1.0956 + 0.1876i | −1.2022 + 0.1671i | −0.1694 + 0.8236i | −0.1412 + 0.8899i |
| w42 | 101010 | −0.5092 + 0.2494i | −0.7798 + 0.2035i | −0.7911 + 0.9225i | −0.4261 + 1.1695i |
| w43 | 101011 | −1.093 + 0.2006i | −0.6806 + 1.0049i | −0.4477 + 0.779i | −0.413 + 0.7955i |
| w44 | 101100 | −0.8876 + 0.67i | −1.0766 + 0.5604i | −1.2059 + 0.157i | −0.1641 + 0.164i |
| w45 | 101101 | −1.0256 + 0.4299i | −0.9914 + 0.7003i | −0.1661 + 1.2048i | −0.1442 + 0.5197i |
| w46 | 101110 | −0.8899 + 0.6666i | −0.7425 + 0.5068i | −0.6275 + 1.0418i | −0.5218 + 0.1427i |
| w47 | 101111 | −1.0227 + 0.4368i | −0.8329 + 0.8826i | −0.4264 + 1.1388i | −0.4324 + 0.4339i |
| w48 | 110000 | −0.2287 − 0.5143i | −0.1978 − 0.198i | −1.0605 − 0.5953i | −0.873 − 0.8874i |
| w49 | 110001 | −0.2116 − 1.0918i | −0.1916 − 1.1985i | −0.1796 − 0.4943i | −1.0395 − 0.6848i |
| w50 | 110010 | −0.2828 − 0.5535i | −0.4969 − 0.1984i | −0.7562 − 0.4956i | −0.6726 − 1.0474i |
| w51 | 110011 | −0.214 − 1.0888i | −0.4757 − 1.1166i | −0.4954 − 0.5126i | −0.6771 − 0.6619i |
| w52 | 110100 | −0.6913 − 0.8711i | −0.1862 − 0.5083i | −1.1574 − 0.3735i | −1.2358 − 0.1495i |
| w53 | 110101 | −0.461 − 1.012i | −0.171 − 0.8428i | −0.1887 − 0.1816i | −1.1669 − 0.4334i |
| w54 | 110110 | −0.6929 − 0.8697i | −0.479 − 0.5257i | −0.8128 − 0.199i | −0.8923 − 0.1387i |
| w55 | 110111 | −0.4624 − 1.0114i | −0.4272 − 0.8201i | −0.5012 − 0.183i | −0.8067 − 0.404i |
| w56 | 111000 | −0.3191 − 0.2057i | −1.1727 − 0.3125i | −0.9378 − 0.7743i | −0.1465 − 1.2361i |
| w57 | 111001 | −1.0956 − 0.1876i | −1.2022 − 0.1671i | −0.1694 − 0.8236i | −0.1412 − 0.8899i |
| w58 | 111010 | −0.5092 − 0.2494i | −0.7798 − 0.2035i | −0.7911 − 0.9225i | −0.4261 − 1.1695i |
| w59 | 111011 | −1.093 − 0.2006i | −0.6806 − 1.0049i | −0.4477 − 0.779i | −0.413 − 0.7955i |
| w60 | 111100 | −0.8876 − 0.67i | −1.0766 − 0.5604i | −1.2059 − 0.157i | −0.1641 − 0.164i |
| w61 | 111101 | −1.0256 − 0.4299i | −0.9914 − 0.7003i | −0.1661 − 1.2048i | −0.1442 − 0.5197i |
| w62 | 111110 | −0.8899 − 0.6666i | −0.7425 − 0.5068i | −0.6275 − 1.0418i | −0.5218 − 0.1427i |
| w63 | 111111 | −1.0227 − 0.4368i | −0.8329 − 0.8826i | −0.4264 − 1.1388i | −0.4324 − 0.4339i | or group C2:

| w | bit label | R = ½ (or ⅝ or ¾ or 13/16) | R = ⅝ (or ½ or ¾ or 13/16) | R = ¾ (or ½ or ⅝ or 13/16) | R = 13/16 (or ½ or ⅝ or ¾) |
|---|---|---|---|---|---|
| w0 | 000000 | 0.1298 + 0.2084i | 0.3328 + 0.1665i | 0.9596 + 0.4358i | 1.022 + 0.4536i |
| w1 | 000001 | 0.1883 + 1.3627i | 0.5435 + 1.2609i | 0.1328 + 0.5092i | 0.1374 + 0.4738i |
| w2 | 000010 | 0.217 + 0.4464i | 0.1217 + 0.1744i | 0.6561 + 0.4543i | 0.6985 + 0.4499i |

-continued

| w | bit label | R = ½ (or ⅝ or ¾ or ¹³⁄₁₆) | R = ⅝ (or ½ or ¾ or ¹³⁄₁₆) | R = ¾ (or ½ or ⅝ or ¹³⁄₁₆) | R = ¹³⁄₁₆ (or ½ or ⅝ or ¾) |
|---|---|---|---|---|---|
| w3  | 000011 | 0.1269 + 0.764i    | 0.1904 + 1.3623i    | 0.3855 + 0.4909i    | 0.413 + 0.4891i   |
| w4  | 000100 | 0.7986 + 1.12i     | 0.3528 + 0.4894i    | 0.9773 + 0.1483i    | 1.0021 + 0.1484i  |
| w5  | 000101 | 0.4538 + 1.1748i   | 0.4073 + 0.8478i    | 0.1256 + 0.1724i    | 0.1339 + 0.1575i  |
| w6  | 000110 | 0.4822 + 0.6563i   | 0.1288 + 0.5124i    | 0.6457 + 0.1512i    | 0.6852 + 0.1497i  |
| w7  | 000111 | 0.3148 + 0.8326i   | 0.1465 + 0.8935i    | 0.3703 + 0.1633i    | 0.4014 + 0.1605i  |
| w8  | 001000 | 0.2328 + 0.1185i   | 0.5998 + 0.1505i    | 1.2035 + 0.6663i    | 1.147 + 0.7594i   |
| w9  | 001001 | 1.3637 + 0.1808i   | 0.8781 + 1.0589i    | 0.1492 + 0.8611i    | 0.1479 + 0.8049i  |
| w10 | 001010 | 0.4762 + 0.2045i   | 0.9411 + 0.1492i    | 0.7306 + 0.7613i    | 0.7571 + 0.7595i  |
| w11 | 001011 | 0.827 + 0.1328i    | 1.3582 + 0.218i     | 0.4377 + 0.8492i    | 0.4503 + 0.8438i  |
| w12 | 001100 | 1.0652 + 0.8657i   | 0.6339 + 0.4545i    | 1.3574 + 0.2231i    | 1.3596 + 0.2095i  |
| w13 | 001101 | 1.262 + 0.5438i    | 0.7138 + 0.7632i    | 0.1858 + 1.2632i    | 0.1659 + 1.1736i  |
| w14 | 001110 | 0.6765 + 0.4967i   | 0.9294 + 0.4189i    | 0.9009 + 1.0396i    | 0.841 + 1.0885i   |
| w15 | 001111 | 0.8548 + 0.3591i   | 1.1995 + 0.6617i    | 0.5564 + 1.2461i    | 0.5064 + 1.2593i  |
| w16 | 010000 | 0.1298 − 0.2084i   | 0.3328 − 0.1665i    | 0.9596 − 0.4358i    | 1.022 − 0.4536i   |
| w17 | 010001 | 0.1883 − 1.3627i   | 0.5435 − 1.2609i    | 0.1328 − 0.5092i    | 0.1374 − 0.4738i  |
| w18 | 010010 | 0.217 − 0.4464i    | 0.1217 − 0.1744i    | 0.6561 − 0.4543i    | 0.6985 − 0.4499i  |
| w19 | 010011 | 0.1269 − 0.764i    | 0.1904 − 1.3623i    | 0.3855 − 0.4909i    | 0.413 − 0.4891i   |
| w20 | 010100 | 0.7986 − 1.12i     | 0.3528 − 0.4894i    | 0.9773 − 0.1483i    | 1.0021 − 0.1484i  |
| w21 | 010101 | 0.4538 − 1.1748i   | 0.4073 − 0.8478i    | 0.1256 − 0.1724i    | 0.1339 − 0.1575i  |
| w22 | 010110 | 0.4822 − 0.6563i   | 0.1288 − 0.5124i    | 0.6457 − 0.1512i    | 0.6852 − 0.1497i  |
| w23 | 010111 | 0.3148 − 0.8326i   | 0.1465 − 0.8935i    | 0.3703 − 0.1633i    | 0.4014 − 0.1605i  |
| w24 | 011000 | 0.2328 − 0.1185i   | 0.5998 − 0.1505i    | 1.2035 − 0.6663i    | 1.147 − 0.7594i   |
| w25 | 011001 | 1.3637 − 0.1808i   | 0.8781 − 1.0589i    | 0.1492 − 0.8611i    | 0.1479 − 0.8049i  |
| w26 | 011010 | 0.4762 − 0.2045i   | 0.9411 − 0.1492i    | 0.7306 − 0.7613i    | 0.7571 − 0.7595i  |
| w27 | 011011 | 0.827 − 0.1328i    | 1.3582 − 0.218i     | 0.4377 − 0.8492i    | 0.4503 − 0.8438i  |
| w28 | 011100 | 1.0652 − 0.8657i   | 0.6339 − 0.4545i    | 1.3574 − 0.2231i    | 1.3596 − 0.2095i  |
| w29 | 011101 | 1.262 − 0.5438i    | 0.7138 − 0.7632i    | 0.1858 − 1.2632i    | 0.1659 − 1.1736i  |
| w30 | 011110 | 0.6765 − 0.4967i   | 0.9294 − 0.4189i    | 0.9009 − 1.0396i    | 0.841 − 1.0885i   |
| w31 | 011111 | 0.8548 − 0.3591i   | 1.1995 − 0.6617i    | 0.5564 − 1.2461i    | 0.5064 − 1.2593i  |
| w32 | 100000 | −0.1298 + 0.2084i  | −0.3328 + 0.1665i   | −0.9596 + 0.4358i   | −1.022 + 0.4536i  |
| w33 | 100001 | −0.1883 + 1.3627i  | −0.5435 + 1.2609i   | −0.1328 + 0.5092i   | −0.1374 + 0.4738i |
| w34 | 100010 | −0.217 + 0.4464i   | −0.1217 + 0.1744i   | −0.6561 + 0.4543i   | −0.6985 + 0.4499i |
| w35 | 100011 | −0.1269 + 0.764i   | −0.1904 + 1.3623i   | −0.3855 + 0.4909i   | −0.413 + 0.4891i  |
| w36 | 100100 | −0.7986 + 1.12i    | −0.3528 + 0.4894i   | −0.9773 + 0.1483i   | −1.0021 + 0.1484i |
| w37 | 100101 | −0.4538 + 1.1748i  | −0.4073 + 0.8478i   | −0.1256 + 0.1724i   | −0.1339 + 0.1575i |
| w38 | 100110 | −0.4822 + 0.6563i  | −0.1288 + 0.5124i   | −0.6457 + 0.1512i   | −0.6852 + 0.1497i |
| w39 | 100111 | −0.3148 + 0.8326i  | −0.1465 + 0.8935i   | −0.3703 + 0.1633i   | −0.4014 + 0.1605i |
| w40 | 101000 | −0.2328 + 0.1185i  | −0.5998 + 0.1505i   | −1.2035 + 0.6663i   | −1.147 + 0.7594i  |
| w41 | 101001 | −1.3637 + 0.1808i  | −0.8781 + 1.0589i   | −0.1492 + 0.8611i   | −0.1479 + 0.8049i |
| w42 | 101010 | −0.4762 + 0.2045i  | −0.9411 + 0.1492i   | −0.7306 + 0.7613i   | −0.7571 + 0.7595i |
| w43 | 101011 | −0.827 + 0.1328i   | −1.3582 + 0.218i    | −0.4377 + 0.8492i   | −0.4503 + 0.8438i |
| w44 | 101100 | −1.0652 + 0.8657i  | −0.6339 + 0.4545i   | −1.3574 + 0.2231i   | −1.3596 + 0.2095i |
| w45 | 101101 | −1.262 + 0.5438i   | −0.7138 + 0.7632i   | −0.1858 + 1.2632i   | −0.1659 + 1.1736i |
| w46 | 101110 | −0.6765 + 0.4967i  | −0.9294 + 0.4189i   | −0.9009 + 1.0396i   | −0.841 + 1.0885i  |
| w47 | 101111 | −0.8548 + 0.3591i  | −1.1995 + 0.6617i   | −0.5564 + 1.2461i   | −0.5064 + 1.2593i |
| w48 | 110000 | −0.1298 − 0.2084i  | −0.3328 − 0.1665i   | −0.9596 − 0.4358i   | −1.022 − 0.4536i  |
| w49 | 110001 | −0.1883 − 1.3627i  | −0.5435 − 1.2609i   | −0.1328 − 0.5092i   | −0.1374 − 0.4738i |
| w50 | 110010 | −0.217 − 0.4464i   | −0.1217 − 0.1744i   | −0.6561 − 0.4543i   | −0.6985 − 0.4499i |
| w51 | 110011 | −0.1269 − 0.764i   | −0.1904 − 1.3623i   | −0.3855 − 0.4909i   | −0.413 − 0.4891i  |
| w52 | 110100 | −0.7986 − 1.12i    | −0.3528 − 0.4894i   | −0.9773 − 0.1483i   | −1.0021 − 0.1484i |
| w53 | 110101 | −0.4538 − 1.1748i  | −0.4073 − 0.8478i   | −0.1256 − 0.1724i   | −0.1339 − 0.1575i |
| w54 | 110110 | −0.4822 − 0.6563i  | −0.1288 − 0.5124i   | −0.6457 − 0.1512i   | −0.6852 − 0.1497i |
| w55 | 110111 | −0.3148 − 0.8326i  | −0.1465 − 0.8935i   | −0.3703 − 0.1633i   | −0.4014 − 0.1605i |
| w56 | 111000 | −0.2328 − 0.1185i  | −0.5998 − 0.1505i   | −1.2035 − 0.6663i   | −1.147 − 0.7594i  |
| w57 | 111001 | −1.3637 − 0.1808i  | −0.8781 − 1.0589i   | −0.1492 − 0.8611i   | −0.1479 − 0.8049i |
| w58 | 111010 | −0.4762 − 0.2045i  | −0.9411 − 0.1492i   | −0.7306 − 0.7613i   | −0.7571 − 0.7595i |
| w59 | 111011 | −0.827 − 0.1328i   | −1.3582 − 0.218i    | −0.4377 − 0.8492i   | −0.4503 − 0.8438i |
| w60 | 111100 | −1.0652 − 0.8657i  | −0.6339 − 0.4545i   | −1.3574 − 0.2231i   | −1.3596 − 0.2095i |
| w61 | 111101 | −1.262 − 0.5438i   | −0.7138 − 0.7632i   | −0.1858 − 1.2632i   | −0.1659 − 1.1736i |
| w62 | 111110 | −0.6765 − 0.4967i  | −0.9294 − 0.4189i   | −0.9009 − 1.0396i   | −0.841 − 1.0885i  |
| w63 | 111111 | −0.8548 − 0.3591i  | −1.1995 − 0.6617i   | −0.5564 − 1.2461i   | −0.5064 − 1.2593i | or group C3:

| w | bit label | R = ½ (or ⅝ or ¾ or ¹³⁄₁₆) | R = ⅝ (or ½ or ¾ or ¹³⁄₁₆) | R = ¾ (or ½ or ⅝ or ¹³⁄₁₆) | R = ¹³⁄₁₆ (or ½ or ⅝ or ¾) |
|---|---|---|---|---|---|
| w0 | 000000 | 1.0569 + 0.7089i | 0.8757 + 0.9247i | 0.937 + 0.8841i  | 1.1723 + 0.5141i |
| w1 | 000001 | 1.0841 + 0.6678i | 1.045 + 0.728i   | 1.1063 + 0.6601i | 0.1476 + 0.5364i |
| w2 | 000010 | 0.819 + 0.9734i  | 0.7024 + 1.0623i | 0.7126 + 1.0729i | 0.7669 + 0.4573i |
| w3 | 000011 | 0.7389 + 0.713i  | 0.6854 + 0.6748i | 0.649 + 0.7077i  | 0.4449 + 0.4829i |
| w4 | 000100 | 1.2554 + 0.2142i | 1.2615 + 0.1746i | 1.2781 + 0.1604i | 1.004 + 0.174i   |
| w5 | 000101 | 1.2348 + 0.3103i | 1.1831 + 0.4706i | 1.0791 + 0.3764i | 0.1371 + 0.1864i |

-continued

| w | bit label | R = ½ (or ⅝ or ¾ or ¹³⁄₁₆) | R = ⅝ (or ½ or ¾ or ¹³⁄₁₆) | R = ¾ (or ½ or ⅝ or ¹³⁄₁₆) | R = ¹³⁄₁₆ (or ½ or ⅝ or ¾) |
|---|---|---|---|---|---|
| w6 | 000110 | 0.7562 + 0.1721i | 0.8301 + 0.1381i | 0.7714 + 0.1301i | 0.7139 + 0.1521i |
| w7 | 000111 | 0.7451 + 0.3181i | 0.7748 + 0.3978i | 0.7335 + 0.4268i | 0.4208 + 0.1616i |
| w8 | 001000 | 0.2187 + 1.2529i | 0.1636 + 1.263i | 0.1553 + 1.2788i | 1.0216 + 0.771i |
| w9 | 001001 | 0.1608 + 0.8472i | 0.1378 + 0.8233i | 0.1327 + 0.8728i | 0.1431 + 0.9083i |
| w10 | 001010 | 0.5502 + 1.1466i | 0.446 + 1.1929i | 0.4463 + 1.2084i | 0.7237 + 0.7521i |
| w11 | 001011 | 0.4217 + 0.7827i | 0.3922 + 0.7613i | 0.3935 + 0.8156i | 0.4251 + 0.8248i |
| w12 | 001100 | 0.1479 + 0.17i | 0.1453 + 0.1451i | 0.1358 + 0.1626i | 1.2711 + 0.1575i |
| w13 | 001101 | 0.1574 + 0.4709i | 0.1295 + 0.4429i | 0.1371 + 0.5004i | 0.162 + 1.2706i |
| w14 | 001110 | 0.3867 + 0.1695i | 0.4504 + 0.1426i | 0.427 + 0.1484i | 0.7403 + 1.045i |
| w15 | 001111 | 0.3923 + 0.4332i | 0.4124 + 0.4207i | 0.406 + 0.4481i | 0.4693 + 1.1917i |
| w16 | 010000 | 1.0569 − 0.7089i | 0.8757 − 0.9247i | 0.937 − 0.8841i | 1.1723 − 0.5141i |
| w17 | 010001 | 1.0841 − 0.6678i | 1.045 − 0.728i | 1.1063 − 0.6601i | 0.1476 − 0.5364i |
| w18 | 010010 | 0.819 − 0.9734i | 0.7024 − 1.0623i | 0.7126 − 1.0729i | 0.7669 − 0.4573i |
| w19 | 010011 | 0.7389 − 0.713i | 0.6854 − 0.6748i | 0.649 − 0.7077i | 0.4449 − 0.4829i |
| w20 | 010100 | 1.2554 − 0.2142i | 1.2615 − 0.1746i | 1.2781 − 0.1604i | 1.004 − 0.174i |
| w21 | 010101 | 1.2348 − 0.3103i | 1.1831 − 0.4706i | 1.0791 − 0.3764i | 0.1371 − 0.1864i |
| w22 | 010110 | 0.7562 − 0.1721i | 0.8301 − 0.1381i | 0.7714 − 0.1301i | 0.7139 − 0.1521i |
| w23 | 010111 | 0.7451 − 0.3181i | 0.7748 − 0.3978i | 0.7335 − 0.4268i | 0.4208 − 0.1616i |
| w24 | 011000 | 0.2187 − 1.2529i | 0.1636 − 1.263i | 0.1553 − 1.2788i | 1.0216 − 0.771i |
| w25 | 011001 | 0.1608 − 0.8472i | 0.1378 − 0.8233i | 0.1327 − 0.8728i | 0.1431 − 0.9083i |
| w26 | 011010 | 0.5502 − 1.1466i | 0.446 − 1.1929i | 0.4463 − 1.2084i | 0.7237 − 0.7521i |
| w27 | 011011 | 0.4217 − 0.7827i | 0.3922 − 0.7613i | 0.3935 − 0.8156i | 0.4251 − 0.8248i |
| w28 | 011100 | 0.1479 − 0.17i | 0.1453 − 0.1451i | 0.1358 − 0.1626i | 1.2711 − 0.1575i |
| w29 | 011101 | 0.1574 − 0.4709i | 0.1295 − 0.4429i | 0.1371 − 0.5004i | 0.162 − 1.2706i |
| w30 | 011110 | 0.3867 − 0.1695i | 0.4504 − 0.1426i | 0.427 − 0.1484i | 0.7403 − 1.045i |
| w31 | 011111 | 0.3923 − 0.4332i | 0.4124 − 0.4207i | 0.406 − 0.4481i | 0.4693 − 1.1917i |
| w32 | 100000 | −1.0569 + 0.7089i | −0.8757 + 0.9247i | −0.937 + 0.8841i | −1.1723 + 0.5141i |
| w33 | 100001 | −1.0841 + 0.6678i | −1.045 + 0.728i | −1.1063 + 0.6601i | −0.1476 + 0.5364i |
| w34 | 100010 | −0.819 + 0.9734i | −0.7024 + 1.0623i | −0.7126 + 1.0729i | −0.7669 + 0.4573i |
| w35 | 100011 | −0.7389 + 0.713i | −0.6854 + 0.6748i | −0.649 + 0.7077i | −0.4449 + 0.4829i |
| w36 | 100100 | −1.2554 + 0.2142i | −1.2615 + 0.1746i | −1.2781 + 0.1604i | −1.004 + 0.174i |
| w37 | 100101 | −1.2348 + 0.3103i | −1.1831 + 0.4706i | −1.0791 + 0.3764i | −0.1371 + 0.1864i |
| w38 | 100110 | −0.7562 + 0.1721i | −0.8301 + 0.1381i | −0.7714 + 0.1301i | −0.7139 + 0.1521i |
| w39 | 100111 | −0.7451 + 0.3181i | −0.7748 + 0.3978i | −0.7335 + 0.4268i | −0.4208 + 0.1616i |
| w40 | 101000 | −0.2187 + 1.2529i | −0.1636 + 1.263i | −0.1553 + 1.2788i | −1.0216 + 0.771i |
| w41 | 101001 | −0.1608 + 0.8472i | −0.1378 + 0.8233i | −0.1327 + 0.8728i | −0.1431 + 0.9083i |
| w42 | 101010 | −0.5502 + 1.1466i | −0.446 + 1.1929i | −0.4463 + 1.2084i | −0.7237 + 0.7521i |
| w43 | 101011 | −0.4217 + 0.7827i | −0.3922 + 0.7613i | −0.3935 + 0.8156i | −0.4251 + 0.8248i |
| w44 | 101100 | −0.1479 + 0.17i | −0.1453 + 0.1451i | −0.1358 + 0.1626i | −1.2711 + 0.1575i |
| w45 | 101101 | −0.1574 + 0.4709i | −0.1295 + 0.4429i | −0.1371 + 0.5004i | −0.162 + 1.2706i |
| w46 | 101110 | −0.3867 + 0.1695i | −0.4504 + 0.1426i | −0.427 + 0.1484i | −0.7403 + 1.045i |
| w47 | 101111 | −0.3923 + 0.4332i | −0.4124 + 0.4207i | −0.406 + 0.4481i | −0.4693 + 1.1917i |
| w48 | 110000 | −1.0569 − 0.7089i | −0.8757 − 0.9247i | −0.937 − 0.8841i | −1.1723 − 0.5141i |
| w49 | 110001 | −1.0841 − 0.6678i | −1.045 − 0.728i | −1.1063 − 0.6601i | −0.1476 − 0.5364i |
| w50 | 110010 | −0.819 − 0.9734i | −0.7024 − 1.0623i | −0.7126 − 1.0729i | −0.7669 − 0.4573i |
| w51 | 110011 | −0.7389 − 0.713i | −0.6854 − 0.6748i | −0.649 − 0.7077i | −0.4449 − 0.4829i |
| w52 | 110100 | −1.2554 − 0.2142i | −1.2615 − 0.1746i | −1.2781 − 0.1604i | −1.004 − 0.174i |
| w53 | 110101 | −1.2348 − 0.3103i | −1.1831 − 0.4706i | −1.0791 − 0.3764i | −0.1371 − 0.1864i |
| w54 | 110110 | −0.7562 − 0.1721i | −0.8301 − 0.1381i | −0.7714 − 0.1301i | −0.7139 − 0.1521i |
| w55 | 110111 | −0.7451 − 0.3181i | −0.7748 − 0.3978i | −0.7335 − 0.4268i | −0.4208 − 0.1616i |
| w56 | 111000 | −0.2187 − 1.2529i | −0.1636 − 1.263i | −0.1553 − 1.2788i | −1.0216 − 0.771i |
| w57 | 111001 | −0.1608 − 0.8472i | −0.1378 − 0.8233i | −0.1327 − 0.8728i | −0.1431 − 0.9083i |
| w58 | 111010 | −0.5502 − 1.1466i | −0.446 − 1.1929i | −0.4463 − 1.2084i | −0.7237 − 0.7521i |
| w59 | 111011 | −0.4217 − 0.7827i | −0.3922 − 0.7613i | −0.3935 − 0.8156i | −0.4251 − 0.8248i |
| w60 | 111100 | −0.1479 − 0.17i | −0.1453 − 0.1451i | −0.1358 − 0.1626i | −1.2711 − 0.1575i |
| w61 | 111101 | −0.1574 − 0.4709i | −0.1295 − 0.4429i | −0.1371 − 0.5004i | −0.162 − 1.2706i |
| w62 | 111110 | −0.3867 − 0.1695i | −0.4504 − 0.1426i | −0.427 − 0.1484i | −0.7403 − 1.045i |
| w63 | 111111 | −0.3923 − 0.4332i | −0.4124 − 0.4207i | −0.406 − 0.4481i | −0.4693 − 1.1917i | wherein the bit labeling indicated in groups A, B and C may alternatively be inverted for one or more bit labels.

5. The coding and modulation apparatus as claimed in claim 4,
further comprising processing circuitry configured to select the total number N of constellation points of the constellation and the code rate R based on channel conditions of a communications channel between a transmission apparatus including said coding and modulation apparatus and a receiving apparatus with which said transmission apparatus seeks to communicate.

6. The coding and modulation apparatus as claimed in claim 5,
wherein said processing circuitry is configured to select a constellation based on the desired signal-to-noise ratio.

7. The coding and modulation apparatus as claimed in claim 4,
further comprising a receiver configured to receive receiver signalling information including one or more of a) the total number N of constellation points and the code rate R of a constellation to be used, b) an indication of the constellation to be used, c) constellation points of a constellation to be used, d) channel conditions of a communications channel between a transmission apparatus including said coding and modulation apparatus and a receiving apparatus with which said transmission apparatus seeks to communicate, and e) PHY impairments at the receiving apparatus.

8. The coding and modulation apparatus as claimed in claim 4,
wherein said coding and modulation apparatus is configured for use in a transmission apparatus according to IEEE 802.11.

9. A coding and modulation method comprising:
encoding input data into cell words according to a low density parity check code, LDPC, and
modulating said cell words into constellation values of a non--uniform constellation and to assign bit combinations to constellation values of the used non-uniform constellation,
wherein said modulating is configured to use, based on total number N of constellation points of a constellation and code rate R, i) a non-uniform constellation and bit labeling from a group A if N=16, or
ii) a non-uniform constellation and bit labeling from a group B if N=32, or
iii) a non-uniform constellation and bit labeling from a group C if N=64, or
iv) a non-uniform constellation obtained from a constellation from anyone of groups A, B or C through rotation by an angle around an origin, through inversion of bit labels for all constellation points, through interchanging of bit positions, through mirroring on any line in a complex plane and/or through predistortion for the constellation points,
wherein the constellation points are defined by a constellation position vector $w_0 \ldots w_{N-1}$, and wherein the constellation position vectors of the different constellations of the groups A, B or C of constellations are defined as follows:

A) 16-QAM non-uniform constellations of group A1:

| w | bit label | R = ½ (or ⅝ or ¾) | R = ⅝ (or ½ or ¾) | R = ¾ (or ½ or ⅝) |
|---|---|---|---|---|
| w0 | 0000 | 0.9236 + 0.3833i | 0.2885 + 0.2883i | 0.2989 + 0.3143i |
| w1 | 0001 | 0.9236 + 0.3833i | 1.085 + 0.3172i | 1.0877 + 0.2957i |
| w2 | 0010 | 0.3833 + 0.9236i | 0.3168 + 1.0851i | 0.2979 + 1.0872i |
| w3 | 0011 | 0.3833 + 0.9236i | 0.7973 + 0.8014i | 0.8007 + 0.7934i |
| w4 | 0100 | 0.9236 − 0.3833i | 0.2885 − 0.2883i | 0.2989 − 0.3143i |
| w5 | 0101 | 0.9236 − 0.3833i | 1.085 − 0.3172i | 1.0877 − 0.2957i |
| w6 | 0110 | 0.3833 − 0.9236i | 0.3168 − 1.0851i | 0.2979 − 1.0872i |
| w7 | 0111 | 0.3833 − 0.9236i | 0.7973 − 0.8014i | 0.8007 − 0.7934i |
| w8 | 1000 | −0.9236 + 0.3833i | −0.2885 + 0.2883i | −0.2989 + 0.3143i |
| w9 | 1001 | −0.9236 + 0.3833i | −1.085 + 0.3172i | −1.0877 + 0.2957i |
| w10 | 1010 | −0.3833 + 0.9236i | −0.3168 + 1.0851i | −0.2979 + 1.0872i |
| w11 | 1011 | −0.3833 + 0.9236i | −0.7973 + 0.8014i | −0.8007 + 0.7934i |
| w12 | 1100 | −0.9236 − 0.3833i | −0.2885 − 0.2883i | −0.2989 − 0.3143i |
| w13 | 1101 | −0.9236 − 0.3833i | −1.085 − 0.3172i | −1.0877 − 0.2957i |
| w14 | 1110 | −0.3833 − 0.9236i | −0.3168 − 1.0851i | −0.2979 − 1.0872i |
| w15 | 1111 | −0.3833 − 0.9236i | −0.7973 − 0.8014i | −0.8007 − 0.7934i | or group A3:

| w | bit label | R = ½ (or ⅝ or ¾) | R = ⅝ (or ½ or ¾) | R = ¾ (or ½ or ⅝) |
|---|---|---|---|---|
| w0 | 0000 | 0.8429 + 0.2537i | 0.4349 + 0.1989i | 0.9963 + 0.2925i |
| w1 | 0001 | 0.9864 + 0.7471i | 1.1973 + 0.4119i | 0.9109 + 0.9109i |
| w2 | 0010 | 0.2155 + 0.3413i | 0.2573 + 0.7061i | 0.3034 + 0.3034i |
| w3 | 0011 | 0.3772 + 1.1785i | 0.6759 + 1.0707i | 0.2925 + 0.9963i |
| w4 | 0100 | 0.8429 − 0.2537i | 0.4349 − 0.1989i | 0.9963 − 0.2925i |
| w5 | 0101 | 0.9864 − 0.7471i | 1.1973 − 0.4119i | 0.9109 − 0.9109i |
| w6 | 0110 | 0.2155 − 0.3413i | 0.2573 − 0.7061i | 0.3034 − 0.3034i |
| w7 | 0111 | 0.3772 − 1.1785i | 0.6759 − 1.0707i | 0.2925 − 0.9963i |
| w8 | 1000 | −0.8429 + 0.2537i | −0.4349 + 0.1989i | −0.9963 + 0.2925i |
| w9 | 1001 | −0.9864 + 0.7471i | −1.1973 + 0.4119i | −0.9109 + 0.9109i |
| w10 | 1010 | −0.2155 + 0.3413i | −0.2573 + 0.7061i | −0.3034 + 0.3034i |
| w11 | 1011 | −0.3772 + 1.1785i | −0.6759 + 1.0707i | −0.2925 + 0.9963i |
| w12 | 1100 | −0.8429 − 0.2537i | −0.4349 − 0.1989i | −0.9963 − 0.2925i |
| w13 | 1101 | −0.9864 − 0.7471i | −1.1973 − 0.4119i | −0.9109 − 0.9109i |
| w14 | 1110 | −0.2155 − 0.3413i | −0.2573 − 0.7061i | −0.3034 − 0.3034i |
| w15 | 1111 | −0.3772 − 1.1785i | −0.6759 − 1.0707i | −0.2925 − 0.9963i |

B) 32-QAM non-uniform constellations of group B1:

| w | bit label | R = ½ (or ⅝ or ¾ or ¹³⁄₁₆) | R = ⅝ (or ½ or ¾ or ¹³⁄₁₆) | R = ¾ (or ½ or ⅝ or ¹³⁄₁₆) | R = ¹³⁄₁₆ (or ½ or ⅝ or ¾) |
|---|---|---|---|---|---|
| w0 | 00000 | 1.0304 + 0.444i | 1.0971 + 0.18i | 1.1563 + 0.2084i | 1.146 + 0.1942i |
| w1 | 00001 | 1.1103 + 0.1616i | 0.4907 + 0.2208i | 0.6667 + 0.2352i | 1.0305 + 0.5389i |
| w2 | 00010 | 0.8946 + 0.6772i | 1.02 + 0.4423i | 1.039 + 0.5484i | 0.6951 + 0.233i |
| w3 | 00011 | 0.4346 + 0.2063i | 0.8817 + 0.6772i | 0.8367 + 0.8248i | 0.8267 + 0.8177i |
| w4 | 00100 | 0.4202 + 1.0404i | 0.18 + 1.0971i | 0.2126 + 0.6666i | 0.2293 + 0.7058i |

-continued

| w | bit label | R = ½ (or ⅝ or ¾ or ¹³/₁₆) | R = ⅝ (or ½ or ¾ or ¹³/₁₆) | R = ¾ (or ½ or ⅝ or ¹³/₁₆) | R = ¹³/₁₆ (or ½ or ⅝ or ¾) |
|---|---|---|---|---|---|
| w5  | 00101 | 0.1661 + 1.1091i | 0.2211 + 0.4958i | 0.2344 + 0.2319i | 0.2086 + 1.144i |
| w6  | 00110 | 0.6736 + 0.8966i | 0.4431 + 1.0196i | 0.1868 + 1.16i   | 0.2677 + 0.2828i |
| w7  | 00111 | 0.1981 + 0.4223i | 0.6778 + 0.8812i | 0.5438 + 1.0415i | 0.5548 + 1.0221i |
| w8  | 01000 | 1.0304 − 0.444i  | 1.0971 − 0.18i   | 1.1563 − 0.2084i | 1.146 − 0.1942i |
| w9  | 01001 | 1.1103 − 0.1616i | 0.4907 − 0.2208i | 0.6667 − 0.2352i | 1.0305 − 0.5389i |
| w10 | 01010 | 0.8946 − 0.6772i | 1.02 − 0.4423i   | 1.039 − 0.5484i  | 0.6951 − 0.233i |
| w11 | 01011 | 0.4346 − 0.2063i | 0.8817 − 0.6772i | 0.8367 − 0.8248i | 0.8267 − 0.8177i |
| w12 | 01100 | 0.4202 − 1.0404i | 0.18 − 1.0971i   | 0.2126 − 0.6666i | 0.2293 − 0.7058i |
| w13 | 01101 | 0.1661 − 1.1091i | 0.2211 − 0.4958i | 0.2344 − 0.2319i | 0.2086 − 1.144i |
| w14 | 01110 | 0.6736 − 0.8966i | 0.4431 − 1.0196i | 0.1868 − 1.16i   | 0.2677 − 0.2828i |
| w15 | 01111 | 0.1981 − 0.4223i | 0.6778 − 0.8812i | 0.5438 − 1.0415i | 0.5548 − 1.0221i |
| w16 | 10000 | −1.0304 + 0.444i  | −1.0971 + 0.18i   | −1.1563 + 0.2084i | −1.146 + 0.1942i |
| w17 | 10001 | −1.1103 + 0.1616i | −0.4907 + 0.2208i | −0.6667 + 0.2352i | −1.0305 + 0.5389i |
| w18 | 10010 | −0.8946 + 0.6772i | −1.02 + 0.4423i   | −1.039 + 0.5484i  | −0.6951 + 0.233i |
| w19 | 10011 | −0.4346 + 0.2063i | −0.8817 + 0.6772i | −0.8367 + 0.8248i | −0.8267 + 0.8177i |
| w20 | 10100 | −0.4202 + 1.0404i | −0.18 + 1.0971i   | −0.2126 + 0.6666i | −0.2293 + 0.7058i |
| w21 | 10101 | −0.1661 + 1.1091i | −0.2211 + 0.4958i | −0.2344 + 0.2319i | −0.2086 + 1.144i |
| w22 | 10110 | −0.6736 + 0.8966i | −0.4431 + 1.0196i | −0.1868 + 1.16i   | −0.2677 + 0.2828i |
| w23 | 10111 | −0.1981 + 0.4223i | −0.6778 + 0.8812i | −0.5438 + 1.0415i | −0.5548 + 1.0221i |
| w24 | 11000 | −1.0304 − 0.444i  | −1.0971 − 0.18i   | −1.1563 − 0.2084i | −1.146 − 0.1942i |
| w25 | 11001 | −1.1103 − 0.1616i | −0.4907 − 0.2208i | −0.6667 − 0.2352i | −1.0305 − 0.5389i |
| w26 | 11010 | −0.8946 − 0.6772i | −1.02 − 0.4423i   | −1.039 − 0.5484i  | −0.6951 − 0.233i |
| w27 | 11011 | −0.4346 − 0.2063i | −0.8817 − 0.6772i | −0.8367 − 0.8248i | −0.8267 − 0.8177i |
| w28 | 11100 | −0.4202 − 1.0404i | −0.18 − 1.0971i   | −0.2126 − 0.6666i | −0.2293 − 0.7058i |
| w29 | 11101 | −0.1661 − 1.1091i | −0.2211 − 0.4958i | −0.2344 − 0.2319i | −0.2086 − 1.144i |
| w30 | 11110 | −0.6736 − 0.8966i | −0.4431 − 1.0196i | −0.1868 − 1.16i   | −0.2677 − 0.2828i |
| w31 | 11111 | −0.1981 − 0.4223i | −0.6778 − 0.8812i | −0.5438 − 1.0415i | −0.5548 − 1.0221i | or group B3:

| w | bit label | R = ½ (or ⅝ or ¾ or ¹³/₁₆) | R = ⅝ (or ½ or ¾ or ¹³/₁₆) | R = ¾ (or ½ or ⅝ or ¹³/₁₆) | R = ¹³/₁₆ (or ½ or ⅝ or ¾) |
|---|---|---|---|---|---|
| w0  | 00000 | 0.6588 + 0.2335i | 0.6258 + 0.171i  | 0.7734 + 0.1898i | 0.2229 + 0.2243i |
| w1  | 00001 | 1.152 + 0.1943i  | 1.1753 + 0.2181i | 1.1905 + 0.2491i | 0.7488 + 0.1887i |
| w2  | 00010 | 0.8934 + 0.7527i | 0.2219 + 0.2216i | 0.6881 + 0.5652i | 0.6173 + 1.0647i |
| w3  | 00011 | 1.0419 + 0.5284i | 1.0354 + 0.5975i | 0.9811 + 0.7188i | 1.2067 + 0.242i |
| w4  | 00100 | 0.2537 + 0.3006i | 0.1925 + 1.1798i | 0.2475 + 0.2277i | 0.2183 + 0.7125i |
| w5  | 00101 | 0.1583 + 0.7127i | 0.5389 + 1.067i  | 0.2041 + 1.199i  | 0.6249 + 0.5473i |
| w6  | 00110 | 0.6045 + 0.9997i | 0.2194 + 0.6207i | 0.2562 + 0.6908i | 0.2129 + 1.2121i |
| w7  | 00111 | 0.25 + 1.1412i   | 0.7778 + 0.8523i | 0.6044 + 1.0554i | 1.0247 + 0.6815i |
| w8  | 01000 | 0.6588 − 0.2335i | 0.6258 − 0.171i  | 0.7734 − 0.1898i | 0.2229 − 0.2243i |
| w9  | 01001 | 1.152 − 0.1943i  | 1.1753 − 0.2181i | 1.1905 − 0.2491i | 0.7488 − 0.1887i |
| w10 | 01010 | 0.8934 − 0.7527i | 0.2219 − 0.2216i | 0.6881 − 0.5652i | 0.6173 − 1.0647i |
| w11 | 01011 | 1.0419 − 0.5284i | 1.0354 − 0.5975i | 0.9811 − 0.7188i | 1.2067 − 0.242i |
| w12 | 01100 | 0.2537 − 0.3006i | 0.1925 − 1.1798i | 0.2475 − 0.2277i | 0.2183 − 0.7125i |
| w13 | 01101 | 0.1583 − 0.7127i | 0.5389 − 1.067i  | 0.2041 − 1.199i  | 0.6249 − 0.5473i |
| w14 | 01110 | 0.6045 − 0.9997i | 0.2194 − 0.6207i | 0.2562 − 0.6908i | 0.2129 − 1.2121i |
| w15 | 01111 | 0.25 − 1.1412i   | 0.7778 − 0.8523i | 0.6044 − 1.0554i | 1.0247 − 0.6815i |
| w16 | 10000 | −0.6588 + 0.2335i | −0.6258 + 0.171i  | −0.7734 + 0.1898i | −0.2229 + 0.2243i |
| w17 | 10001 | −1.152 + 0.1943i  | −1.1753 + 0.2181i | −1.1905 + 0.2491i | −0.7488 + 0.1887i |
| w18 | 10010 | −0.8934 + 0.7527i | −0.2219 + 0.2216i | −0.6881 + 0.5652i | −0.6173 + 1.0647i |
| w19 | 10011 | −1.0419 + 0.5284i | −1.0354 + 0.5975i | −0.9811 + 0.7188i | −1.2067 + 0.242i |
| w20 | 10100 | −0.2537 + 0.3006i | −0.1925 + 1.1798i | −0.2475 + 0.2277i | −0.2183 + 0.7125i |
| w21 | 10101 | −0.1583 + 0.7127i | −0.5389 + 1.067i  | −0.2041 + 1.199i  | −0.6249 + 0.5473i |
| w22 | 10110 | −0.6045 + 0.9997i | −0.2194 + 0.6207i | −0.2562 + 0.6908i | −0.2129 + 1.2121i |
| w23 | 10111 | −0.25 + 1.1412i   | −0.7778 + 0.8523i | −0.6044 + 1.0554i | −1.0247 + 0.6815i |
| w24 | 11000 | −0.6588 − 0.2335i | −0.6258 − 0.171i  | −0.7734 − 0.1898i | −0.2229 − 0.2243i |
| w25 | 11001 | −1.152 − 0.1943i  | −1.1753 − 0.2181i | −1.1905 − 0.2491i | −0.7488 − 0.1887i |
| w26 | 11010 | −0.8934 − 0.7527i | −0.2219 − 0.2216i | −0.6881 − 0.5652i | −0.6173 − 1.0647i |
| w27 | 11011 | −1.0419 − 0.5284i | −1.0354 − 0.5975i | −0.9811 − 0.7188i | −1.2067 − 0.242i |
| w28 | 11100 | −0.2537 − 0.3006i | −0.1925 − 1.1798i | −0.2475 − 0.2277i | −0.2183 − 0.7125i |
| w29 | 11101 | −0.1583 − 0.7127i | −0.5389 − 1.067i  | −0.2041 − 1.199i  | −0.6249 − 0.5473i |
| w30 | 11110 | −0.6045 − 0.9997i | −0.2194 − 0.6207i | −0.2562 − 0.6908i | −0.2129 − 1.2121i |
| w31 | 11111 | −0.25 − 1.1412i   | −0.7778 − 0.8523i | −0.6044 − 1.0554i | −1.0247 − 0.6815i |

C) 64-QAM non-uniform constellations of group C1:

| w | bit label | R = ½ (or ⅝ or ¾ or ¹³/₁₆) | R = ⅝ (or ½ or ¾ or ¹³/₁₆) | R = ¾ (or ½ or ⅝ or ¹³/₁₆) | R = ¹³/₁₆ (or ½ or ⅝ or ¾) |
|---|---|---|---|---|---|
| w0 | 000000 | 0.2287 + 0.5143i | 0.1978 + 0.198i | 1.0605 + 0.5953i | 0.873 + 0.8874i |
| w1 | 000001 | 0.2116 + 1.0918i | 0.1916 + 1.1985i | 0.1796 + 0.4943i | 1.0395 + 0.6848i |
| w2 | 000010 | 0.2828 + 0.5535i | 0.4969 + 0.1984i | 0.7562 + 0.4956i | 0.6726 + 1.0474i |
| w3 | 000011 | 0.214 + 1.0888i | 0.4757 + 1.1166i | 0.4954 + 0.5126i | 0.6771 + 0.6619i |
| w4 | 000100 | 0.6913 + 0.8711i | 0.1862 + 0.5083i | 1.1574 + 0.3735i | 1.2358 + 0.1495i |
| w5 | 000101 | 0.461 + 1.012i | 0.171 + 0.8428i | 0.1887 + 0.1816i | 1.1669 + 0.4334i |
| w6 | 000110 | 0.6929 + 0.8697i | 0.479 + 0.5257i | 0.8128 + 0.199i | 0.8923 + 0.1387i |
| w7 | 000111 | 0.4624 + 1.0114i | 0.4272 + 0.8201i | 0.5012 + 0.183i | 0.8067 + 0.404i |
| w8 | 001000 | 0.3191 + 0.2057i | 1.1727 + 0.3125i | 0.9378 + 0.7743i | 0.1465 + 1.2361i |
| w9 | 001001 | 1.0956 + 0.1876i | 1.2022 + 0.1671i | 0.1694 + 0.8236i | 0.1412 + 0.8899i |
| w10 | 001010 | 0.5092 + 0.2494i | 0.7798 + 0.2035i | 0.7911 + 0.9225i | 0.4261 + 1.1695i |
| w11 | 001011 | 1.093 + 0.2006i | 0.6806 + 1.0049i | 0.4477 + 0.779i | 0.413 + 0.7955i |
| w12 | 001100 | 0.8876 + 0.67i | 1.0766 + 0.5604i | 1.2059 + 0.157i | 0.1641 + 0.164i |
| w13 | 001101 | 1.0256 + 0.4299i | 0.9914 + 0.7003i | 0.1661 + 1.2048i | 0.1442 + 0.5197i |
| w14 | 001110 | 0.8899 + 0.6666i | 0.7425 + 0.5068i | 0.6275 + 1.0418i | 0.5218 + 0.1427i |
| w15 | 001111 | 1.0227 + 0.4368i | 0.8329 + 0.8826i | 0.4264 + 1.1388i | 0.4324 + 0.4339i |
| w16 | 010000 | 0.2287 − 0.5143i | 0.1978 − 0.198i | 1.0605 − 0.5953i | 0.873 − 0.8874i |
| w17 | 010001 | 0.2116 − 1.0918i | 0.1916 − 1.1985i | 0.1796 − 0.4943i | 1.0395 − 0.6848i |
| w18 | 010010 | 0.2828 − 0.5535i | 0.4969 − 0.1984i | 0.7562 − 0.4956i | 0.6726 − 1.0474i |
| w19 | 010011 | 0.214 − 1.0888i | 0.4757 − 1.1166i | 0.4954 − 0.5126i | 0.6771 − 0.6619i |
| w20 | 010100 | 0.6913 − 0.8711i | 0.1862 − 0.5083i | 1.1574 − 0.3735i | 1.2358 − 0.1495i |
| w21 | 010101 | 0.461 − 1.012i | 0.171 − 0.8428i | 0.1887 − 0.1816i | 1.1669 − 0.4334i |
| w22 | 010110 | 0.6929 − 0.8697i | 0.479 − 0.5257i | 0.8128 − 0.199i | 0.8923 − 0.1387i |
| w23 | 010111 | 0.4624 − 1.0114i | 0.4272 − 0.8201i | 0.5012 − 0.183i | 0.8067 − 0.404i |
| w24 | 011000 | 0.3191 − 0.2057i | 1.1727 − 0.3125i | 0.9378 − 0.7743i | 0.1465 − 1.2361i |
| w25 | 011001 | 1.0956 − 0.1876i | 1.2022 − 0.1671i | 0.1694 − 0.8236i | 0.1412 − 0.8899i |
| w26 | 011010 | 0.5092 − 0.2494i | 0.7798 − 0.2035i | 0.7911 − 0.9225i | 0.4261 − 1.1695i |
| w27 | 011011 | 1.093 − 0.2006i | 0.6806 − 1.0049i | 0.4477 − 0.779i | 0.413 − 0.7955i |
| w28 | 011100 | 0.8876 − 0.67i | 1.0766 − 0.5604i | 1.2059 − 0.157i | 0.1641 − 0.164i |
| w29 | 011101 | 1.0256 − 0.4299i | 0.9914 − 0.7003i | 0.1661 − 1.2048i | 0.1442 − 0.5197i |
| w30 | 011110 | 0.8899 − 0.6666i | 0.7425 − 0.5068i | 0.6275 − 1.0418i | 0.5218 − 0.1427i |
| w31 | 011111 | 1.0227 − 0.4368i | 0.8329 − 0.8826i | 0.4264 − 1.1388i | 0.4324 − 0.4339i |
| w32 | 100000 | −0.2287 + 0.5143i | −0.1978 + 0.198i | −1.0605 + 0.5953i | −0.873 + 0.8874i |
| w33 | 100001 | −0.2116 + 1.0918i | −0.1916 + 1.1985i | −0.1796 + 0.4943i | −1.0395 + 0.6848i |
| w34 | 100010 | −0.2828 + 0.5535i | −0.4969 + 0.1984i | −0.7562 + 0.4956i | −0.6726 + 1.0474i |
| w35 | 100011 | −0.214 + 1.0888i | −0.4757 + 1.1166i | −0.4954 + 0.5126i | −0.6771 + 0.6619i |
| w36 | 100100 | −0.6913 + 0.8711i | −0.1862 + 0.5083i | −1.1574 + 0.3735i | −1.2358 + 0.1495i |
| w37 | 100101 | −0.461 + 1.012i | −0.171 + 0.8428i | −0.1887 + 0.1816i | −1.1669 + 0.4334i |
| w38 | 100110 | −0.6929 + 0.8697i | −0.479 + 0.5257i | −0.8128 + 0.199i | −0.8923 + 0.1387i |
| w39 | 100111 | −0.4624 + 1.0114i | −0.4272 + 0.8201i | −0.5012 + 0.183i | −0.8067 + 0.404i |
| w40 | 101000 | −0.3191 + 0.2057i | −1.1727 + 0.3125i | −0.9378 + 0.7743i | −0.1465 + 1.2361i |
| w41 | 101001 | −1.0956 + 0.1876i | −1.2022 + 0.1671i | −0.1694 + 0.8236i | −0.1412 + 0.8899i |
| w42 | 101010 | −0.5092 + 0.2494i | −0.7798 + 0.2035i | −0.7911 + 0.9225i | −0.4261 + 1.1695i |
| w43 | 101011 | −1.093 + 0.2006i | −0.6806 + 1.0049i | −0.4477 + 0.779i | −0.413 + 0.7955i |
| w44 | 101100 | −0.8876 + 0.67i | −1.0766 + 0.5604i | −1.2059 + 0.157i | −0.1641 + 0.164i |
| w45 | 101101 | −1.0256 + 0.4299i | −0.9914 + 0.7003i | −0.1661 + 1.2048i | −0.1442 + 0.5197i |
| w46 | 101110 | −0.8899 + 0.6666i | −0.7425 + 0.5068i | −0.6275 + 1.0418i | −0.5218 + 0.1427i |
| w47 | 101111 | −1.0227 + 0.4368i | −0.8329 + 0.8826i | −0.4264 + 1.1388i | −0.4324 + 0.4339i |
| w48 | 110000 | −0.2287 − 0.5143i | −0.1978 − 0.198i | −1.0605 − 0.5953i | −0.873 − 0.8874i |
| w49 | 110001 | −0.2116 − 1.0918i | −0.1916 − 1.1985i | −0.1796 − 0.4943i | −1.0395 − 0.6848i |
| w50 | 110010 | −0.2828 − 0.5535i | −0.4969 − 0.1984i | −0.7562 − 0.4956i | −0.6726 − 1.0474i |
| w51 | 110011 | −0.214 − 1.0888i | −0.4757 − 1.1166i | −0.4954 − 0.5126i | −0.6771 − 0.6619i |
| w52 | 110100 | −0.6913 − 0.8711i | −0.1862 − 0.5083i | −1.1574 − 0.3735i | −1.2358 − 0.1495i |
| w53 | 110101 | −0.461 − 1.012i | −0.171 − 0.8428i | −0.1887 − 0.1816i | −1.1669 − 0.4334i |
| w54 | 110110 | −0.6929 − 0.8697i | −0.479 − 0.5257i | −0.8128 − 0.199i | −0.8923 − 0.1387i |
| w55 | 110111 | −0.4624 − 1.0114i | −0.4272 − 0.8201i | −0.5012 − 0.183i | −0.8067 − 0.404i |
| w56 | 111000 | −0.3191 − 0.2057i | −1.1727 − 0.3125i | −0.9378 − 0.7743i | −0.1465 − 1.2361i |
| w57 | 111001 | −1.0956 − 0.1876i | −1.2022 − 0.1671i | −0.1694 − 0.8236i | −0.1412 − 0.8899i |
| w58 | 111010 | −0.5092 − 0.2494i | −0.7798 − 0.2035i | −0.7911 − 0.9225i | −0.4261 − 1.1695i |
| w59 | 111011 | −1.093 − 0.2006i | −0.6806 − 1.0049i | −0.4477 − 0.779i | −0.413 − 0.7955i |
| w60 | 111100 | −0.8876 − 0.67i | −1.0766 − 0.5604i | −1.2059 − 0.157i | −0.1641 − 0.164i |
| w61 | 111101 | −1.0256 − 0.4299i | −0.9914 − 0.7003i | −0.1661 − 1.2048i | −0.1442 − 0.5197i |
| w62 | 111110 | −0.8899 − 0.6666i | −0.7425 − 0.5068i | −0.6275 − 1.0418i | −0.5218 − 0.1427i |
| w63 | 111111 | −1.0227 − 0.4368i | −0.8329 − 0.8826i | −0.4264 − 1.1388i | −0.4324 − 0.4339i | or group C2:

| w | bit label | R = ½ (or ⅝ or ¾ or ¹³/₁₆) | R = ⅝ (or ½ or ¾ or ¹³/₁₆) | R = ¾ (or ½ or ⅝ or ¹³/₁₆) | R = ¹³/₁₆ (or ½ or ⅝ or ¾) |
|---|---|---|---|---|---|
| w0 | 000000 | 0.1298 + 0.2084i | 0.3328 + 0.1665i | 0.9596 + 0.4358i | 1.022 + 0.4536i |
| w1 | 000001 | 0.1883 + 1.3627i | 0.5435 + 1.2609i | 0.1328 + 0.5092i | 0.1374 = 0.4738i |
| w2 | 000010 | 0.217 + 0.4464i | 0.1217 + 0.1744i | 0.6561 + 0.4543i | 0.6985 + 0.4499i |

-continued

| w | bit label | R = ½ (or ⅝ or ¾ or ¹³⁄₁₆) | R = ⅝ (or ½ or ¾ or ¹³⁄₁₆) | R = ¾ (or ½ or ⅝ or ¹³⁄₁₆) | R = ¹³⁄₁₆ (or ½ or ⅝ or ¾) |
|---|---|---|---|---|---|
| w3 | 000011 | 0.1269 + 0.764i | 0.1904 + 1.3623i | 0.3855 + 0.4909i | 0.413 + 0.4891i |
| w4 | 000100 | 0.7986 + 1.12i | 0.3528 + 0.4894i | 0.9773 + 0.1483i | 1.0021 + 0.1484i |
| w5 | 000101 | 0.4538 + 1.1748i | 0.4073 + 0.8478i | 0.1256 + 0.1724i | 0.1339 + 0.1575i |
| w6 | 000110 | 0.4822 + 0.6563i | 0.1288 + 0.5124i | 0.6457 + 0.1512i | 0.6852 + 0.1497i |
| w7 | 000111 | 0.3148 + 0.8326i | 0.1465 + 0.8935i | 0.3703 + 0.1633i | 0.4014 + 0.1605i |
| w8 | 001000 | 0.2328 + 0.1185i | 0.5998 + 0.1505i | 1.2035 + 0.6663i | 1.147 + 0.7594i |
| w9 | 001001 | 1.3637 + 0.1808i | 0.8781 + 1.0589i | 0.1492 + 0.8611i | 0.1479 + 0.8049i |
| w10 | 001010 | 0.4762 + 0.2045i | 0.9411 + 0.1492i | 0.7306 + 0.7613i | 0.7571 + 0.7595i |
| w11 | 001011 | 0.827 + 0.1328i | 1.3582 + 0.218i | 0.4377 + 0.8492i | 0.4503 + 0.8438i |
| w12 | 001100 | 1.0652 + 0.8657i | 0.6339 + 0.4545i | 1.3574 + 0.2231i | 1.3596 + 0.2095i |
| w13 | 001101 | 1.262 + 0.5438i | 0.7138 + 0.7632i | 0.1858 + 1.2632i | 0.1659 + 1.1736i |
| w14 | 001110 | 0.6765 + 0.4967i | 0.9294 + 0.4189i | 0.9009 + 1.0396i | 0.841 + 1.0885i |
| w15 | 001111 | 0.8548 + 0.3591i | 1.1995 + 0.6617i | 0.5564 + 1.2461i | 0.5064 + 1.2593i |
| w16 | 010000 | 0.1298 − 0.2084i | 0.3328 − 0.1665i | 0.9596 − 0.4358i | 1.022 − 0.4536i |
| w17 | 010001 | 0.1883 − 1.3627i | 0.5435 − 1.2609i | 0.1328 − 0.5092i | 0.1374 − 0.4738i |
| w18 | 010010 | 0.217 − 0.4464i | 0.1217 − 0.1744i | 0.6561 − 0.4543i | 0.6985 − 0.4499i |
| w19 | 010011 | 0.1269 − 0.764i | 0.1904 − 1.3623i | 0.3855 − 0.4909i | 0.413 − 0.4891i |
| w20 | 010100 | 0.7986 − 1.12i | 0.3528 − 0.4894i | 0.9773 − 0.1483i | 1.0021 − 0.1484i |
| w21 | 010101 | 0.4538 − 1.1748i | 0.4073 − 0.8478i | 0.1256 − 0.1724i | 0.1339 − 0.1575i |
| w22 | 010110 | 0.4822 − 0.6563i | 0.1288 − 0.5124i | 0.6457 − 0.1512i | 0.6852 − 0.1497i |
| w23 | 010111 | 0.3148 − 0.8326i | 0.1465 − 0.8935i | 0.3703 − 0.1633i | 0.4014 − 0.1605i |
| w24 | 011000 | 0.2328 − 0.1185i | 0.5998 − 0.1505i | 1.2035 − 0.6663i | 1.147 − 0.7594i |
| w25 | 011001 | 1.3637 − 0.1808i | 0.8781 − 1.0589i | 0.1492 − 0.8611i | 0.1479 − 0.8049i |
| w26 | 011010 | 0.4762 − 0.2045i | 0.9411 − 0.1492i | 0.7306 − 0.7613i | 0.7571 − 0.7595i |
| w27 | 011011 | 0.827 − 0.1328i | 1.3582 − 0.218i | 0.4377 − 0.8492i | 0.4503 − 0.8438i |
| w28 | 011100 | 1.0652 − 0.8657i | 0.6339 − 0.4545i | 1.3574 − 0.2231i | 1.3596 − 0.2095i |
| w29 | 011101 | 1.262 − 0.5438i | 0.7138 − 0.7632i | 0.1858 − 1.2632i | 0.1659 − 1.1736i |
| w30 | 011110 | 0.6765 − 0.4967i | 0.9294 − 0.4189i | 0.9009 − 1.0396i | 0.841 − 1.0885i |
| w31 | 011111 | 0.8548 − 0.3591i | 1.1995 − 0.6617i | 0.5564 − 1.2461i | 0.5064 − 1.2593i |
| w32 | 100000 | −0.1298 + 0.2084i | −0.3328 + 0.1665i | −0.9596 + 0.4358i | −1.022 + 0.4536i |
| w33 | 100001 | −0.1883 + 1.3627i | −0.5435 + 1.2609i | −0.1328 + 0.5092i | −0.1374 + 0.4738i |
| w34 | 100010 | −0.217 + 0.4464i | −0.1217 + 0.1744i | −0.6561 + 0.4543i | −0.6985 + 0.4499i |
| w35 | 100011 | −0.1269 + 0.764i | −0.1904 + 1.3623i | −0.3855 + 0.4909i | −0.413 + 0.4891i |
| w36 | 100100 | −0.7986 + 1.12i | −0.3528 + 0.4894i | −0.9773 + 0.1483i | −1.0021 + 0.1484i |
| w37 | 100101 | −0.4538 + 1.1748i | −0.4073 + 0.8478i | −0.1256 + 0.1724i | −0.1339 + 0.1575i |
| w38 | 100110 | −0.4822 + 0.6563i | −0.1288 + 0.5124i | −0.6457 + 0.1512i | −0.6852 + 0.1497i |
| w39 | 100111 | −0.3148 + 0.8326i | −0.1465 + 0.8935i | −0.3703 + 0.1633i | −0.4014 + 0.1605i |
| w40 | 101000 | −0.2328 + 0.1185i | −0.5998 + 0.1505i | −1.2035 + 0.6663i | −1.147 + 0.7594i |
| w41 | 101001 | −1.3637 + 0.1808i | −0.8781 + 1.0589i | −0.1492 + 0.8611i | −0.1479 + 0.8049i |
| w42 | 101010 | −0.4762 + 0.2045i | −0.9411 + 0.1492i | −0.7306 + 0.7613i | −0.7571 + 0.7595i |
| w43 | 101011 | −0.827 + 0.1328i | −1.3582 + 0.218i | −0.4377 + 0.8492i | −0.4503 + 0.8438i |
| w44 | 101100 | −1.0652 + 0.8657i | −0.6339 + 0.4545i | −1.3574 + 0.2231i | −1.3596 + 0.2095i |
| w45 | 101101 | −1.262 + 0.5438i | −0.7138 + 0.7632i | −0.1858 + 1.2632i | −0.1659 + 1.1736i |
| w46 | 101110 | −0.6765 + 0.4967i | −0.9294 + 0.4189i | −0.9009 + 1.0396i | −0.841 + 1.0885i |
| w47 | 101111 | −0.8548 + 0.3591i | −1.1995 + 0.6617i | −0.5564 + 1.2461i | −0.5064 + 1.2593i |
| w48 | 110000 | −0.1298 − 0.2084i | −0.3328 − 0.1665i | −0.9596 − 0.4358i | −1.022 − 0.4536i |
| w49 | 110001 | −0.1883 − 1.3627i | −0.5435 − 1.2609i | −0.1328 − 0.5092i | −0.1374 − 0.4738i |
| w50 | 110010 | −0.217 − 0.4464i | −0.1217 − 0.1744i | −0.6561 − 0.4543i | −0.6985 − 0.4499i |
| w51 | 110011 | −0.1269 − 0.764i | −0.1904 − 1.3623i | −0.3855 − 0.4909i | −0.413 − 0.4891i |
| w52 | 110100 | −0.7986 − 1.12i | −0.3528 − 0.4894i | −0.9773 − 0.1483i | −1.0021 − 0.1484i |
| w53 | 110101 | −0.4538 − 1.1748i | −0.4073 − 0.8478i | −0.1256 − 0.1724i | −0.1339 − 0.1575i |
| w54 | 110110 | −0.4822 − 0.6563i | −0.1288 − 0.5124i | −0.6457 − 0.1512i | −0.6852 − 0.1497i |
| w55 | 110111 | −0.3148 − 0.8326i | −0.1465 − 0.8935i | −0.3703 − 0.1633i | −0.4014 − 0.1605i |
| w56 | 111000 | −0.2328 − 0.1185i | −0.5998 − 0.1505i | −1.2035 − 0.6663i | −1.147 − 0.7594i |
| w57 | 111001 | −1.3637 − 0.1808i | −0.8781 − 1.0589i | −0.1492 − 0.8611i | −0.1479 − 0.8049i |
| w58 | 111010 | −0.4762 − 0.2045i | −0.9411 − 0.1492i | −0.7306 − 0.7613i | −0.7571 − 0.7595i |
| w59 | 111011 | −0.827 − 0.1328i | −1.3582 − 0.218i | −0.4377 − 0.8492i | −0.4503 − 0.8438i |
| w60 | 111100 | −1.0652 − 0.8657i | −0.6339 − 0.4545i | −1.3574 − 0.2231i | −1.3596 − 0.2095i |
| w61 | 111101 | −1.262 − 0.5438i | −0.7138 − 0.7632i | −0.1858 − 1.2632i | −0.1659 − 1.1736i |
| w62 | 111110 | −0.6765 − 0.4967i | −0.9294 − 0.4189i | −0.9009 − 1.0396i | −0.841 − 1.0885i |
| w63 | 111111 | −0.8548 − 0.3591i | −1.1995 − 0.6617i | −0.5564 − 1.2461i | −0.5064 − 1.2593i | or group C3:

| w | bit label | R = ½ (or ⅝ or ¾ or ¹³⁄₁₆) | R = ⅝ (or ½ or ¾ or ¹³⁄₁₆) | R = ¾ (or ½ or ⅝ or ¹³⁄₁₆) | R = ¹³⁄₁₆ (or ½ or ⅝ or ¾) |
|---|---|---|---|---|---|
| w0 | 000000 | 1.0569 + 0.7089i | 0.8757 + 0.9247i | 0.937 + 0.8841i | 1.1723 + 0.5141i |
| w1 | 000001 | 1.0841 + 0.6678i | 1.045 + 0.728i | 1.1063 + 0.6601i | 0.1476 + 0.5364i |
| w2 | 000010 | 0.819 + 0.9734i | 0.7024 + 1.0623i | 0.7126 + 1.0729i | 0.7669 + 0.4573i |
| w3 | 000011 | 0.7389 + 0.713i | 0.6854 + 0.6748i | 0.649 + 0.7077i | 0.4449 + 0.4829i |
| w4 | 000100 | 1.2554 + 0.21142i | 1.2615 + 0.1746i | 1.2781 + 0.1604i | 1.004 + 0.174i |
| w5 | 000101 | 1.2348 + 0.3103i | 1.1831 + 0.4706i | 1.0791 + 0.3764i | 0.1371 + 0.1864i |

-continued

| w | bit label | R = ½ (or ⅝ or ¾ or ¹³⁄₁₆) | R = ⅝ (or ½ or ¾ or ¹³⁄₁₆) | R = ¾ (or ½ or ⅝ or ¹³⁄₁₆) | R = ¹³⁄₁₆ (or ½ or ⅝ or ¾) |
|---|---|---|---|---|---|
| w6 | 000110 | 0.7562 + 0.1721i | 0.8301 + 0.1381i | 0.7714 + 0.1301i | 0.7139 + 0.1521i |
| w7 | 000111 | 0.7451 + 0.3181i | 0.7748 + 0.3978i | 0.7335 + 0.4268i | 0.4208 + 0.1616i |
| w8 | 001000 | 0.2187 + 1.2529i | 0.1636 + 1.263i | 0.1553 + 1.2788i | 1.0216 + 0.771i |
| w9 | 001001 | 0.1608 + 0.8472i | 0.1378 + 0.8233i | 0.1327 + 0.8728i | 0.1431 + 0.9083i |
| w10 | 001010 | 0.5502 + 1.1466i | 0.446 + 1.1929i | 0.4463 + 1.2084i | 0.7237 + 0.7521i |
| w11 | 001011 | 0.4217 + 0.7827i | 0.3922 + 0.7613i | 0.3935 + 0.8156i | 0.4251 + 0.8248i |
| w12 | 001100 | 0.1479 + 0.17i | 0.1453 + 0.1451i | 0.1358 + 0.1626i | 1.2711 + 0.1575i |
| w13 | 001101 | 0.1574 + 0.4709i | 0.1295 + 0.4429i | 0.1371 + 0.5004i | 0.162 + 1.2706i |
| w14 | 001110 | 0.3867 + 0.1695i | 0.4504 + 0.1426i | 0.427 + 0.1484i | 0.7403 + 1.045i |
| w15 | 001111 | 0.3923 + 0.4332i | 0.4124 + 0.4207i | 0.406 + 0.4481i | 0.4693 + 1.1917i |
| w16 | 010000 | 1.0569 − 0.7089i | 0.8757 − 0.9247i | 0.937 − 0.8841i | 1.1723 − 0.5141i |
| w17 | 010001 | 1.0841 − 0.6678i | 1.045 − 0.728i | 1.1063 − 0.6601i | 0.1476 − 0.5364i |
| w18 | 010010 | 0.819 − 0.9734i | 0.7024 − 1.0623i | 0.7126 − 1.0729i | 0.7669 − 0.4573i |
| w19 | 010011 | 0.7389 − 0.713i | 0.6854 − 0.6748i | 0.649 − 0.7077i | 0.4449 − 0.4829i |
| w20 | 010100 | 1.2554 − 0.2142i | 1.2615 − 0.1746i | 1.2781 − 0.1604i | 1.004 − 0.174i |
| w21 | 010101 | 1.2348 − 0.3103i | 1.1831 − 0.4706i | 1.0791 − 0.3764i | 0.1371 − 0.1864i |
| w22 | 010110 | 0.7562 − 0.1721i | 0.8301 − 0.1381i | 0.7714 − 0.1301i | 0.7139 − 0.1521i |
| w23 | 010111 | 0.7451 − 0.3181i | 0.7748 − 0.3978i | 0.7335 − 0.4268i | 0.4208 − 0.1616i |
| w24 | 011000 | 0.2187 − 1.2529i | 0.1636 − 1.263i | 0.1553 − 1.2788i | 1.0216 − 0.771i |
| w25 | 011001 | 0.1608 − 0.8472i | 0.1378 − 0.8233i | 0.1327 − 0.8728i | 0.1431 − 0.9083i |
| w26 | 011010 | 0.5502 − 1.1466i | 0.446 − 1.1929i | 0.4463 − 1.2084i | 0.7237 − 0.7521i |
| w27 | 011011 | 0.4217 − 0.7827i | 0.3922 − 0.7613i | 0.3935 − 0.8156i | 0.4251 − 0.8248i |
| w28 | 011100 | 0.1479 − 0.17i | 0.1453 − 0.1451i | 0.1358 − 0.1626i | 1.2711 − 0.1575i |
| w29 | 011101 | 0.1574 − 0.4709i | 0.1295 − 0.4429i | 0.1371 − 0.5004i | 0.162 − 1.2706i |
| w30 | 011110 | 0.3867 − 0.1695i | 0.4504 − 0.1426i | 0.427 − 0.1484i | 0.7403 − 1.045i |
| w31 | 011111 | 0.3923 − 0.4332i | 0.4124 − 0.4207i | 0.406 − 0.4481i | 0.4693 − 1.1917i |
| w32 | 100000 | −1.0569 + 0.7089i | −0.8757 + 0.9247i | −0.937 + 0.8841i | −1.1723 + 0.5141i |
| w33 | 100001 | −1.0841 + 0.6678i | −1.045 + 0.728i | −1.1063 + 0.6601i | −0.1476 + 0.5364i |
| w34 | 100010 | −0.819 + 0.9734i | −0.7024 + 1.0623i | −0.7126 + 1.0729i | −0.7669 + 0.4573i |
| w35 | 100011 | −0.7389 + 0.713i | −0.6854 + 0.6748i | −0.649 + 0.7077i | −0.4449 + 0.4829i |
| w36 | 100100 | −1.2554 + 0.2142i | −1.2615 + 0.1746i | −1.2781 + 0.1604i | −1.004 + 0.174i |
| w37 | 100101 | −1.2348 + 0.3103i | −1.1831 + 0.4706i | −1.0791 + 0.3764i | −0.1371 + 0.1864i |
| w38 | 100110 | −0.7562 + 0.1721i | −0.8301 + 0.1381i | −0.7714 + 0.1301i | −0.7139 + 0.1521i |
| w39 | 100111 | −0.7451 + 0.3181i | −0.7748 + 0.3978i | −0.7335 + 0.4268i | −0.4208 + 0.1616i |
| w40 | 101000 | −0.2187 + 1.2529i | −0.1636 + 1.263i | −0.1553 + 1.2788i | −1.0216 + 0.771i |
| w41 | 101001 | −0.1608 + 0.8472i | −0.1378 + 0.8233i | −0.1327 + 0.8728i | −0.1431 + 0.9083i |
| w42 | 101010 | −0.5502 + 1.1466i | −0.446 + 1.1929i | −0.4463 + 1.2084i | −0.7237 + 0.7521i |
| w43 | 101011 | −0.4217 + 0.7827i | −0.3922 + 0.7613i | −0.3935 + 0.8156i | −0.4251 + 0.8248i |
| w44 | 101100 | −0.1479 + 0.17i | −0.1453 + 0.1451i | −0.1358 + 0.1626i | −1.2711 + 0.1575i |
| w45 | 101101 | −0.1574 + 0.4709i | −0 1295 + 0.4429i | −0.1371 + 0.5004i | −0.162 + 1.2706i |
| w46 | 101110 | −0.3867 + 0.1695i | −0.4504 + 0.1426i | −0.427 + 0.1484i | −0.7403 + 1.045i |
| w47 | 101111 | −0.3923 + 0.4332i | −0.4124 + 0.4207i | −0.406 + 0.4481i | −0.4693 + 1.1917i |
| w48 | 110000 | −1.0569 − 0.7089i | −0.8757 − 0.9247i | −0.937 − 0.8841i | −1.1723 − 0.5141i |
| w49 | 110001 | −1.0841 − 0.6678i | −1.045 − 0.728i | −1.1063 − 0.6601i | −0.1476 − 0.5364i |
| w50 | 110010 | −0.819 − 0.9734i | −0.7024 − 1.0623i | −0.7126 − 1.0729i | −0.7669 − 0.4573i |
| w51 | 110011 | −0.7389 − 0.713i | −0.6854 − 0.6748i | −0.649 − 0.7077i | −0.4449 − 0.4829i |
| w52 | 110100 | −1.2554 − 0.2142i | −1.2615 − 0.1746i | −1.2781 − 0.1604i | −1.004 − 0.174i |
| w53 | 110101 | −1.2348 − 0.3103i | −1.1831 − 0.4706i | −1.0791 − 0.3764i | −0.1371 − 0.1864i |
| w54 | 110110 | −0.7562 − 0.1721i | −0.8301 − 0.1381i | −0.7714 − 0.1301i | −0.7139 − 0.1521i |
| w55 | 110111 | −0.7451 − 0.3181i | −0.7748 − 0.3978i | −0.7335 − 0.4268i | −0.4208 − 0.1616i |
| w56 | 111000 | −0.2187 − 1.2529i | −0.1636 − 1.263i | −0.1553 − 1.2788i | −1.0216 − 0.771i |
| w57 | 111001 | −0.1608 − 0.8472i | −0.1378 − 0.8233i | −0.1327 − 0.8728i | −0.1431 − 0.9083i |
| w58 | 111010 | −0.5502 − 1.1466i | −0.446 − 1.1929i | −0.4463 − 1.2084i | −0.7237 − 0.7521i |
| w59 | 111011 | −0.4217 − 0.7827i | −0.3922 − 0.7613i | −0.3935 − 0.8156i | −0.4251 − 0.8248i |
| w60 | 111100 | −0.1479 − 0.17i | −0.1453 − 0.1451i | −0.1358 − 0.1626i | −1.2711 − 0.1575i |
| w61 | 111101 | −0.1574 − 0.4709i | −0.1295 − 0.4429i | −0.1371 − 0.5004i | −0.162 − 1.2706i |
| w62 | 111110 | −0.3867 − 0.1695i | −0.4504 − 0.1426i | −0.427 − 0.1484i | −0.7403 − 1.045i |
| w63 | 111111 | −0.3923 − 0.4332i | −0.4124 − 0.4207i | −0.406 − 0.4481i | −0.4693 − 1.1917i | wherein the bit labeling indicated in groups A, B and C may alternatively be inverted for one or more bit labels.

10. A transmission apparatus comprising:
a coding and modulation apparatus as claimed in claim 4 configured to encode and modulate input data into constellation values,
a converter configured to convert said constellation values into one or more transmission streams to be transmitted, and
a transmitter configured to transmit said one or more transmission streams.

11. The transmission apparatus as claimed in claim 10, further comprising processing circuitry configured to embed transmitter signalling information into the one or more transmission streams, said transmitter signalling information including one or more of a) the total number N of constellation points and the code rate R of a constellation used, b) an indication of the constellation used, and c) constellation points of a constellation used.

12. The transmission apparatus as claimed in claim 11, wherein a modulator is configured to select using a uniform constellation instead of one of said non-uniform constellations for modulating said cell words into constellation values, and
wherein said processing circuitry is configured to embed transmitter signalling information into the one or more transmission streams, said transmitter signalling information including constellation information indicating if a non-uniform constellation or a uniform constellation has been used for modulation.

13. The transmission apparatus as claimed in claim 11, wherein said processing circuitry is configured to embed said transmitter signalling information at the beginning of frames of a plurality of frames used for transmission of the one or more transmission streams.

14. A transmission method comprising:
a coding and modulation method as claimed in claim 9 that encodes and modulates input data into constellation values,
converting said constellation values into one or more transmission streams to be transmitted, and
transmitting said one or more transmission streams.

15. A demodulation and decoding apparatus comprising:
a demodulator configured to demodulate constellation values of a non-uniform constellation into cell words and to assign bit combinations to constellation values of the used non-uniform constellation, and
a decoder configured to decode cell words into output data according to a low density parity check code, LDPC, wherein said demodulator is configured to use, based on signalling information indicating a total number N of constellation points of a constellation and code rate R, i) a non-uniform constellation and hit labeling from a group A if N=16, or ii) a non-uniform constellation and hit labeling from a group B if N=32, or iii) a non-uniform constellation and hit labeling from a group C if N=64, or iv) a non-uniform constellation obtained from a constellation from anyone of groups A, B or C through rotation by an angle around an origin, through inversion of bit labels for all constellation points, through interchanging of hit positions, through mirroring on any line in a complex plane and/or through predistortion for the constellation points, wherein the constellation points are defined by a constellation position vector $w_0 \ldots w_{N-1}$, and wherein the constellation position vectors of the different constellations of the groups A, B or C of constellations are defined as follows:

A) 16-QAM non-uniform constellations of group A1:

| w | bit label | R = ½ (or ⅝ or ¾) | R = ⅝ (or ½ or ¾) | R = ¾ (or ½ or ⅝) |
|---|---|---|---|---|
| w0 | 0000 | 0.9236 + 0.3833i | 0.2885 + 0.2883i | 0.2989 + 0.3143i |
| w1 | 0001 | 0.9236 + 0.3833i | 1.085 + 0.3172i | 1.0877 + 0.2957i |
| w2 | 0010 | 0.3833 + 0.9236i | 0.3168 + 1.0851i | 0.2979 + 1.0872i |
| w3 | 0011 | 0.3833 + 0.9236i | 0.7973 + 0.8014i | 0.8007 + 0.7934i |
| w4 | 0100 | 0.9236 − 0.3833i | 0.2885 − 0.2883i | 0.2989 − 0.3143i |
| w5 | 0101 | 0.9236 − 0.3833i | 1.085 − 0.3172i | 1.0877 − 0.2957i |
| w6 | 0110 | 0.3833 − 0.9236i | 0.3168 − 1.0851i | 0.2979 − 1.0872i |
| w7 | 0111 | 0.3833 − 0.9236i | 0.7973 − 0.8014i | 0.8007 − 0.7934i |
| w8 | 1000 | −0.9236 + 0.3833i | −0.2885 + 0.2883i | −0.2989 + 0.3143i |
| w9 | 1001 | −0.9236 + 0.3833i | −1.085 + 0.3172i | −1.0877 + 0.2957i |
| w10 | 1010 | −0.3833 + 0.9236i | −0.3168 + 1.0851i | −0.2979 + 1.0872i |
| w11 | 1011 | −0.3833 + 0.9236i | −0.7973 + 0.8014i | −0.8007 + 0.7934i |
| w12 | 1100 | −0.9236 − 0.3833i | −0.2885 − 0.2883i | −0.2989 − 0.3143i |
| w13 | 1101 | −0.9236 − 0.3833i | −1.085 − 0.3172i | −1.0877 − 0.2957i |
| w14 | 1110 | −0.3833 − 0.9236i | −0.3168 − 1.0851i | −0.2979 − 1.0872i |
| w15 | 1111 | −0.3833 − 0.9236i | −0.7973 − 0.8014i | −0.8007 − 0.7934i | or group A3:

| w | bit label | R = ½ (or ⅝ or ¾) | R = ⅝ (or ½ or ¾) | R = ¾ (or ½ or ⅝) |
|---|---|---|---|---|
| w0 | 0000 | 0.8429 + 0.2537i | 0.4349 + 0.1989i | 0.9963 + 0.2925i |
| w1 | 0001 | 0.9864 + 0.7471i | 1.1973 + 0.4119i | 0.9109 + 0.9109i |
| w2 | 0010 | 0.2155 + 0.3413i | 0.2573 + 0.7061i | 0.3034 + 0.3034i |
| w3 | 0011 | 0.3772 + 1.1785i | 0.6759 + 1.0707i | 0.2925 + 0.9963i |
| w4 | 0100 | 0.8429 − 0.2537i | 0.4349 − 0.1989i | 0.9963 − 0.2925i |
| w5 | 0101 | 0.9864 − 0.7471i | 1.1973 − 0.4119i | 0.9109 − 0.9109i |
| w6 | 0110 | 0.2155 − 0.3413i | 0.2573 − 0.7061i | 0.3034 − 0.3034i |
| w7 | 0111 | 0.3772 − 1.1785i | 0.6759 − 1.0707i | 0.2925 − 0.9963i |
| w8 | 1000 | −0.8429 + 0.2537i | −0.4349 + 0.1989i | −0.9963 + 0.2925i |
| w9 | 1001 | −0.9864 + 0.7471i | −1.1973 + 0.4119i | −0.9109 + 0.9109i |
| w10 | 1010 | −0.2155 + 0.3413i | −0.2573 + 0.7061i | −0.3034 + 0.3034i |
| w11 | 1011 | −0.3772 + 1.1785i | −0.6759 + 1.0707i | −0.2925 + 0.9963i |
| w12 | 1100 | −0.8429 − 0.2537i | −0.4349 − 0.1989i | −0.9963 − 0.2925i |
| w13 | 1101 | −0.9864 − 0.7471i | −1.1973 − 0.4119i | −0.9109 − 0.9109i |
| w14 | 1110 | −0.2155 − 0.3413i | −0.2573 − 0.7061i | −0.3034 − 0.3034i |
| w15 | 1111 | −0.3772 − 1.1785i | −0.6759 − 1.0707i | −0.2925 − 0.9963i |

B) 32-QAM non-uniform constellations of group B1:

| w | bit label | R = ½ (or ⅝ or ¾ or ¹³⁄₁₆) | R = ⅝ (or ½ or ¾ or ¹³⁄₁₆) | R = ¾ (or ½ or ⅝ or ¹³⁄₁₆) | R = ¹³⁄₁₆ (or ½ or ⅝ or ¾) |
|---|---|---|---|---|---|
| w0 | 00000 | 1.0304 + 0.444i | 1.0971 + 0.18i | 1.1563 + 0.2084i | 1.146 + 0.1942i |
| w1 | 00001 | 1.1103 + 0.1616i | 0.4907 + 0.2208i | 0.6667 + 0.2352i | 1.0305 + 0.5389i |
| w2 | 00010 | 0.8946 + 0.6772i | 1.02 + 0.4423i | 1.039 + 0.5484i | 0.6951 + 0.233i |
| w3 | 00011 | 0.4346 + 0.2063i | 0.8817 + 0.6772i | 0.8367 + 0.8248i | 0.8267 + 0.8177i |
| w4 | 00100 | 0.4202 + 1.0404i | 0.18 + 1.0971i | 0.2126 + 0.6666i | 0.2293 + 0.7058i |
| w5 | 00101 | 0.1661 + 1.1091i | 0.2211 + 0.4958i | 0.2344 + 0.2319i | 0.2086 + 1.144i |
| w6 | 00110 | 0.6736 + 0.8966i | 0.4431 + 1.0196i | 0.1868 + 1.16i | 0.2677 + 0.2828i |
| w7 | 00111 | 0.1981 + 0.4223i | 0.6778 + 0.8812i | 0.5438 + 1.0415i | 0.5548 + 1.0221i |
| w8 | 01000 | 1.0304 − 0.444i | 1.0971 − 0.18i | 1.1563 − 0.2084i | 1.146 − 0.1942i |
| w9 | 01001 | 1.1103 − 0.1616i | 0.4907 − 0.2208i | 0.6667 − 0.2352i | 1.0305 − 0.5389i |
| w10 | 01010 | 0.8946 − 0.6772i | 1.02 − 0.4423i | 1.039 − 0.5484i | 0.6951 − 0.233i |
| w11 | 01011 | 0.4346 − 0.2063i | 0.8817 − 0.6772i | 0.8367 − 0.8248i | 0.8267 − 0.8177i |
| w12 | 01100 | 0.4202 − 1.0404i | 0.18 − 1.0971i | 0.2126 − 0.6666i | 0.2293 − 0.7058i |
| w13 | 01101 | 0.1661 − 1.1091i | 0.2211 − 0.4958i | 0.2344 − 0.2319i | 0.2086 − 1.144i |
| w14 | 01110 | 0.6736 − 0.8966i | 0.4431 − 1.0196i | 0.1868 − 1.16i | 0.2677 − 0.2828i |
| w15 | 01111 | 0.1981 − 0.4223i | 0.6778 − 0.8812i | 0.5438 − 1.0415i | 0.5548 − 1.0221i |
| w16 | 10000 | −1.0304 + 0.444i | −1.0971 + 0.18i | −1.1563 + 0.2084i | −1.146 + 0.1942i |
| w17 | 10001 | −1.1103 + 0.1616i | −0.4907 + 0.2208i | −0.6667 + 0.2352i | −1.0305 + 0.5389i |
| w18 | 10010 | −0.8946 + 0.6772i | −1.02 + 0.4423i | −1.039 + 0.5484i | −0.6951 + 0.233i |
| w19 | 10011 | −0.4346 + 0.2063i | −0.8817 + 0.6772i | −0.8367 + 0.8248i | −0.8267 + 0.8177i |
| w20 | 10100 | −0.4202 + 1.0404i | −0.18 + 1.0971i | −0.2126 + 0.6666i | −0.2293 + 0.7058i |
| w21 | 10101 | −0.1661 + 1.1091i | −0.2211 + 0.4958i | −0.2344 + 0.2319i | −0.2086 + 1.144i |
| w22 | 10110 | −0.6736 + 0.8966i | −0.4431 + 1.0196i | −0.1868 + 1.16i | −0.2677 + 0.2828i |
| w23 | 10111 | −0.1981 + 0.4223i | −0.6778 + 0.8812i | −0.5438 + 1.0415i | −0.5548 + 1.0221i |
| w24 | 11000 | −1.0304 − 0.444i | −1.0971 − 0.18i | −1.1563 − 0.2084i | −1.146 − 0.1942i |
| w25 | 11001 | −1.1103 − 0.1616i | −0.4907 − 0.2208i | −0.6667 − 0.2352i | −1.0305 − 0.5389i |
| w26 | 11010 | −0.8946 − 0.6772i | −1.02 − 0.4423i | −1.039 − 0.5484i | −0.6951 − 0.233i |
| w27 | 11011 | −0.4346 − 0.2063i | −0.8817 − 0.6772i | −0.8367 − 0.8248i | −0.8267 − 0.8177i |
| w28 | 11100 | −0.4202 − 1.0404i | −0.18 − 1.0971i | −0.2126 − 0.6666i | −0.2293 − 0.7058i |
| w29 | 11101 | −0.1661 − 1.1091i | −0.2211 − 0.4958i | −0.2344 − 0.2319i | −0.2086 − 1.144i |
| w30 | 11110 | −0.6736 − 0.8966i | −0.4431 − 1.0196i | −0.1868 − 1.16i | −0.2677 − 0.2828i |
| w31 | 11111 | −0.1981 − 0.4223i | −0.6778 − 0.8812i | −0.5438 − 1.0415i | −0.5548 − 1.0221i | or group B3:

| w | bit label | R = ½ (or ⅝ or ¾ or ¹³⁄₁₆) | R = ⅝ (or ½ or ¾ or ¹³⁄₁₆) | R = ¾ (or ½ or ⅝ or ¹³⁄₁₆) | R = ¹³⁄₁₆ (or ½ or ⅝ or ¾) |
|---|---|---|---|---|---|
| w0 | 00000 | 0.6588 + 0.2335i | 0.6258 + 0.171i | 0.7734 + 0.1898i | 0.2229 + 0.2243i |
| w1 | 00001 | 1.152 + 0.1943i | 1.1753 + 0.2181i | 1.1905 + 0.2491i | 0.7488 + 0.1887i |
| w2 | 00010 | 0.8934 + 0.7527i | 0.2219 + 0.2216i | 0.6881 + 0.5652i | 0.6173 + 1.0647i |
| w3 | 00011 | 1.0419 + 0.5284i | 1.0354 + 0.5975i | 0.9811 + 0.7188i | 1.2067 + 0.242i |
| w4 | 00100 | 0.2537 + 0.3006i | 0.1925 + 1.1798i | 0.2475 + 0.2277i | 0.2183 + 0.7125i |
| w5 | 00101 | 0.1583 + 0.7127i | 0.5389 + 1.067i | 0.2041 + 1.199i | 0.6249 + 0.5473i |
| w6 | 00110 | 0.6045 + 0.9997i | 0.2194 + 0.6207i | 0.2562 + 0.6908i | 0.2129 + 1.2121i |
| w7 | 00111 | 0.25 + 1.1412i | 0.7778 + 0.8523i | 0.6044 + 1.0554i | 1.0247 + 0.6815i |
| w8 | 01000 | 0.6588 − 0.2335i | 0.6258 − 0.171i | 0.7734 − 0.1898i | 0.2229 − 0.2243i |
| w9 | 01001 | 1.152 − 0.1943i | 1.1753 − 0.2181i | 1.1905 − 0.2491i | 0.7488 − 0.1887i |
| w10 | 01010 | 0.8934 − 0.7527i | 0.2219 − 0.2216i | 0.6881 − 0.5652i | 0.6173 − 1.0647i |
| w11 | 01011 | 1.0419 − 0.5284i | 1.0354 − 0.5975i | 0.9811 − 0.7188i | 1.2067 − 0.242i |
| w12 | 01100 | 0.2537 − 0.3006i | 0.1925 − 1.1798i | 0.2475 − 0.2277i | 0.2183 − 0.7125i |
| w13 | 01101 | 0.1583 − 0.7127i | 0.5389 − 1.067i | 0.2041 − 1.199i | 0.6249 − 0.5473i |
| w14 | 01110 | 0.6045 − 0.9997i | 0.2194 − 0.6207i | 0.2562 − 0.6908i | 0.2129 − 1.2121i |
| w15 | 01111 | 0.25 − 1.1412i | 0.7778 − 0.8523i | 0.6044 − 1.0554i | 1.0247 − 0.6815i |
| w16 | 10000 | −0.6588 + 0.2335i | −0.6258 + 0.171i | −0.7734 + 0.1898i | −0.2229 + 0.2243i |
| w17 | 10001 | −1.152 + 0.1943i | −1.1753 + 0.2181i | −1.1905 + 0.2491i | −0.7488 + 0.1887i |
| w18 | 10010 | −0.8934 + 0.7527i | −0.2219 + 0.2216i | −0.6881 + 0.5652i | −0.6173 + 1.0647i |
| w19 | 10011 | −1.0419 + 0.5284i | −1.0354 + 0.5975i | −0.9811 + 0.7188i | −1.2067 + 0.242i |
| w20 | 10100 | −0.2537 + 0.3006i | −0.1925 + 1.1798i | −0.2475 + 0.2277i | −0.2183 + 0.7125i |
| w21 | 10101 | −0.1583 + 0.7127i | −0.5389 + 1.067i | −0.2041 + 1.199i | −0.6249 + 0.5473i |
| w22 | 10110 | −0.6045 + 0.9997i | −0.2194 + 0.6207i | −0.2562 + 0.6908i | −0.2129 + 1.2121i |
| w23 | 10111 | −0.25 + 1.1412i | −0.7778 + 0.8523i | −0.6044 + 1.0554i | −1.0247 + 0.6815i |
| w24 | 11000 | −0.6588 − 0.2335i | −0.6258 − 0.171i | −0.7734 − 0.1898i | −0.2229 − 0.2243i |
| w25 | 11001 | −1.152 − 0.1943i | −1.1753 − 0.2181i | −1.1905 − 0.2491i | −0.7488 − 0.1887i |
| w26 | 11010 | −0.8934 − 0.7527i | −0.2219 − 0.2216i | −0.6881 − 0.5652i | −0.6173 − 1.0647i |
| w27 | 11011 | −1.0419 − 0.5284i | −1.0354 − 0.5975i | −0.9811 − 0.7188i | −1.2067 − 0.242i |
| w28 | 11100 | −0.2537 − 0.3006i | −0.1925 − 1.1798i | −0.2475 − 0.2277i | −0.2183 − 0.7125i |
| w29 | 11101 | −0.1583 − 0.7127i | −0.5389 − 1.067i | −0.2041 − 1.199i | −0.6249 − 0.5473i |
| w30 | 11110 | −0.6045 − 0.9997i | −0.2194 − 0.6207i | −0.2562 − 0.6908i | −0.2129 − 1.2121i |
| w31 | 11111 | −0.25 − 1.1412i | −0.7778 − 0.8523i | −0.6044 − 1.0554i | −1.0247 − 0.6815i |

C) 64-QAM non-uniform constellations of group C1:

| w | bit label | R = ½ (or ⅝ or ¾ or ¹³⁄₁₆) | R = ⅝ (or ½ or ¾ or ¹³⁄₁₆) | R = ¾ (or ½ or ⅝ or ¹³⁄₁₆) | R = ¹³⁄₁₆ (or ½ or ⅝ or ¾) |
|---|---|---|---|---|---|
| w0 | 000000 | 0.2287 + 0.5143i | 0.1978 + 0.198i | 1.0605 + 0.5953i | 0.873 + 0.8874i |
| w1 | 000001 | 0.2116 + 1.0918i | 0.1916 + 1.1985i | 0.1796 + 0.4943i | 1.0395 + 0.6848i |
| w2 | 000010 | 0.2828 + 0.5535i | 0.4969 + 0.1984i | 0.7562 + 0.4956i | 0.6726 + 1.0474i |
| w3 | 000011 | 0.214 + 1.0888i | 0.4757 + 1.1166i | 0.4954 + 0.5126i | 0.6771 + 0.6619i |
| w4 | 000100 | 0.6913 + 0.8711i | 0.1862 + 0.5083i | 1.1574 + 0.3735i | 1.2358 + 0.1495i |
| w5 | 000101 | 0.461 + 1.012i | 0.171 + 0.8428i | 0.1887 + 0.1816i | 1.1669 + 0.4334i |
| w6 | 000110 | 0.6929 + 0.8697i | 0.479 + 0.5257i | 0.8128 + 0.199i | 0.8923 + 0.1387i |
| w7 | 000111 | 0.4624 + 1.0114i | 0.4272 + 0.8201i | 0.5012 + 0.183i | 0.8067 + 0.404i |
| w8 | 001000 | 0.3191 + 0.2057i | 1.1727 + 0.3125i | 0.9378 + 0.7743i | 0.1465 + 1.2361i |
| w9 | 001001 | 1.0956 + 0.1876i | 1.2022 + 0.1671i | 0.1694 + 0.8236i | 0.1412 + 0.8899i |
| w10 | 001010 | 0.5092 + 0.2494i | 0.7798 + 0.2035i | 0.7911 + 0.9225i | 0.4261 + 1.1695i |
| w11 | 001011 | 1.093 + 0.2006i | 0.6806 + 1.0049i | 0.4477 + 0.779i | 0.413 + 0.7955i |
| w12 | 001100 | 0.8876 + 0.67i | 1.0766 + 0.5604i | 1.2059 + 0.157i | 0.1641 + 0.164i |
| w13 | 001101 | 1.0256 + 0.4299i | 0.9914 + 0.7003i | 0.1661 + 1.2048i | 0.1442 + 0.5197i |
| w14 | 001110 | 0.8899 + 0.6666i | 0.7425 + 0.5068i | 0.6275 + 1.0418i | 0.5218 + 0.1427i |
| w15 | 001111 | 1.0227 + 0.4368i | 0.8329 + 0.8826i | 0.4264 + 1.1388i | 0.4324 + 0.4339i |
| w16 | 010000 | 0.2287 − 0.5143i | 0.1978 − 0.198i | 1.0605 − 0.5953i | 0.873 − 0.8874i |
| w17 | 010001 | 0.2116 − 1.0918i | 0.1916 − 1.1985i | 0.1796 − 0.4943i | 1.0395 − 0.6848i |
| w18 | 010010 | 0.2828 − 0.5535i | 0.4969 − 0.1984i | 0.7562 − 0.4956i | 0.6726 − 1.0474i |
| w19 | 010011 | 0.214 − 1.0888i | 0.4757 − 1.1166i | 0.4954 − 0.5126i | 0.6771 − 0.6619i |
| w20 | 010100 | 0.6913 − 0.8711i | 0.1862 − 0.5083i | 1.1574 − 0.3735i | 1.2358 − 0.1495i |
| w21 | 010101 | 0.461 − 1.012i | 0.171 − 0.8428i | 0.1887 − 0.1816i | 1.1669 − 0.4334i |
| w22 | 010110 | 0.6929 − 0.8697i | 0.479 − 0.5257i | 0.8128 − 0.199i | 0.8923 − 0.1387i |
| w23 | 010111 | 0.4624 − 1.0114i | 0.4272 − 0.8201i | 0.5012 − 0.183i | 0.8067 − 0.404i |
| w24 | 011000 | 0.3191 − 0.2057i | 1.1727 − 0.3125i | 0.9378 − 0.7743i | 0.1465 − 1.2361i |
| w25 | 011001 | 1.0956 − 0.1876i | 1.2022 − 0.1671i | 0.1694 − 0.8236i | 0.1412 − 0.8899i |
| w26 | 011010 | 0.5092 − 0.2494i | 0.7798 − 0.2035i | 0.7911 − 0.9225i | 0.4261 − 1.1695i |
| w27 | 011011 | 1.093 − 0.2006i | 0.6806 − 1.0049i | 0.4477 − 0.779i | 0.413 − 0.7955i |
| w28 | 011100 | 0.8876 − 0.67i | 1.0766 − 0.5604i | 1.2059 − 0.157i | 0.1641 − 0.164i |
| w29 | 011101 | 1.0256 − 0.4299i | 0.9914 − 0.7003i | 0.1661 − 1.2048i | 0.1442 − 0.5197i |
| w30 | 011110 | 0.8899 − 0.6666i | 0.7425 − 0.5068i | 0.6275 − 1.0418i | 0.5218 − 0.1427i |
| w31 | 011111 | 1.0227 − 0.4368i | 0.8329 − 0.8826i | 0.4264 − 1.1388i | 0.4324 − 0.4339i |
| w32 | 100000 | −0.2287 + 0.5143i | −0.1978 + 0.198i | −1.0605 + 0.5953i | −0.873 + 0.8874i |
| w33 | 100001 | −0.2116 + 1.0918i | −0.1916 + 1.1985i | −0.1796 + 0.4943i | −1.0395 + 0.6848i |
| w34 | 100010 | −0.2828 + 0.5535i | −0.4969 + 0.1984i | −0.7562 + 0.4956i | −0.6726 + 1.0474i |
| w35 | 100011 | −0.214 + 1.0888i | −0.4757 + 1.1166i | −0.4954 + 0.5126i | −0.6771 + 0.6619i |
| w36 | 100100 | −0.6913 + 0.8711i | −0.1862 + 0.5083i | −1.1574 + 0.3735i | −1.2358 + 0.1495i |
| w37 | 100101 | −0.461 + 1.012i | −0.171 + 0.8428i | −0.1887 + 0.1816i | −1.1669 + 0.4334i |
| w38 | 100110 | −0.6929 + 0.8697i | −0.479 + 0.5257i | −0.8128 + 0.199i | −0.8923 + 0.1387i |
| w39 | 100111 | −0.4624 + 1.0114i | −0.4272 + 0.8201i | −0.5012 + 0.183i | −0.8067 + 0.404i |
| w40 | 101000 | −0.3191 + 0.2057i | −1.1727 + 0.3125i | −0.9378 + 0.7743i | −0.1465 + 1.2361i |
| w41 | 101001 | −1.0956 + 0.1876i | −1.2022 + 0.1671i | −0.1694 + 0.8236i | −0.1412 + 0.8899i |
| w42 | 101010 | −0.5092 + 0.2494i | −0.7798 + 0.2035i | −0.7911 + 0.9225i | −0.4261 + 1.1695i |
| w43 | 101011 | −1.093 + 0.2006i | −0.6806 + 1.0049i | −0.4477 + 0.779i | −0.413 + 0.7955i |
| w44 | 101100 | −0.8876 + 0.67i | −1.0766 + 0.5604i | −1.2059 + 0.157i | −0.1641 + 0.164i |
| w45 | 101101 | −1.0256 + 0.4299i | −0.9914 + 0.7003i | −0.1661 + 1.2048i | −0.1442 + 0.5197i |
| w46 | 101110 | −0.8899 + 0.6666i | −0.7425 + 0.5068i | −0.6275 + 1.0418i | −0.5218 + 0.1427i |
| w47 | 101111 | −1.0227 + 0.4368i | −0.8329 + 0.8826i | −0.4264 + 1.1388i | −0.4324 + 0.4339i |
| w48 | 110000 | −0.2287 − 0.5143i | −0.1978 − 0.198i | −1.0605 − 0.5953i | −0.873 − 0.8874i |
| w49 | 110001 | −0.2116 − 1.0918i | −0.1916 − 1.1985i | −0.1796 − 0.4943i | −1.0395 − 0.6848i |
| w50 | 110010 | −0.2828 − 0.5535i | −0.4969 − 0.1984i | −0.7562 − 0.4956i | −0.6726 − 1.0474i |
| w51 | 110011 | −0.214 − 1.0888i | −0.4757 − 1.1166i | −0.4954 − 0.5126i | −0.6771 − 0.6619i |
| w52 | 110100 | −0.6913 − 0.8711i | −0.1862 − 0.5083i | −1.1574 − 0.3735i | −1.2358 − 0.1495i |
| w53 | 110101 | −0.461 − 1.012i | −0.171 − 0.8428i | −0.1887 − 0.1816i | −1.1669 − 0.4334i |
| w54 | 110110 | −0.6929 − 0.8697i | −0.479 − 0.5257i | −0.8128 − 0.199i | −0.8923 − 0.1387i |
| w55 | 110111 | −0.4624 − 1.0114i | −0.4272 − 0.8201i | −0.5012 − 0.183i | −0.8067 − 0.404i |
| w56 | 111000 | −0.3191 − 0.2057i | −1.1727 − 0.3125i | −0.9378 − 0.7743i | −0.1465 − 1.2361i |
| w57 | 111001 | −1.0956 − 0.1876i | −1.2022 − 0.1671i | −0.1694 − 0.8236i | −0.1412 − 0.8899i |
| w58 | 111010 | −0.5092 − 0.2494i | −0.7798 − 0.2035i | −0.7911 − 0.9225i | −0.4261 − 1.1695i |
| w59 | 111011 | −1.093 − 0.2006i | −0.6806 − 1.0049i | −0.4477 − 0.779i | −0.413 − 0.7955i |
| w60 | 111100 | −0.8876 − 0.67i | −1.0766 − 0.5604i | −1.2059 − 0.157i | −0.1641 − 0.164i |
| w61 | 111101 | −1.0256 − 0.4299i | −0.9914 − 0.7003i | −0.1661 − 1.2048i | −0.1442 − 0.5197i |
| w62 | 111110 | −0.8899 − 0.6666i | −0.7425 − 0.5068i | −0.6275 − 1.0418i | −0.5218 − 0.1427i |
| w63 | 111111 | −1.0227 − 0.4368i | −0.8329 − 0.8826i | −0.4264 − 1.1388i | −0.4324 − 0.4339i | or group C2:

| w | bit label | R = ½ (or ⅝ or ¾ or ¹³⁄₁₆) | R = ⅝ (or ½ or ¾ or ¹³⁄₁₆) | R = ¾ (or ½ or ⅝ or ¹³⁄₁₆) | R = ¹³⁄₁₆ (or ½ or ⅝ or ¾) |
|---|---|---|---|---|---|
| w0 | 000000 | 0.1298 + 0.2084i | 0.3328 + 0.1665i | 0.9596 + 0.4358i | 1.022 + 0.4536i |
| w1 | 000001 | 0.1883 + 1.3627i | 0.5435 + 1.2609i | 0.1328 + 0.5092i | 0.1374 + 0.4738i |
| w2 | 000010 | 0.217 + 0.4464i | 0.1217 + 0.1744i | 0.6561 + 0.4543i | 0.6985 + 0.4499i |

-continued

| w | bit label | R = ½ (or ⅝ or ¾ or ¹³⁄₁₆) | R = ⅝ (or ½ or ¾ or ¹³⁄₁₆) | R = ¾ (or ½ or ⅝ or ¹³⁄₁₆) | R = ¹³⁄₁₆ (or ½ or ⅝ or ¾) |
|---|---|---|---|---|---|
| w3 | 000011 | 0.1269 + 0.764i | 0.1904 + 1.3623i | 0.3855 + 0.4909i | 0.413 + 0.4891i |
| w4 | 000100 | 0.7986 + 1.12i | 0.3528 + 0.4894i | 0.9773 + 0.1483i | 1.0021 + 0.1484i |
| w5 | 000101 | 0.4538 + 1.1748i | 0.4073 + 0.8478i | 0.1256 + 0.1724i | 0.1339 + 0.1575i |
| w6 | 000110 | 0.4822 + 0.6563i | 0.1288 + 0.5124i | 0.6457 + 0.1512i | 0.6852 + 0.1497i |
| w7 | 000111 | 0.3148 + 0.8326i | 0.1465 + 0.8935i | 0.3703 + 0.1633i | 0.4014 + 0.1605i |
| w8 | 001000 | 0.2328 + 0.1185i | 0.5998 + 0.1505i | 1.2035 + 0.6663i | 1.147 + 0.7594i |
| w9 | 001001 | 1.3637 + 0.1808i | 0.8781 + 1.0589i | 0.1492 + 0.8611i | 0.1479 + 0.8049i |
| w10 | 001010 | 0.4762 + 0.2045i | 0.9411 + 0.1492i | 0.7306 + 0.7613i | 0.7571 + 0.7595i |
| w11 | 001011 | 0.827 + 0.1328i | 1.3582 + 0.218i | 0.4377 + 0.8492i | 0.4503 + 0.8438i |
| w12 | 001100 | 1.0652 + 0.8657i | 0.6339 + 0.4545i | 1.3574 + 0.2231i | 1.3596 + 0.2095i |
| w13 | 001101 | 1.262 + 0.5438i | 0.7138 + 0.7632i | 0.1858 + 1.2632i | 0.1659 + 1.1736i |
| w14 | 001110 | 0.6765 + 0.4967i | 0.9294 + 0.4189i | 0.9009 + 1.0396i | 0.841 + 1.0885i |
| w15 | 001111 | 0.8548 + 0.3591i | 1.1995 + 0.6617i | 0.5564 + 1.2461i | 0.5064 + 1.2593i |
| w16 | 010000 | 0.1298 − 0.2084i | 0.3328 − 0.1665i | 0.9596 − 0.4358i | 1.022 − 0.4536i |
| w17 | 010001 | 0.1883 − 1.3627i | 0.5435 − 1.2609i | 0.1328 − 0.5092i | 0.1374 − 0.4738i |
| w18 | 010010 | 0.217 − 0.4464i | 0.1217 − 0.1744i | 0.6561 − 0.4543i | 0.6985 − 0.4499i |
| w19 | 010011 | 0.1269 − 0.764i | 0.1904 − 1.3623i | 0.3855 − 0.4909i | 0.413 − 0.4891i |
| w20 | 010100 | 0.7986 − 1.12i | 0.3528 − 0.4894i | 0.9773 − 0.1483i | 1.0021 − 0.1484i |
| w21 | 010101 | 0.4538 − 1.1748i | 0.4073 − 0.8478i | 0.1256 − 0.1724i | 0.1339 − 0.1575i |
| w22 | 010110 | 0.4822 − 0.6563i | 0.1288 − 0.5124i | 0.6457 − 0.1512i | 0.6852 − 0.1497i |
| w23 | 010111 | 0.3148 − 0.8326i | 0.1465 − 0.8935i | 0.3703 − 0.1633i | 0.4014 − 0.1605i |
| w24 | 011000 | 0.2328 − 0.1185i | 0.5998 − 0.1505i | 1.2035 − 0.6663i | 1.147 − 0.7594i |
| w25 | 011001 | 1.3637 − 0.1808i | 0.8781 − 1.0589i | 0.1492 − 0.8611i | 0.1479 − 0.8049i |
| w26 | 011010 | 0.4762 − 0.2045i | 0.9411 − 0.1492i | 0.7306 − 0.7613i | 0.7571 − 0.7595i |
| w27 | 011011 | 0.827 − 0.1328i | 1.3582 − 0.218i | 0.4377 − 0.8492i | 0.4503 − 0.8438i |
| w28 | 011100 | 1.0652 − 0.8657i | 0.6339 − 0.4545i | 1.3574 − 0.2231i | 1.3596 − 0.2095i |
| w29 | 011101 | 1.262 − 0.5438i | 0.7138 − 0.7632i | 0.1858 − 1.2632i | 0.1659 − 1.1736i |
| w30 | 011110 | 0.6765 − 0.4967i | 0.9294 − 0.4189i | 0.9009 − 1.0396i | 0.841 − 1.0885i |
| w31 | 011111 | 0.8548 − 0.3591i | 1.1995 − 0.6617i | 0.5564 − 1.2461i | 0.5064 − 1.2593i |
| w32 | 100000 | −0.1298 + 0.2084i | −0.3328 + 0.1665i | −0.9596 + 0.4358i | −1.022 + 0.4536i |
| w33 | 100001 | −0.1883 + 1.3627i | −0.5435 + 1.2609i | −0.1328 + 0.5092i | −0.1374 + 0.4738i |
| w34 | 100010 | −0.217 + 0.4464i | −0.1217 + 0.1744i | −0.6561 + 0.4543i | −0.6985 + 0.4499i |
| w35 | 100011 | −0.1269 + 0.764i | −0.1904 + 1.3623i | −0.3855 + 0.4909i | −0.413 + 0.4891i |
| w36 | 100100 | −0.7986 + 1.12i | −0.3528 + 0.4894i | −0.9773 + 0.1483i | −1.0021 + 0.1484i |
| w37 | 100101 | −0.4538 + 1.1748i | −0.4073 + 0.8478i | −0.1256 + 0.1724i | −0.1339 + 0.1575i |
| w38 | 100110 | −0.4822 + 0.6563i | −0.1288 + 0.5124i | −0.6457 + 0.1512i | −0.6852 + 0.1497i |
| w39 | 100111 | −0.3148 + 0.8326i | −0.1465 + 0.8935i | −0.3703 + 0.1633i | −0.4014 + 0.1605i |
| w40 | 101000 | −0.2328 + 0.1185i | −0.5998 + 0.1505i | −1.2035 + 0.6663i | −1.147 + 0.7594i |
| w41 | 101001 | −1.3637 + 0.1808i | −0.8781 + 1.0589i | −0.1492 + 0.8611i | −0.1479 + 0.8049i |
| w42 | 101010 | −0.4762 + 0.2045i | −0.9411 + 0.1492i | −0.7306 + 0.7613i | −0.7571 + 0.7595i |
| w43 | 101011 | −0.827 + 0.1328i | −1.3582 + 0.218i | −0.4377 + 0.8492i | −0.4503 + 0.8438i |
| w44 | 101100 | −1.0652 + 0.8657i | −0.6339 + 0.4545i | −1.3574 + 0.2231i | −1.3596 + 0.2095i |
| w45 | 101101 | −1.262 + 0.5438i | −0.7138 + 0.7632i | −0.1858 + 1.2632i | −0.1659 + 1.1736i |
| w46 | 101110 | −0.6765 + 0.4967i | −0.9294 + 0.4189i | −0.9009 + 1.0396i | −0.841 + 1.0885i |
| w47 | 101111 | −0.8548 + 0.3591i | −1.1995 + 0.6617i | −0.5564 + 1.2461i | −0.5064 + 1.2593i |
| w48 | 110000 | −0.1298 − 0.2084i | −0.3328 − 0.1665i | −0.9596 − 0.4358i | −1.022 − 0.4536i |
| w49 | 110001 | −0.1883 − 1.3627i | −0.5435 − 1.2609i | −0.1328 − 0.5092i | −0.1374 − 0.4738i |
| w50 | 110010 | −0.217 − 0.4464i | −0.1217 − 0.1744i | −0.6561 − 0.4543i | −0.6985 − 0.4499i |
| w51 | 110011 | −0.1269 − 0.764i | −0.1904 − 1.3623i | −0.3855 − 0.4909i | −0.413 − 0.4891i |
| w52 | 110100 | −0.7986 − 1.12i | −0.3528 − 0.4894i | −0.9773 − 0.1483i | −1.0021 − 0.1484i |
| w53 | 110101 | −0.4538 − 1.1748i | −0.4073 − 0.8478i | −0.1256 − 0.1724i | −0.1339 − 0.1575i |
| w54 | 110110 | −0.4822 − 0.6563i | −0.1288 − 0.5124i | −0.6457 − 0.1512i | −0.6852 − 0.1497i |
| w55 | 110111 | −0.3148 − 0.8326i | −0.1465 − 0.8935i | −0.3703 − 0.1633i | −0.4014 − 0.1605i |
| w56 | 111000 | −0.2328 − 0.1185i | −0.5998 − 0.1505i | −1.2035 − 0.6663i | −1.147 − 0.7594i |
| w57 | 111001 | −1.3637 − 0.1808i | −0.8781 − 1.0589i | −0.1492 − 0.8611i | −0.1479 − 0.8049i |
| w58 | 111010 | −0.4762 − 0.2045i | −0.9411 − 0.1492i | −0.7306 − 0.7613i | −0.7571 − 0.7595i |
| w59 | 111011 | −0.827 − 0.1328i | −1.3582 − 0.218i | −0.4377 − 0.8492i | −0.4503 − 0.8438i |
| w60 | 111100 | −1.0652 − 0.8657i | −0.6339 − 0.4545i | −1.3574 − 0.2231i | −1.3596 − 0.2095i |
| w61 | 111101 | −1.262 − 0.5438i | −0.7138 − 0.7632i | −0.1858 − 1.2632i | −0.1659 − 1.1736i |
| w62 | 111110 | −0.6765 − 0.4967i | −0.9294 − 0.4189i | −0.9009 − 1.0396i | −0.841 − 1.0885i |
| w63 | 111111 | −0.8548 − 0.3591i | −1.1995 − 0.6617i | −0.5564 − 1.2461i | −0.5064 − 1.2593i | or group C3:

| w | bit label | R = ½ (or ⅝ or ¾ or ¹³⁄₁₆) | R = ⅝ (or ½ or ¾ or ¹³⁄₁₆) | R = ¾ (or ½ or ⅝ or ¹³⁄₁₆) | R = ¹³⁄₁₆ (or ½ or ⅝ or ¾) |
|---|---|---|---|---|---|
| w0 | 000000 | 1.0569 + 0.7089i | 0.8757 + 0.9247i | 0.937 + 0.8841i | 1.1723 + 0.5141i |
| w1 | 000001 | 1.0841 + 0.6678i | 1.045 + 0.728i | 1.1063 + 0.6601i | 0.1476 + 0.5364i |
| w2 | 000010 | 0.819 + 0.9734i | 0.7024 + 1.0623i | 0.7126 + 1.0729i | 0.7669 + 0.4573i |
| w3 | 000011 | 0.7389 + 0.713i | 0.6854 + 0.6748i | 0.649 + 0.7077i | 0.4449 + 0.4829i |
| w4 | 000100 | 1.2554 + 0.2142i | 1.2615 + 0.1746i | 1.2781 + 0.1604i | 1.004 + 0.174i |
| w5 | 000101 | 1.2348 + 0.3103i | 1.1831 + 0.4706i | 1.0791 + 0.3764i | 0.1371 + 0.1864i |

-continued

| w | bit label | R = ½ (or ⅝ or ¾ or ¹³⁄₁₆) | R = ⅝ (or ½ or ¾ or ¹³⁄₁₆) | R = ¾ (or ½ or ⅝ or ¹³⁄₁₆) | R = ¹³⁄₁₆ (or ½ or ⅝ or ¾) |
|---|---|---|---|---|---|
| w6 | 000110 | 0.7562 + 0.1721i | 0.8301 + 0.1381i | 0.7714 + 0.1301i | 0.7139 + 0.1521i |
| w7 | 000111 | 0.7451 + 0.3181i | 0.7748 + 0.3978i | 0.7335 + 0.4268i | 0.4208 + 0.1616i |
| w8 | 001000 | 0.2187 + 1.2529i | 0.1636 + 1.263i | 0.1553 + 1.2788i | 1.0216 + 0.771i |
| w9 | 001001 | 0.1608 + 0.8472i | 0.1378 + 0.8233i | 0.1327 + 0.8728i | 0.1431 + 0.9083i |
| w10 | 001010 | 0.5502 + 1.1466i | 0.446 + 1.1929i | 0.4463 + 1.2084i | 0.7237 + 0.7521i |
| w11 | 001011 | 0.4217 + 0.7827i | 0.3922 + 0.7613i | 0.3935 + 0.8156i | 0.4251 + 0.8248i |
| w12 | 001100 | 0.1479 + 0.17i | 0.1453 + 0.1451i | 0.1358 + 0.1626i | 1.2711 + 0.1575i |
| w13 | 001101 | 0.1574 + 0.4709i | 0.1295 + 0.4429i | 0.1371 + 0.5004i | 0.162 + 1.2706i |
| w14 | 001110 | 0.3867 + 0.1695i | 0.4504 + 0.1426i | 0.427 + 0.1484i | 0.7403 + 1.045i |
| w15 | 001111 | 0.3923 + 0.4332i | 0.4124 + 0.4207i | 0.406 + 0.4481i | 0.4693 + 1.1917i |
| w16 | 010000 | 1.0569 − 0.7089i | 0.8757 − 0.9247i | 0.937 − 0.8841i | 1.1723 − 0.5141i |
| w17 | 010001 | 1.0841 − 0.6678i | 1.045 − 0.728i | 1.1063 − 0.6601i | 0.1476 − 0.5364i |
| w18 | 010010 | 0.819 − 0.9734i | 0.7024 − 1.0623i | 0.7126 − 1.0729i | 0.7669 − 0.4573i |
| w19 | 010011 | 0.7389 − 0.713i | 0.6854 − 0.6748i | 0.649 − 0.7077i | 0.4449 − 0.4829i |
| w20 | 010100 | 1.2554 − 0.2142i | 1.2615 − 0.1746i | 1.2781 − 0.1604i | 1.004 − 0.174i |
| w21 | 010101 | 1.2348 − 0.3103i | 1.1831 − 0.4706i | 1.0791 − 0.3764i | 0.1371 − 0.1864i |
| w22 | 010110 | 0.7562 − 0.1721i | 0.8301 − 0.1381i | 0.7714 − 0.1301i | 0.7139 − 0.1521i |
| w23 | 010111 | 0.7451 − 0.3181i | 0.7748 − 0.3978i | 0.7335 − 0.4268i | 0.4208 − 0.1616i |
| w24 | 011000 | 0.2187 − 1.2529i | 0.1636 − 1.263i | 0.1553 − 1.2788i | 1.0216 − 0.771i |
| w25 | 011001 | 0.1608 − 0.8472i | 0.1378 − 0.8233i | 0.1327 − 0.8728i | 0.1431 − 0.9083i |
| w26 | 011010 | 0.5502 − 1.1466i | 0.446 − 1.1929i | 0.4463 − 1.2084i | 0.7237 − 0.7521i |
| w27 | 011011 | 0.4217 − 0.7827i | 0.3922 − 0.7613i | 0.3935 − 0.8156i | 0.4251 − 0.8248i |
| w28 | 011100 | 0.1479 − 0.17i | 0.1453 − 0.1451i | 0.1358 − 0.1626i | 1.2711 − 0.1575i |
| w29 | 011101 | 0.1574 − 0.4709i | 0.1295 − 0.4429i | 0.1371 − 0.5004i | 0.162 − 1.2706i |
| w30 | 011110 | 0.3867 − 0.1695i | 0.4504 − 0.1426i | 0.427 − 0.1484i | 0.7403 − 1.045i |
| w31 | 011111 | 0.3923 − 0.4332i | 0.4124 − 0.4207i | 0.406 − 0.4481i | 0.4693 − 1.1917i |
| w32 | 100000 | −1.0569 + 0.7089i | −0.8757 + 0.9247i | −0.937 + 0.8841i | −1.1723 + 0.5141i |
| w33 | 100001 | −1.0841 + 0.6678i | −1.045 + 0.728i | −1.1063 + 0.6601i | −0.1476 + 0.5364i |
| w34 | 100010 | −0.819 + 0.9734i | −0.7024 + 1.0623i | −0.7126 + 1.0729i | −0.7669 + 0.4573i |
| w35 | 100011 | −0.7389 + 0.713i | −0.6854 + 0.6748i | −0.649 + 0.7077i | −0.4449 + 0.4829i |
| w36 | 100100 | −1.2554 + 0.2142i | −1.2615 + 0.1746i | −1.2781 + 0.1604i | −1.004 + 0.174i |
| w37 | 100101 | −1.2348 + 0.3103i | −1.1831 + 0.4706i | −1.0791 + 0.3764i | −0.1371 + 0.1864i |
| w38 | 100110 | −0.7562 + 0.1721i | −0.8301 + 0.1381i | −0.7714 + 0.1301i | −0.7139 + 0.1521i |
| w39 | 100111 | −0.7451 + 0.3181i | −0.7748 + 0.3978i | −0.7335 + 0.4268i | −0.4208 + 0.1616i |
| w40 | 101000 | −0.2187 + 1.2529i | −0.1636 + 1.263i | −0.1553 + 1.2788i | −1.0216 + 0.771i |
| w41 | 101001 | −0.1608 + 0.8472i | −0.1378 + 0.8233i | −0.1327 + 0.8728i | −0.1431 + 0.9083i |
| w42 | 101010 | −0.5502 + 1.1466i | −0.446 + 1.1929i | −0.4463 + 1.2084i | −0.7237 + 0.7521i |
| w43 | 101011 | −0.4217 + 0.7827i | −0.3922 + 0.7613i | −0.3935 + 0.8156i | −0.4251 + 0.8248i |
| w44 | 101100 | −0.1479 + 0.17i | −0.1453 + 0.1451i | −0.1358 + 0.1626i | −1.2711 + 0.1575i |
| w45 | 101101 | −0.1574 + 0.4709i | −0.1295 + 0.4429i | −0.1371 + 0.5004i | −0.162 + 1.2706i |
| w46 | 101110 | −0.3867 + 0.1695i | −0.4504 + 0.1426i | −0.427 + 0.1484i | −0.7403 + 1.045i |
| w47 | 101111 | −0.3923 + 0.4332i | −0.4124 + 0.4207i | −0.406 + 0.4481i | −0.4693 + 1.1917i |
| w48 | 110000 | −1.0569 − 0.7089i | −0.8757 − 0.9247i | −0.937 − 0.8841i | −1.1723 − 0.5141i |
| w49 | 110001 | −1.0841 − 0.6678i | −1.045 − 0.728i | −1.1063 − 0.6601i | −0.1476 − 0.5364i |
| w50 | 110010 | −0.819 − 0.9734i | −0.7024 − 1.0623i | −0.7126 − 1.0729i | −0.7669 − 0.4573i |
| w51 | 110011 | −0.7389 − 0.713i | −0.6854 − 0.6748i | −0.649 − 0.7077i | −0.4449 − 0.4829i |
| w52 | 110100 | −1.2554 − 0.2142i | −1.2615 − 0.1746i | −1.2781 − 0.1604i | −1.004 − 0.174i |
| w53 | 110101 | −1.2348 − 0.3103i | −1.1831 − 0.4706i | −1.0791 − 0.3764i | −0.1371 − 0.1864i |
| w54 | 110110 | −0.7562 − 0.1721i | −0.8301 − 0.1381i | −0.7714 − 0.1301i | −0.7139 − 0.1521i |
| w55 | 110111 | −0.7451 − 0.3181i | −0.7748 − 0.3978i | −0.7335 − 0.4268i | −0.4208 − 0.1616i |
| w56 | 111000 | −0.2187 − 1.2529i | −0.1636 − 1.263i | −0.1553 − 1.2788i | −1.0216 − 0.771i |
| w57 | 111001 | −0.1608 − 0.8472i | −0.1378 − 0.8233i | −0.1327 − 0.8728i | −0.1431 − 0.9083i |
| w58 | 111010 | −0.5502 − 1.1466i | −0.446 − 1.1929i | −0.4463 − 1.2084i | −0.7237 − 0.7521i |
| w59 | 111011 | −0.4217 − 0.7827i | −0.3922 − 0.7613i | −0.3935 − 0.8156i | −0.4251 − 0.8248i |
| w60 | 111100 | −0.1479 − 0.17i | −0.1453 − 0.1451i | −0.1358 − 0.1626i | −1.2711 − 0.1575i |
| w61 | 111101 | −0.1574 − 0.4709i | −0.1295 − 0.4429i | −0.1371 − 0.5004i | −0.162 − 1.2706i |
| w62 | 111110 | −0.3867 − 0.1695i | −0.4504 − 0.1426i | −0.427 − 0.1484i | −0.7403 − 1.045i |
| w63 | 111111 | −0.3923 − 0.4332i | −0.4124 − 0.4207i | −0.406 − 0.4481i | −0.4693 − 1.1917i | wherein the bit labeling indicated in groups A, B and C may alternatively be inverted for one or more bit labels.

16. A demodulation and decoding method. comprising:

demodulating constellation values of a non-uniform constellation into cell words and assigning bit combinations to constellation values of the used non-uniform constellation, and decoding cell words into output data according to a low density parity check code, LDPC, wherein said demodulating is configured to use, based on signalling information indicating a total number N of constellation points of a constellation and the code rate R, i) a non-uniform constellation and hit labeling from a group A if N=16, or ii) a non-uniform constellation and hit labeling from a group B if N=32, or iii) a non-uniform constellation and hit labeling from a group C if N=64, or iv) a non-uniform constellation obtained from a constellation from anyone of groups A, B or C through rotation by an angle around an origin, through inversion of bit labels for all constellation points, through interchanging of bit positions, through mirroring on any line in a complex plane and/or through predistortion for the constellation points, wherein the constellation points are defined by a constellation position vector $w_0 \ldots w_{N-1}$, and wherein the constellation position vectors of the different constellations of the groups A, B or C of constellations are defined as follows:

A) 16-QAM non-uniform constellations of group A1:

| w | bit label | R = ½ (or ⅝ or ¾) | R = ⅝ (or ½ or ¾) | R = ¾ (or ½ or ⅝) |
|---|---|---|---|---|
| w0 | 0000 | 0.9236 + 0.3833i | 0.2885 + 0.2883i | 0.2989 + 0.3143i |
| w1 | 0001 | 0.9236 + 0.3833i | 1.085 + 0.3172i | 1.0877 + 0.2957i |
| w2 | 0010 | 0.3833 + 0.9236i | 0.3168 + 1.0851i | 0.2979 + 1.0872i |
| w3 | 0011 | 0.3833 + 0.9236i | 0.7973 + 0.8014i | 0.8007 + 0.7934i |
| w4 | 0100 | 0.9236 − 0.3833i | 0.2885 − 0.2883i | 0.2989 − 0.3143i |
| w5 | 0101 | 0.9236 − 0.3833i | 1.085 − 0.3172i | 1.0877 − 0.2957i |
| w6 | 0110 | 0.3833 − 0.9236i | 0.3168 − 1.0851i | 0.2979 − 1.0872i |
| w7 | 0111 | 0.3833 − 0.9236i | 0.7973 − 0.8014i | 0.8007 − 0.7934i |
| w8 | 1000 | −0.9236 + 0.3833i | −0.2885 + 0.2883i | −0.2989 + 0.3143i |
| w9 | 1001 | −0.9236 + 0.3833i | −1.085 + 0.3172i | −1.0877 + 0.2957i |
| w10 | 1010 | −0.3833 + 0.9236i | −0.3168 + 1.0851i | −0.2979 + 1.0872i |
| w11 | 1011 | −0.3833 + 0.9236i | −0.7973 + 0.8014i | −0.8007 + 0.7934i |
| w12 | 1100 | −0.9236 − 0.3833i | −0.2885 − 0.2883i | −0.2989 − 0.3143i |
| w13 | 1101 | −0.9236 − 0.3833i | −1.085 − 0.3172i | −1.0877 − 0.2957i |
| w14 | 1110 | −0.3833 − 0.9236i | −0.3168 − 1.0851i | −0.2979 − 1.0872i |
| w15 | 1111 | −0.3833 − 0.9236i | −0.7973 − 0.8014i | −0.8007 − 0.7934i | or group A3:

| w | bit label | R = ½ (or ⅝ or ¾) | R = ⅝ (or ½ or ¾) | R = ¾ (or ½ or ⅝) |
|---|---|---|---|---|
| w0 | 0000 | 0.8429 + 0.2537i | 0.4349 + 0.1989i | 0.9963 + 0.2925i |
| w1 | 0001 | 0.9864 + 0.7471i | 1.1973 + 0.4119i | 0.9109 + 0.9109i |
| w2 | 0010 | 0.2155 + 0.3413i | 0.2573 + 0.7061i | 0.3034 + 0.3034i |
| w3 | 0011 | 0.3772 + 1.1785i | 0.6759 + 1.0707i | 0.2925 + 0.9963i |
| w4 | 0100 | 0.8429 − 0.2537i | 0.4349 − 0.1989i | 0.9963 − 0.2925i |
| w5 | 0101 | 0.9864 − 0.7471i | 1.1973 − 0.4119i | 0.9109 − 0.9109i |
| w6 | 0110 | 0.2155 − 0.3413i | 0.2573 − 0.7061i | 0.3034 − 0.3034i |
| w7 | 0111 | 0.3772 − 1.1785i | 0.6759 − 1.0707i | 0.2925 − 0.9963i |
| w8 | 1000 | −0.8429 + 0.2537i | −0.4349 + 0.1989i | −0.9963 + 0.2925i |
| w9 | 1001 | −0.9864 + 0.7471i | −1.1973 + 0.4119i | −0.9109 + 0.9109i |
| w10 | 1010 | −0.2155 + 0.3413i | −0.2573 + 0.7061i | −0.3034 + 0.3034i |
| w11 | 1011 | −0.3772 + 1.1785i | −0.6759 + 1.0707i | −0.2925 + 0.9963i |
| w12 | 1100 | −0.8429 − 0.2537i | −0.4349 − 0.1989i | −0.9963 − 0.2925i |
| w13 | 1101 | −0.9864 − 0.7471i | −1.1973 − 0.4119i | −0.9109 − 0.9109i |
| w14 | 1110 | −0.2155 − 0.3413i | −0.2573 − 0.7061i | −0.3034 − 0.3034i |
| w15 | 1111 | −0.3772 − 1.1785i | −0.6759 − 1.0707i | −0.2925 − 0.9963i |

B) 32-QAM non-uniform constellations of roup B1:

| w | bit label | R = ½ (or ⅝ or ¾ or 13/16) | R = ⅝ (or ½ or ¾ or 13/16) | R = ¾ (or ½ or ⅝ or 13/16) | R = 13/16 (or ½ or ⅝ or ¾) |
|---|---|---|---|---|---|
| w0 | 00000 | 1.0304 + 0.444i | 1.0971 + 0.18i | 1.1563 + 0.2084i | 1.146 + 0.1942i |
| w1 | 00001 | 1.1103 + 0.1616i | 0.4907 + 0.2208i | 0.6667 + 0.2352i | 1.0305 + 0.5389i |
| w2 | 00010 | 0.8946 + 0.6772i | 1.02 + 0.4423i | 1.039 + 0.5484i | 0.6951 + 0.233i |
| w3 | 00011 | 0.4346 + 0.2063i | 0.8817 + 0.6772i | 0.8367 + 0.8248i | 0.8267 + 0.8177i |
| w4 | 00100 | 0.4202 + 1.0404i | 0.18 + 1.0971i | 0.2126 + 0.6666i | 0.2293 + 0.7058i |
| w5 | 00101 | 0.1661 + 1.1091i | 0.2211 + 0.4958i | 0.2344 + 0.2319i | 0.2086 + 1.144i |
| w6 | 00110 | 0.6736 + 0.8966i | 0.4431 + 1.0196i | 0.1868 + 1.16i | 0.2677 + 0.2828i |
| w7 | 00111 | 0.1981 + 0.4223i | 0.6778 + 0.8812i | 0.5438 + 1.0415i | 0.5548 + 1.0221i |
| w8 | 01000 | 1.0304 − 0.444i | 1.0971 − 0.18i | 1.1563 − 0.2084i | 1.146 − 0.1942i |
| w9 | 01001 | 1.1103 − 0.1616i | 0.4907 − 0.2208i | 0.6667 − 0.2352i | 1.0305 − 0.5389i |
| w10 | 01010 | 0.8946 − 0.6772i | 1.02 − 0.4423i | 1.039 − 0.5484i | 0.6951 − 0.233i |
| w11 | 01011 | 0.4346 − 0.2063i | 0.8817 − 0.6772i | 0.8367 − 0.8248i | 0.8267 − 0.8177i |
| w12 | 01100 | 0.4202 − 1.0404i | 0.18 − 1.0971i | 0.2126 − 0.6666i | 0.2293 − 0.7058i |
| w13 | 01101 | 0.1661 − 1.1091i | 0.2211 − 0.4958i | 0.2344 − 0.2319i | 0.2086 − 1.144i |
| w14 | 01110 | 0.6736 − 0.8966i | 0.4431 − 1.0196i | 0.1868 − 1.16i | 0.2677 − 0.2828i |
| w15 | 01111 | 0.1981 − 0.4223i | 0.6778 − 0.8812i | 0.5438 − 1.0415i | 0.5548 − 1.0221i |
| w16 | 10000 | −1.0304 + 0.444i | −1.0971 + 0.18i | −1.1563 + 0.2084i | −1.146 + 0.1942i |
| w17 | 10001 | −1.1103 + 0.1616i | −0.4907 + 0.2208i | −0.6667 + 0.2352i | −1.0305 + 0.5389i |
| w18 | 10010 | −0.8946 + 0.6772i | −1.02 + 0.4423i | −1.039 + 0.5484i | −0.6951 + 0.233i |
| w19 | 10011 | −0.4346 + 0.2063i | −0.8817 + 0.5777i | −0.8367 + 0.8248i | −0.8267 + 0.8177i |

-continued

| w | bit label | R = ½ (or ⅝ or ¾ or 13/16) | R = ⅝ (or ½ or ¾ or 13/16) | R = ¾ (or ½ or ⅝ or 13/16) | R = 13/16 (or ½ or ⅝ or ¾) |
|---|---|---|---|---|---|
| w20 | 10100 | −0.4202 + 1.0404i | −0.18 + 1.0971i | −0.2126 + 0.6666i | −0.2293 + 0.7058i |
| w21 | 10101 | −0.1661 + 1.1091i | −0.2211 + 0.4958i | −0.2344 + 0.2319i | −0.2086 + 1.144i |
| w22 | 10110 | −0.6736 + 0.8966i | −0.4431 + 1.0196i | −0.1868 + 1.16i | −0.2677 + 0.2828i |
| w23 | 10111 | −0.1981 + 0.4223i | −0.6778 + 0.8812i | −0.5438 + 1.0415i | −0.5548 + 1.0221i |
| w24 | 11000 | −1.0304 − 0.444i | −1.0971 − 0.18i | −1.1563 − 0.2084i | −1.146 − 0.1942i |
| w25 | 11001 | −1.1103 − 0.1616i | −0.4907 − 0.2208i | −0.6667 − 0.2352i | −1.0305 − 0.5389i |
| w26 | 11010 | −0.8946 − 0.6772i | −1.02 − 0.4423i | −1.039 − 0.5484i | −0.6951 − 0.233i |
| w27 | 11011 | −0.4346 − 0.2063i | −0.8817 − 0.6772i | −0.8367 − 0.8248i | −0.8267 − 0.8177i |
| w28 | 11100 | −0.4202 − 1.0404i | −0.18 − 1.0971i | −0.2126 − 0.6666i | −0.2293 − 0.7058i |
| w29 | 11101 | −0.1661 − 1.1091i | −0.2211 − 0.4958i | −0.2344 − 0.2319i | −0.2086 − 1.144i |
| w30 | 11110 | −0.6736 − 0.8966i | −0.4431 − 1.0196i | −0.1868 − 1.16i | −0.2677 − 0.2828i |
| w31 | 11111 | −0.1981 − 0.4223i | −0.6778 − 0.8812i | −0.5438 − 1.0415i | −0.5548 − 1.0221i | or group B3:

| w | bit label | R = ½ (or ⅝ or ¾ or 13/16) | R = ⅝ (or ½ or ¾ or 13/16) | R = ¾ (or ½ or ⅝ or 13/16) | R = 13/16 (or ½ or ⅝ or ¾) |
|---|---|---|---|---|---|
| w0 | 00000 | 0.6588 + 0.2335i | 0.6258 + 0.171i | 0.7734 + 0.1898i | 0.2229 + 0.2243i |
| w1 | 00001 | 1.152 + 0.1943i | 1.1753 + 0.2181i | 1.1905 + 0.2491i | 0.7488 + 0.1887i |
| w2 | 00010 | 0.8934 + 0.7527i | 0.2219 + 0.2216i | 0.6881 + 0.5652i | 0.6173 + 1.0647i |
| w3 | 00011 | 1.0419 + 0.5284i | 1.0354 + 0.5975i | 0.9811 + 0.7188i | 1.2067 + 0.242i |
| w4 | 00100 | 0.2537 + 0.3006i | 0.1925 + 1.1798i | 0.2475 + 0.2277i | 0.2183 + 0.7125i |
| w5 | 00101 | 0.1583 + 0.7127i | 0.5389 + 1.067i | 0.2041 + 1.199i | 0.6249 + 0.5473i |
| w6 | 00110 | 0.6045 + 0.9997i | 0.2194 + 0.6207i | 0.2562 + 0.6908i | 0.2129 + 1.2121i |
| w7 | 00111 | 0.25 + 1.1412i | 0.7778 + 0.8523i | 0.6044 + 1.0554i | 1.0247 + 0.6815i |
| w8 | 01000 | 0.6588 − 0.2335i | 0.6258 − 0.171i | 0.7734 − 0.1898i | 0.2229 − 0.2243i |
| w9 | 01001 | 1.152 − 0.1943i | 1.1753 − 0.2181i | 1.1905 − 0.2491i | 0.7488 − 0.1887i |
| w10 | 01010 | 0.8934 − 0.7527i | 0.2219 − 0.2216i | 0.6881 − 0.5652i | 0.6173 − 1.0647i |
| w11 | 01011 | 1.0419 − 0.5284i | 1.0354 − 0.5975i | 0.9811 − 0.7188i | 1.2067 − 0.242i |
| w12 | 01100 | 0.2537 − 0.3006i | 0.1925 − 1.1798i | 0.2475 − 0.2277i | 0.2183 − 0.7125i |
| w13 | 01101 | 0.1583 − 0.7127i | 0.5389 − 1.067i | 0.2041 − 1.199i | 0.6249 − 0.5473i |
| w14 | 01110 | 0.6045 − 0.9997i | 0.2194 − 0.6207i | 0.2562 − 0.6908i | 0.2129 − 1.2121i |
| w15 | 01111 | 0.25 − 1.1412i | 0.7778 − 0.8523i | 0.6044 − 1.0554i | 1.0247 − 0.6815i |
| w16 | 10000 | −0.6588 + 0.2335i | −0.6258 + 0.171i | −0.7734 + 0.1898i | −0.2229 + 0.2243i |
| w17 | 10001 | −1.152 + 0.1943i | −1.1753 + 0.2181i | −1.1905 + 0.2491i | −0.7488 + 0.1887i |
| w18 | 10010 | −0.8934 + 0.7527i | −0.2219 + 0.2216i | −0.6881 + 0.5652i | −0.6173 + 1.0647i |
| w19 | 10011 | −1.0419 + 0.5284i | −1.0354 + 0.5975i | −0.9811 + 0.7188i | −1.2067 + 0.242i |
| w20 | 10100 | −0.2537 + 0.3006i | −0.1925 + 1.1798i | −0.2475 + 0.2277i | −0.2183 + 0.7125i |
| w21 | 10101 | −0.1583 + 0.7127i | −0.5389 + 1.067i | −0.2041 + 1.199i | −0.6249 + 0.5473i |
| w22 | 10110 | −0.6045 + 0.9997i | −0.2194 + 0.6207i | −0.2562 + 0.6908i | −0.2129 + 1.2121i |
| w23 | 10111 | −0.25 + 1.1412i | −0.7778 + 0.8523i | −0.6044 + 1.0554i | −1.0247 + 0.6815i |
| w24 | 11000 | −0.6588 − 0.2335i | −0.6258 − 0.171i | −0.7734 − 0.1898i | −0.2229 − 0.2243i |
| w25 | 11001 | −1.152 − 0.1943i | −1.1753 − 0.2181i | −1.1905 − 0.2491i | −0.7488 − 0.1887i |
| w26 | 11010 | −0.8934 − 0.7527i | −0.2219 − 0.2216i | −0.6881 − 0.5652i | −0.6173 − 1.0647i |
| w27 | 11011 | −1.0419 − 0.5284i | −1.0354 − 0.5975i | −0.9811 − 0.7188i | −1.2067 − 0.242i |
| w28 | 11100 | −0.2537 − 0.3006i | −0.1925 − 1.1798i | −0.2475 − 0.2277i | −0.2183 − 0.7125i |
| w29 | 11101 | −0.1583 − 0.7127i | −0.5389 − 1.067i | −0.2041 − 1.199i | −0.6249 − 0.5473i |
| w30 | 11110 | −0.6045 − 0.9997i | −0.2194 − 0.6207i | −0.2562 − 0.6908i | −0.2129 − 1.2121i |
| w31 | 11111 | −0.25 − 1.1412i | −0.7778 − 0.8523i | −0.6044 − 1.0554i | −1.0247 − 0.6815i |

C) 64-QAM non-uniform constellations of group C1:

| w | bit label | R = ½ (or ⅝ or ¾ or 13/16) | R = ⅝ (or ½ or ¾ or 13/16) | R = ¾ (or ½ or ⅝ or 13/16) | R = 13/16 (or ½ or ⅝ or ¾) |
|---|---|---|---|---|---|
| w0 | 000000 | 0.2287 + 0.5143i | 0.1978 + 0.198i | 1.0605 + 0.5953i | 0.873 + 0.8874i |
| w1 | 000001 | 0.2116 + 1.0918i | 0.1916 + 1.1985i | 0.1796 + 0.4943i | 1.0395 + 0.6848i |
| w2 | 000010 | 0.2828 + 0.5535i | 0.4969 + 0.1984i | 0.7562 + 0.4956i | 0.6726 + 1.0474i |
| w3 | 000011 | 0.214 + 1.0888i | 0.4757 + 1.1166i | 0.4954 + 0.5126i | 0.6771 + 0.6619i |
| w4 | 000100 | 0.6913 + 0.8711i | 0.1862 + 0.5083i | 1.1574 + 0.3735i | 1.2358 + 0.1495i |
| w5 | 000101 | 0.461 + 1.012i | 0.171 + 0.8428i | 0.1887 + 0.1816i | 1.1669 + 0.4334i |
| w6 | 000110 | 0.6929 + 0.8697i | 0.479 + 0.5257i | 0.8128 + 0.199i | 0.8923 + 0.1387i |
| w7 | 000111 | 0.4624 + 1.0114i | 0.4272 + 0.8201i | 0.5012 + 0.183i | 0.8067 + 0.404i |
| w8 | 001000 | 0.3191 + 0.2057i | 1.1727 + 0.3125i | 0.9378 + 0.7743i | 0.1465 + 1.2361i |
| w9 | 001001 | 1.0956 + 0.1876i | 1.2022 + 0.1671i | 0.1694 + 0.8236i | 0.1412 + 0.8899i |
| w10 | 001010 | 0.5092 + 0.2494i | 0.7798 + 0.2035i | 0.7911 + 0.9225i | 0.4261 + 1.1695i |
| w11 | 001011 | 1.093 + 0.2006i | 0.6806 + 1.0049i | 0.4477 + 0.779i | 0.413 + 0.7955i |
| w12 | 001100 | 0.8876 + 0.67i | 1.0766 + 0.5604i | 1.2059 + 0.157i | 0.1641 + 0.164i |
| w13 | 001101 | 1.0256 + 0.4299i | 0.9914 + 0.7003i | 0.1661 + 1.2048i | 0.1442 + 0.5197i |

-continued

| w | bit label | R = ½ (or ⅝ or ¾ or ¹³/₁₆) | R = ⅝ (or ½ or ¾ or ¹³/₁₆) | R = ¾ (or ½ or ⅝ or ¹³/₁₆) | R = ¹³/₁₆ (or ½ or ⅝ or ¾) |
|---|---|---|---|---|---|
| w14 | 001110 | 0.8899 + 0.6666i | 0.7425 + 0.5068i | 0.6275 + 1.0418i | 0.5218 + 0.1427i |
| w15 | 001111 | 1.0227 + 0.4368i | 0.8329 + 0.8826i | 0.4264 + 1.1388i | 0.4324 + 0.4339i |
| w16 | 010000 | 0.2287 − 0.5143i | 0.1978 − 0.198i | 1.0605 − 0.5953i | 0.873 − 0.8874i |
| w17 | 010001 | 0.2116 − 1.0918i | 0.1916 − 1.1985i | 0.1796 − 0.4943i | 1.0395 − 0.6848i |
| w18 | 010010 | 0.2828 − 0.5535i | 0.4969 − 0.1984i | 0.7562 − 0.4956i | 0.6726 − 1.0474i |
| w19 | 010011 | 0.214 − 1.0888i | 0.4757 − 1.1166i | 0.4954 − 0.5126i | 0.6771 − 0.6619i |
| w20 | 010100 | 0.6913 − 0.8711i | 0.1862 − 0.5083i | 1.1574 − 0.3735i | 1.2358 − 0.1495i |
| w21 | 010101 | 0.461 − 1.012i | 0.171 − 0.8428i | 0.1887 − 0.1816i | 1.1669 − 0.4334i |
| w22 | 010110 | 0.6929 − 0.8697i | 0.479 − 0.5257i | 0.8128 − 0.199i | 0.8923 − 0.1387i |
| w23 | 010111 | 0.4624 − 1.0114i | 0.4272 − 0.8201i | 0.5012 − 0.183i | 0.8067 − 0.404i |
| w24 | 011000 | 0.3191 − 0.2057i | 1.1727 − 0.3125i | 0.9378 − 0.7743i | 0.1465 − 1.2361i |
| w25 | 011001 | 1.0956 − 0.1876i | 1.2022 − 0.1671i | 0.1694 − 0.8236i | 0.1412 − 0.8899i |
| w26 | 011010 | 0.5092 − 0.2494i | 0.7798 − 0.2035i | 0.7911 − 0.9225i | 0.4261 − 1.1695i |
| w27 | 011011 | 1.093 − 0.2006i | 0.6806 − 1.0049i | 0.4477 − 0.779i | 0.413 − 0.7955i |
| w28 | 011100 | 0.8876 − 0.67i | 1.0766 − 0.5604i | 1.2059 − 0.157i | 0.1641 − 0.164i |
| w29 | 011101 | 1.0256 − 0.4299i | 0.9914 − 0.7003i | 0.1661 − 1.2048i | 0.1442 − 0.5197i |
| w30 | 011110 | 0.8899 − 0.6666i | 0.7425 − 0.5068i | 0.6275 − 1.0418i | 0.5218 − 0.1427i |
| w31 | 011111 | 1.0227 − 0.4368i | 0.8329 − 0.8826i | 0.4264 − 1.1388i | 0.4324 − 0.4339i |
| w32 | 100000 | −0.2287 + 0.5143i | −0.1978 + 0.198i | −1.0605 + 0.5953i | −0.873 + 0.8874i |
| w33 | 100001 | −0.2116 + 1.0918i | −0.1916 + 1.1985i | −0.1796 + 0.4943i | −1.0395 + 0.6848i |
| w34 | 100010 | −0.2828 + 0.5535i | −0.4969 + 0.1984i | −0.7562 + 0.4956i | −0.6726 + 1.0474i |
| w35 | 100011 | −0.214 + 1.0888i | −0.4757 + 1.1166i | −0.4954 + 0.5126i | −0.6771 + 0.6619i |
| w36 | 100100 | −0.6913 + 0.8711i | −0.1862 + 0.5083i | −1.1574 + 0.3735i | −1.2358 + 0.1495i |
| w37 | 100101 | −0.461 + 1.012i | −0.171 + 0.8428i | −0.1887 + 0.1816i | −1.1669 + 0.4334i |
| w38 | 100110 | −0.6929 + 0.8697i | −0.479 + 0.5257i | −0.8128 + 0.199i | −0.8923 + 0.1387i |
| w39 | 100111 | −0.4624 + 1.0114i | −0.4272 + 0.8201i | −0.5012 + 0.183i | −0.8067 + 0.404i |
| w40 | 101000 | −0.3191 + 0.2057i | −1.1727 + 0.3125i | −0.9378 + 0.7743i | −0.1465 + 1.2361i |
| w41 | 101001 | −1.0956 + 0.1876i | −1.2022 + 0.1671i | −0.1694 + 0.8236i | −0.1412 + 0.8899i |
| w42 | 101010 | −0.5092 + 0.2494i | −0.7798 + 0.2035i | −0.7911 + 0.9225i | −0.4261 + 1.1695i |
| w43 | 101011 | −1.093 + 0.2006i | −0.6806 + 1.0049i | −0.4477 + 0.779i | −0.413 + 0.7955i |
| w44 | 101100 | −0.8876 + 0.67i | −1.0766 + 0.5604i | −1.2059 + 0.157i | −0.1641 + 0.164i |
| w45 | 101101 | −1.0256 + 0.4299i | −0.9914 + 0.7003i | −0.1661 + 1.2048i | −0.1442 + 0.5197i |
| w46 | 101110 | −0.8899 + 0.6666i | −0.7425 + 0.5068i | −0.6275 + 1.0418i | −0.5218 + 0.1427i |
| w47 | 101111 | −1.0227 + 0.4368i | −0.8329 + 0.8826i | −0.4264 + 1.1388i | −0.4324 + 0.4339i |
| w48 | 110000 | −0.2287 − 0.5143i | −0.1978 − 0.198i | −1.0605 − 0.5953i | −0.873 − 0.8874i |
| w49 | 110001 | −0.2116 − 1.0918i | −0.1916 − 1.1985i | −0.1796 − 0.4943i | −1.0395 − 0.6848i |
| w50 | 110010 | −0.2828 − 0.5535i | −0.4969 − 0.1984i | −0.7562 − 0.4956i | −0.6726 − 1.0474i |
| w51 | 110011 | −0.214 − 1.0888i | −0.4757 − 1.1166i | −0.4954 − 0.5126i | −0.6771 − 0.6619i |
| w52 | 110100 | −0.6913 − 0.8711i | −0.1862 − 0.5083i | −1.1574 − 0.3735i | −1.2358 − 0.1495i |
| w53 | 110101 | −0.461 − 1.012i | −0.171 − 0.8428i | −0.1887 − 0.1816i | −1.1669 − 0.4334i |
| w54 | 110110 | −0.6929 − 0.8697i | −0.479 − 0.5257i | −0.8128 − 0.199i | −0.8923 − 0.1387i |
| w55 | 110111 | −0.4624 − 1.0114i | −0.4272 − 0.8201i | −0.5012 − 0.183i | −0.8067 − 0.404i |
| w56 | 111000 | −0.3191 − 0.2057i | −1.1727 − 0.3125i | −0.9378 − 0.7743i | −0.1465 − 1.2361i |
| w57 | 111001 | −1.0956 − 0.1876i | −1.2022 − 0.1671i | −0.1694 − 0.8236i | −0.1412 − 0.8899i |
| w58 | 111010 | −0.5092 − 0.2494i | −0.7798 − 0.2035i | −0.7911 − 0.9225i | −0.4261 − 1.1695i |
| w59 | 111011 | −1.093 − 0.2006i | −0.6806 − 1.0049i | −0.4477 − 0.779i | −0.413 − 0.7955i |
| w60 | 111100 | −0.8876 − 0.67i | −1.0766 − 0.5604i | −1.2059 − 0.157i | −0.1641 − 0.164i |
| w61 | 111101 | −1.0256 − 0.4299i | −0.9914 − 0.7003i | −0.1661 − 1.2048i | −0.1442 − 0.5197i |
| w62 | 111110 | −0.8899 − 0.6666i | −0.7425 − 0.5068i | −0.6275 − 1.0418i | −0.5218 − 0.1427i |
| w63 | 111111 | −1.0227 − 0.4368i | −0.8329 − 0.8826i | −0.4264 − 1.1388i | −0.4324 − 0.4339i | or group C2:

| w | bit label | R = ½ (or ⅝ or ¾ or ¹³/₁₆) | R = ⅝ (or ½ or ¾ or ¹³/₁₆) | R = ¾ (or ½ or ⅝ or ¹³/₁₆) | R = ¹³/₁₆ (or ½ or ⅝ or ¾) |
|---|---|---|---|---|---|
| w0 | 000000 | 0.1298 + 0.2084i | 0.3328 + 0.1665i | 0.9596 + 0.4358i | 1.022 + 0.4536i |
| w1 | 000001 | 0.1883 + 1.3627i | 0.5435 + 1.2609i | 0.1328 + 0.5092i | 0.1374 + 0.4738i |
| w2 | 000010 | 0.217 + 0.4464i | 0.1217 + 0.1744i | 0.6561 + 0.4543i | 0.6985 + 0.4499i |
| w3 | 000011 | 0.1269 + 0.764i | 0.1904 + 1.3623i | 0.3855 + 0.4909i | 0.413 + 0.4891i |
| w4 | 000100 | 0.7986 + 1.12i | 0.3528 + 0.4894i | 0.9773 + 0.1483i | 1.0021 + 0.1484i |
| w5 | 000101 | 0.4538 + 1.1748i | 0.4073 + 0.8478i | 0.1256 + 0.1724i | 0.1339 + 0.1575i |
| w6 | 000110 | 0.4822 + 0.6563i | 0.1288 + 0.5124i | 0.6457 + 0.1512i | 0.6852 + 0.1497i |
| w7 | 000111 | 0.3148 + 0.8326i | 0.1465 + 0.8935i | 0.3703 + 0.1633i | 0.4014 + 0.1605i |
| w8 | 001000 | 0.2328 + 0.1185i | 0.5998 + 0.1505i | 1.2035 + 0.6663i | 1.147 + 0.7594i |
| w9 | 001001 | 1.3637 + 0.1808i | 0.8781 + 1.0589i | 0.1492 + 0.8611i | 0.1479 + 0.8049i |
| w10 | 001010 | 0.4762 + 0.2045i | 0.9411 + 0.1492i | 0.7306 + 0.7613i | 0.7571 + 0.7595i |
| w11 | 001011 | 0.827 + 0.1328i | 1.3582 + 0.218i | 0.4377 + 0.8492i | 0.4503 + 0.8438i |
| w12 | 001100 | 1.0652 + 0.8657i | 0.6339 + 0.4545i | 1.3574 + 0.2231i | 1.3596 + 0.2095i |
| w13 | 001101 | 1.262 + 0.5438i | 0.7138 + 0.7632i | 0.1858 + 1.2632i | 0.1659 + 1.1736i |
| w14 | 001110 | 0.6765 + 0.4967i | 0.9294 + 0.4189i | 0.9009 + 1.0396i | 0.841 + 1.0885i |
| w15 | 001111 | 0.8548 + 0.3591i | 1.1995 + 0.6617i | 0.5564 + 1.2461i | 0.5064 + 1.2593i |
| w16 | 010000 | 0.1298 − 0.2084i | 0.3328 − 0.1665i | 0.9596 − 0.4358i | 1.022 − 0.4536i |

-continued

| w | bit label | R = ½ (or ⅝ or ¾ or ¹³/₁₆) | R = ⅝ (or ½ or ¾ or ¹³/₁₆) | R = ¾ (or ½ or ⅝ or ¹³/₁₆) | R = ¹³/₁₆ (or ½ or ⅝ or ¾) |
|---|---|---|---|---|---|
| w17 | 010001 | 0.1883 − 1.3627i | 0.5435 − 1.2609i | 0.1328 − 0.5092i | 0.1374 − 0.4738i |
| w18 | 010010 | 0.217 − 0.4464i | 0.1217 − 0.1744i | 0.6561 − 0.4543i | 0.6985 − 0.4499i |
| w19 | 010011 | 0.1269 − 0.764i | 0.1904 − 1.3623i | 0.3855 − 0.4909i | 0.413 − 0.4891i |
| w20 | 010100 | 0.7986 − 1.12i | 0.3528 − 0.4894i | 0.9773 − 0.1483i | 1.0021 − 0.1484i |
| w21 | 010101 | 0.4538 − 1.1748i | 0.4073 − 0.8478i | 0.1256 − 0.1724i | 0.1339 − 0.1575i |
| w22 | 010110 | 0.4822 − 0.6563i | 0.1288 − 0.5124i | 0.6457 − 0.1512i | 0.6852 − 0.1497i |
| w23 | 010111 | 0.3148 − 0.8326i | 0.1465 − 0.8935i | 0.3703 − 0.1633i | 0.4014 − 0.1605i |
| w24 | 011000 | 0.2328 − 0.1185i | 0.5998 − 0.1505i | 1.2035 − 0.6663i | 1.147 − 0.7594i |
| w25 | 011001 | 1.3637 − 0.1808i | 0.8781 − 1.0589i | 0.1492 − 0.8611i | 0.1479 − 0.8049i |
| w26 | 011010 | 0.4762 − 0.2045i | 0.9411 − 0.1492i | 0.7306 − 0.7613i | 0.7571 − 0.7595i |
| w27 | 011011 | 0.827 − 0.1328i | 1.3582 − 0.218i | 0.4377 − 0.8492i | 0.4503 − 0.8438i |
| w28 | 011100 | 1.0652 − 0.8657i | 0.6339 − 0.4545i | 1.3574 − 0.2231i | 1.3596 − 0.2095i |
| w29 | 011101 | 1.262 − 0.5438i | 0.7138 − 0.7632i | 0.1858 − 1.2632i | 0.1659 − 1.1736i |
| w30 | 011110 | 0.6765 − 0.4967i | 0.9294 − 0.4189i | 0.9009 − 1.0396i | 0.841 − 1.0885i |
| w31 | 011111 | 0.8548 − 0.3591i | 1.1995 − 0.6617i | 0.5564 − 1.2461i | 0.5064 − 1.2593i |
| w32 | 100000 | −0.1298 + 0.2084i | −0.3328 + 0.1665i | −0.9596 + 0.4358i | −1.022 + 0.4536i |
| w33 | 100001 | −0.1883 + 1.3627i | −0.5435 + 1.2609i | −0.1328 + 0.5092i | −0.1374 + 0.4738i |
| w34 | 100010 | −0.217 + 0.4464i | −0.1217 + 0.1744i | −0.6561 + 0.4543i | −0.6985 + 0.4499i |
| w35 | 100011 | −0.1269 + 0.764i | −0.1904 + 1.3623i | −0.3855 + 0.4909i | −0.413 + 0.4891i |
| w36 | 100100 | −0.7986 + 1.12i | −0.3528 + 0.4894i | −0.9773 + 0.1483i | −1.0021 + 0.1484i |
| w37 | 100101 | −0.4538 + 1.1748i | −0.4073 + 0.8478i | −0.1256 + 0.1724i | −0.1339 + 0.1575i |
| w38 | 100110 | −0.4822 + 0.6563i | −0.1288 + 0.5124i | −0.6457 + 0.1512i | −0.6852 + 0.1497i |
| w39 | 100111 | −0.3148 + 0.8326i | −0.1465 + 0.8935i | −0.3703 + 0.1633i | −0.4014 + 0.1605i |
| w40 | 101000 | −0.2328 + 0.1185i | −0.5998 + 0.1505i | −1.2035 + 0.6663i | −1.147 + 0.7594i |
| w41 | 101001 | −1.3637 + 0.1808i | −0.8781 + 1.0589i | −0.1492 + 0.8611i | −0.1479 + 0.8049i |
| w42 | 101010 | −0.4762 + 0.2045i | −0.9411 + 0.1492i | −0.7306 + 0.7613i | −0.7571 + 0.7595i |
| w43 | 101011 | −0.827 + 0.1328i | −1.3582 + 0.218i | −0.4377 + 0.8492i | −0.4503 + 0.8438i |
| w44 | 101100 | −1.0652 + 0.8657i | −0.6339 + 0.4545i | −1.3574 + 0.2231i | −1.3596 + 0.2095i |
| w45 | 101101 | −1.262 + 0.5438i | −0.7138 + 0.7632i | −0.1858 + 1.2632i | −0.1659 + 1.1736i |
| w46 | 101110 | −0.6765 + 0.4967i | −0.9294 + 0.4189i | −0.9009 + 1.0396i | −0.841 + 1.0885i |
| w47 | 101111 | −0.8548 + 0.3591i | −1.1995 + 0.6617i | −0.5564 + 1.2461i | −0.5064 + 1.2593i |
| w48 | 110000 | −0.1298 − 0.2084i | −0.3328 − 0.1665i | −0.9596 − 0.4358i | −1.022 − 0.4536i |
| w49 | 110001 | −0.1883 − 1.3627i | −0.5435 − 1.2609i | −0.1328 − 0.5092i | −0.1374 − 0.4738i |
| w50 | 110010 | −0.217 − 0.4464i | −0.1217 − 0.1744i | −0.6561 − 0.4543i | −0.6985 − 0.4499i |
| w51 | 110011 | −0.1269 − 0.764i | −0.1904 − 1.3623i | −0.3855 − 0.4909i | −0.413 − 0.4891i |
| w52 | 110100 | −0.7986 − 1.12i | −0.3528 − 0.4894i | −0.9773 − 0.1483i | −1.0021 − 0.1484i |
| w53 | 110101 | −0.4538 − 1.1748i | −0.4073 − 0.8478i | −0.1256 − 0.1724i | −0.1339 − 0.1575i |
| w54 | 110110 | −0.4822 − 0.6563i | −0.1288 − 0.5124i | −0.6457 − 0.1512i | −0.6852 − 0.1497i |
| w55 | 110111 | −0.3148 − 0.8326i | −0.1465 − 0.8935i | −0.3703 − 0.1633i | −0.4014 − 0.1605i |
| w56 | 111000 | −0.2328 − 0.1185i | −0.5998 − 0.1505i | −1.2035 − 0.6663i | −1.147 − 0.7594i |
| w57 | 111001 | −1.3637 − 0.1808i | −0.8781 − 1.0589i | −0.1492 − 0.8611i | −0.1479 − 0.8049i |
| w58 | 111010 | −0.4762 − 0.2045i | −0.9411 − 0.1492i | −0.7306 − 0.7613i | −0.7571 − 0.7595i |
| w59 | 111011 | −0.827 − 0.1328i | −1.3582 − 0.218i | −0.4377 − 0.8492i | −0.4503 − 0.8438i |
| w60 | 111100 | −1.0652 − 0.8657i | −0.6339 − 0.4545i | −1.3574 − 0.2231i | −1.3596 − 0.2095i |
| w61 | 111101 | −1.262 − 0.5438i | −0.7138 − 0.7632i | −0.1858 − 1.2632i | −0.1659 − 1.1736i |
| w62 | 111110 | −0.6765 − 0.4967i | −0.9294 − 0.4189i | −0.9009 − 1.0396i | −0.841 − 1.0885i |
| w63 | 111111 | −0.8548 − 0.3591i | −1.1995 − 0.6617i | −0.5564 − 1.2461i | −0.5064 − 1.2593i | or group C3:

| w | bit label | R = ½ (or ⅝ or ¾ or ¹³/₁₆) | R = ⅝ (or ½ or ¾ or ¹³/₁₆) | R = ¾ (or ½ or ⅝ or ¹³/₁₆) | R = ¹³/₁₆ (or ½ or ⅝ or ¾) |
|---|---|---|---|---|---|
| w0 | 000000 | 1.0569 + 0.7089i | 0.8757 + 0.9247i | 0.937 + 0.8841i | 1.1723 + 0.5141i |
| w1 | 000001 | 1.0841 + 0.6678i | 1.045 + 0.728i | 1.1063 + 0.6601i | 0.1476 + 0.5364i |
| w2 | 000010 | 0.819 + 0.9734i | 0.7024 + 1.0623i | 0.7126 + 1.0729i | 0.7669 + 0.4573i |
| w3 | 000011 | 0.7389 + 0.713i | 0.6854 + 0.6748i | 0.649 + 0.7077i | 0.4449 + 0.4829i |
| w4 | 000100 | 1.2554 + 0.2142i | 1.2615 + 0.1746i | 1.2781 + 0.1604i | 1.004 + 0.174i |
| w5 | 000101 | 1.2348 + 0.3103i | 1.1831 + 0.4706i | 1.0791 + 0.3764i | 0.1371 + 0.1864i |
| w6 | 000110 | 0.7562 + 0.1721i | 0.8301 + 0.1381i | 0.7714 + 0.1301i | 0.7139 + 0.1521i |
| w7 | 000111 | 0.7451 + 0.3181i | 0.7748 + 0.3978i | 0.7335 + 0.4268i | 0.4208 + 0.1616i |
| w8 | 001000 | 0.2187 + 1.2529i | 0.1636 + 1.263i | 0.1553 + 1.2788i | 1.0216 + 0.771i |
| w9 | 001001 | 0.1608 + 0.8472i | 0.1378 + 0.8233i | 0.1327 + 0.8728i | 0.1431 + 0.9083i |
| w10 | 001010 | 0.5502 + 1.1466i | 0.446 + 1.1929i | 0.4463 + 1.2084i | 0.7237 + 0.7521i |
| w11 | 001011 | 0.4217 + 0.7827i | 0.3922 + 0.7613i | 0.3935 + 0.8156i | 0.4251 + 0.8248i |
| w12 | 001100 | 0.1479 + 0.17i | 0.1453 + 0.1451i | 0.1358 + 0.1626i | 1.2711 + 0.1575i |
| w13 | 001101 | 0.1574 + 0.4709i | 0.1295 + 0.4429i | 0.1371 + 0.5004i | 0.162 + 1.2706i |
| w14 | 001110 | 0.3867 + 0.1695i | 0.4504 + 0.1426i | 0.427 + 0.1484i | 0.7403 + 1.045i |
| w15 | 001111 | 0.3923 + 0.4332i | 0.4124 + 0.4207i | 0.406 + 0.4481i | 0.4693 + 1.1917i |
| w16 | 010000 | 1.0569 − 0.7089i | 0.8757 − 0.9247i | 0.937 − 0.8841i | 1.1723 − 0.5141i |
| w17 | 010001 | 1.0841 − 0.6678i | 1.045 − 0.728i | 1.1063 − 0.6601i | 0.1476 − 0.5364i |
| w18 | 010010 | 0.819 − 0.9734i | 0.7024 − 1.0623i | 0.7126 − 1.0729i | 0.7669 − 0.4573i |
| w19 | 010011 | 0.7389 − 0.713i | 0.6854 − 0.6748i | 0.649 − 0.7077i | 0.4449 − 0.4829i |

-continued

| w | bit label | R = ½ (or ⅝ or ¾ or ¹³⁄₁₆) | R = ⅝ (or ½ or ¾ or ¹³⁄₁₆) | R = ¾ (or ½ or ⅝ or ¹³⁄₁₆) | R = ¹³⁄₁₆ (or ½ or ⅝ or ¾) |
|---|---|---|---|---|---|
| w20 | 010100 | 1.2554 − 0.2142i | 1.2615 − 0.1746i | 1.2781 − 0.1604i | 1.004 − 0.174i |
| w21 | 010101 | 1.2348 − 0.3103i | 1.1831 − 0.4706i | 1.0791 − 0.3764i | 0.1371 − 0.1864i |
| w22 | 010110 | 0.7562 − 0.1721i | 0.8301 − 0.1381i | 0.7714 − 0.1301i | 0.7139 − 0.1521i |
| w23 | 010111 | 0.7451 − 0.3181i | 0.7748 − 0.3978i | 0.7335 − 0.4268i | 0.4208 − 0.1616i |
| w24 | 011000 | 0.2187 − 1.2529i | 0.1636 − 1.263i | 0.1553 − 1.2788i | 1.0216 − 0.771i |
| w25 | 011001 | 0.1608 − 0.8472i | 0.1378 − 0.8233i | 0.1327 − 0.8728i | 0.1431 − 0.9083i |
| w26 | 011010 | 0.5502 − 1.1466i | 0.446 − 1.1929i | 0.4463 − 1.2084i | 0.7237 − 0.7521i |
| w27 | 011011 | 0.4217 − 0.7827i | 0.3922 − 0.7613i | 0.3935 − 0.8156i | 0.4251 − 0.8248i |
| w28 | 011100 | 0.1479 − 0.17i | 0.1453 − 0.1451i | 0.1358 − 0.1626i | 1.2711 − 0.1575i |
| w29 | 011101 | 0.1574 − 0.4709i | 0.1295 − 0.4429i | 0.1371 − 0.5004i | 0.162 − 1.2706i |
| w30 | 011110 | 0.3867 − 0.1695i | 0.4504 − 0.1426i | 0.427 − 0.1484i | 0.7403 − 1.045i |
| w31 | 011111 | 0.3923 − 0.4332i | 0.4124 − 0.4207i | 0.406 − 0.4481i | 0.4693 − 1.1917i |
| w32 | 100000 | −1.0569 + 0.7089i | −0.8757 + 0.9247i | −0.937 + 0.8841i | −1.1723 + 0.5141i |
| w33 | 100001 | −1.0841 + 0.6678i | −1.045 + 0.728i | −1.1063 + 0.6601i | −0.1476 + 0.5364i |
| w34 | 100010 | −0.819 + 0.9734i | −0.7024 + 1.0623i | −0.7126 + 1.0729i | −0.7669 + 0.4573i |
| w35 | 100011 | −0.7389 + 0.713i | −0.6854 + 0.6748i | −0.649 + 0.7077i | −0.4449 + 0.4829i |
| w36 | 100100 | −1.2554 + 0.2142i | −1.2615 + 0.1746i | −1.2781 + 0.1604i | −1.004 + 0.174i |
| w37 | 100101 | −1.2348 + 0.3103i | −1.1831 + 0.4706i | −1.0791 + 0.3764i | −0.1371 + 0.1864i |
| w38 | 100110 | −0.7562 + 0.1721i | −0.8301 + 0.1381i | −0.7714 + 0.1301i | −0.7139 + 0.1521i |
| w39 | 100111 | −0.7451 + 0.3181i | −0.7748 + 0.3978i | −0.7335 + 0.4268i | −0.4208 + 0.1616i |
| w40 | 101000 | −0.2187 + 1.2529i | −0.1636 + 1.263i | −0.1553 + 1.2788i | −1.0216 + 0.771i |
| w41 | 101001 | −0.1608 + 0.8472i | −0.1378 + 0.8233i | −0.1327 + 0.8728i | −0.1431 + 0.9083i |
| w42 | 101010 | −0.5502 + 1.1466i | −0.446 + 1.1929i | −0.4463 + 1.2084i | −0.7237 + 0.7521i |
| w43 | 101011 | −0.4217 + 0.7827i | −0.3922 + 0.7613i | −0.3935 + 0.8156i | −0.4251 + 0.8248i |
| w44 | 101100 | −0.1479 + 0.17i | −0.1453 + 0.1451i | −0.1358 + 0.1626i | −1.2711 + 0.1575i |
| w45 | 101101 | −0.1574 + 0.4709i | −0.1295 + 0.4429i | −0.1371 + 0.5004i | −0.162 + 1.2706i |
| w46 | 101110 | −0.3867 + 0.1695i | −0.4504 + 0.1426i | −0.427 + 0.1484i | −0.7403 + 1.045i |
| w47 | 101111 | −0.3923 + 0.4332i | −0.4124 + 0.4207i | −0.406 + 0.4481i | −0.4693 + 1.1917i |
| w48 | 110000 | −1.0569 − 0.7089i | −0.8757 − 0.9247i | −0.937 − 0.8841i | −1.1723 − 0.5141i |
| w49 | 110001 | −1.0841 − 0.6678i | −1.045 − 0.728i | −1.1063 − 0.6601i | −0.1476 − 0.5364i |
| w50 | 110010 | −0.819 − 0.9734i | −0.7024 − 1.0623i | −0.7126 − 1.0729i | −0.7669 − 0.4573i |
| w51 | 110011 | −0.7389 − 0.713i | −0.6854 − 0.6748i | −0.649 − 0.7077i | −0.4449 − 0.4829i |
| w52 | 110100 | −1.2554 − 0.2142i | −1.2615 − 0.1746i | −1.2781 − 0.1604i | −1.004 − 0.174i |
| w53 | 110101 | −1.2348 − 0.3103i | −1.1831 − 0.4706i | −1.0791 − 0.3764i | −0.1371 − 0.1864i |
| w54 | 110110 | −0.7562 − 0.1721i | −0.8301 − 0.1381i | −0.7714 − 0.1301i | −0.7139 − 0.1521i |
| w55 | 110111 | −0.7451 − 0.3181i | −0.7748 − 0.3978i | −0.7335 − 0.4268i | −0.4208 − 0.1616i |
| w56 | 111000 | −0.2187 − 1.2529i | −0.1636 − 1.263i | −0.1553 − 1.2788i | −1.0216 − 0.771i |
| w57 | 111001 | −0.1608 − 0.8472i | −0.1378 − 0.8233i | −0.1327 − 0.8728i | −0.1431 − 0.9083i |
| w58 | 111010 | −0.5502 − 1.1466i | −0.446 − 1.1929i | −0.4463 − 1.2084i | −0.7237 − 0.7521i |
| w59 | 111011 | −0.4217 − 0.7827i | −0.3922 − 0.7613i | −0.3935 − 0.8156i | −0.4251 − 0.8248i |
| w60 | 111100 | −0.1479 − 0.17i | −0.1453 − 0.1451i | −0.1358 − 0.1626i | −1.2711 − 0.1575i |
| w61 | 111101 | −0.1574 − 0.4709i | −0.1295 − 0.4429i | −0.1371 − 0.5004i | −0.162 − 1.2706i |
| w62 | 111110 | −0.3867 − 0.1695i | −0.4504 − 0.1426i | −0.427 − 0.1484i | −0.7403 − 1.045i |
| w63 | 111111 | −0.3923 − 0.4332i | −0.4124 − 0.4207i | −0.406 − 0.4481i | −0.4693 − 1.1917i | wherein the bit labeling indicated in groups A, B and C may alternatively be inverted for one or more bit labels.

17. A receiving apparatus comprising:
a receiver configured to receive one or more transmission streams, a deconverter configured to deconvert one or more transmission streams into said constellation values,
a communication interface configured to transmit receiver signalling information to a transmission apparatus with which the receiving apparatus seeks to communicate, said receiver signalling information including one or more of a) the total number N of constellation points and the code rate R of a constellation to be used, b) an indication of the constellation to be used, c) constellation points of a constellation to be used, d) channel conditions of a communications channel between the receiving apparatus and a transmission apparatus with which the receiving apparatus seeks to communicate and e) PHY impairments at the receiving apparatus, and
a demodulation and decoding apparatus as claimed in claim 15 configured to demodulate and decode said constellation values into output data.

18. A communications system comprising:
one or more transmission apparatus as claimed in claim 4; and
one or more receiving apparatus comprising:
a receiver configured to receive one or more transmission streams,
a deconverter configured to deconvert one or more transmission streams into said constellation values, and
a communication interface configured to transmit receiver signalling information to a transmission apparatus with which the receiving apparatus seeks to communicate, said receiver signalling information including one or more of a) the total number N of constellation points and the code rate R of a constellation to be used, b) an indication of the constellation to be used, c) constellation points of a constellation to be used, d) channel conditions of a communications channel between the receiving apparatus and a transmission apparatus with which the receiving apparatus seeks to communicate and e) PHY impairments at the receiving apparatus.

* * * * *